United States Patent
Kamimura et al.

(10) Patent No.: US 9,513,547 B2
(45) Date of Patent: Dec. 6, 2016

(54) PATTERN FORMING METHOD, ACTINIC RAY-SENSITIVE OR RADIATION-SENSITIVE RESIN COMPOSITION, RESIST FILM, METHOD FOR MANUFACTURING ELECTRONIC DEVICE, AND ELECTRONIC DEVICE

(71) Applicant: FUJIFILM Corporation, Tokyo (JP)

(72) Inventors: Sou Kamimura, Haibara-gun (JP); Hidenori Takahashi, Haibara-gun (JP); Keita Kato, Haibara-gun (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 14/607,146

(22) Filed: Jan. 28, 2015

(65) Prior Publication Data

US 2015/0147699 A1 May 28, 2015

Related U.S. Application Data

(63) Continuation of application No. PCT/JP2013/076178, filed on Sep. 19, 2013.

(30) Foreign Application Priority Data

Sep. 28, 2012 (JP) ................. 2012-217564

(51) Int. Cl.
| | |
|---|---|
| *G03F 7/039* | (2006.01) |
| *G03F 7/40* | (2006.01) |
| *G03F 7/30* | (2006.01) |
| *G03F 7/038* | (2006.01) |
| *C08F 212/14* | (2006.01) |
| *C08F 220/04* | (2006.01) |
| *C08F 220/18* | (2006.01) |
| *C08F 220/26* | (2006.01) |
| *C08F 220/28* | (2006.01) |
| *C08F 220/58* | (2006.01) |
| *G03F 7/32* | (2006.01) |
| *G03F 7/20* | (2006.01) |
| *C08F 212/32* | (2006.01) |

(52) U.S. Cl.
CPC .......... *G03F 7/0388* (2013.01); *C08F 212/14* (2013.01); *C08F 220/04* (2013.01); *C08F 220/18* (2013.01); *C08F 220/26* (2013.01); *C08F 220/28* (2013.01); *C08F 220/58* (2013.01); *G03F 7/038* (2013.01); *G03F 7/0392* (2013.01); *G03F 7/0397* (2013.01); *G03F 7/20* (2013.01); *G03F 7/2002* (2013.01); *G03F 7/2037* (2013.01); *G03F 7/30* (2013.01); *G03F 7/325* (2013.01); *G03F 7/40* (2013.01); *C08F 212/32* (2013.01)

(58) Field of Classification Search
None
See application file for complete search history.

(56) References Cited

U.S. PATENT DOCUMENTS

| | | | |
|---|---|---|---|
| 5,738,975 A | 4/1998 | Nakano et al. | |
| 6,255,032 B1 | 7/2001 | Lung et al. | |
| 2004/0033437 A1* | 2/2004 | Uenishi | G03F 7/0397 430/270.1 |
| 2007/0207406 A1 | 9/2007 | Guerrero et al. | |
| 2008/0044772 A1 | 2/2008 | Guerrero et al. | |
| 2008/0187860 A1* | 8/2008 | Tsubaki | G03F 7/2024 430/270.1 |
| 2011/0212390 A1* | 9/2011 | Masunaga | G03F 7/0382 430/5 |
| 2011/0311913 A1 | 12/2011 | Suzuki et al. | |
| 2012/0058431 A1 | 3/2012 | Takahashi et al. | |
| 2012/0077125 A1 | 3/2012 | Shiono et al. | |
| 2012/0202158 A1 | 8/2012 | Hatakeyama et al. | |
| 2012/0251950 A1 | 10/2012 | Horiguchi et al. | |
| 2012/0315449 A1 | 12/2012 | Tsubaki et al. | |
| 2012/0321855 A1 | 12/2012 | Iwato et al. | |
| 2013/0065183 A1 | 3/2013 | Kobayashi et al. | |
| 2013/0071787 A1 | 3/2013 | Takita | |
| 2013/0078426 A1* | 3/2013 | Koshijima | G03F 7/0397 428/156 |
| 2013/0130183 A1 | 5/2013 | Kobayashi et al. | |
| 2013/0157196 A1 | 6/2013 | Nakasugi et al. | |
| 2013/0266777 A1 | 10/2013 | Kato et al. | |

FOREIGN PATENT DOCUMENTS

| | | |
|---|---|---|
| JP | 7-49569 A | 2/1995 |
| JP | 7-199467 A | 8/1995 |
| JP | 2715881 B2 | 2/1998 |
| JP | 2002-363222 A | 12/2002 |
| JP | 2003-345023 A | 12/2003 |
| JP | 2004-286968 A | 10/2004 |
| JP | 2008058710 A | 3/2008 |
| JP | 2008-292975 A | 12/2008 |
| JP | 2009-98616 A | 5/2009 |
| JP | 2009-235132 A | 10/2009 |

(Continued)

OTHER PUBLICATIONS

Machine translation of JP 2010-164958 (2010).*

(Continued)

*Primary Examiner* — Martin Angebranndt
(74) *Attorney, Agent, or Firm* — Sughrue Mion, PLLC

(57) ABSTRACT

The pattern forming method of the present invention includes (i) forming a film using an actinic ray-sensitive or radiation-sensitive resin composition which contains a resin (A) which has a repeating unit including a group capable of generating a polar group by being decomposed due to an action of an acid and a repeating unit including a carboxyl group, a compound (B) which generates an acid according to irradiation with actinic rays or radiation, and a solvent (C); (ii) exposing the film using a KrF excimer laser, extreme ultraviolet rays, or an electron beam; and (iii) forming a negative tone pattern by developing the exposed film using a developer which includes an organic solvent.

22 Claims, No Drawings

(56) References Cited

FOREIGN PATENT DOCUMENTS

| | | | |
|---|---|---|---|
| JP | 2009-237172 | * | 10/2009 |
| JP | 2010501881 A | | 1/2010 |
| JP | 2010-32994 A | | 2/2010 |
| JP | 2010520516 A | | 6/2010 |
| JP | 2010-164958 | * | 7/2010 |
| JP | 2010-164958 A | | 7/2010 |
| JP | 2011-53624 A | | 3/2011 |
| JP | 2012-22261 A | | 2/2012 |
| JP | 2012-27438 A | | 2/2012 |
| JP | 2012048048 A | | 3/2012 |
| JP | 2012-108527 A | | 6/2012 |
| JP | 2012-113003 A | | 6/2012 |
| JP | 2012-133329 A | | 7/2012 |
| JP | 2012-181510 A | | 9/2012 |
| JP | 2013-57836 A | | 3/2013 |
| JP | 2013-105165 A | | 5/2013 |
| JP | 2015507212 A | | 3/2015 |
| WO | 2011074433 A1 | | 6/2011 |
| WO | 2011/158687 A1 | | 12/2011 |
| WO | 2012074122 | * | 7/2012 |
| WO | 2012165604 | * | 12/2012 |
| WO | 2013062133 | * | 5/2013 |
| WO | 2013089277 A1 | | 6/2013 |

OTHER PUBLICATIONS

Machine translation of JP 2004-296968 (2004).*
Machine translation of JP 07049569 (1995).*
Machine translation of JP 07-199467 (1995).*
Final Rejection, dated Jul. 7, 2015, issued in corresponding JP Application No. 2012-217564, 13 pages in English and Japanese.
Japanese Office Action for JP 2012-217564 dated Aug. 26, 2014, 18 pages in Japanese and Eng.
Japanese Office Action for JP 2012-217564 dated Nov. 18, 2014, 8 pages in Japanese and Eng.
International Search Report for PCT/JP2013/076178 dated Oct. 29, 2013, 4 pages.
Written Opinion for PCT/JP2013/076178 dated Oct. 29, 2013, 6 pages.
Notice of Reasons for Rejection, dated Mar. 31, 2015, issued in corresponding JP Application No. 2012-217564, 17 pages in English and Japanese.
Naito et al., "Highly Transparent Chemically Amplified ArF Excimer Laser Resists by Absorption Band Shift for 193 nm Wavelength," Japanese Journal of Applied Physics, vol. 33, part 1, No. 12B, Dec. 1, 1994, pp. 7028-7032.
Rodríguez-Cantó et al., "Understanding Acid Reaction and Diffusion in Chemically Amplified Photoresists: An Approach at the Molecular Level," The Journal of Physical Chemistry, vol. 115, published Sep. 7, 2011, pp. 20367-20374.
Office Action dated Jul. 6, 2016 from the Taiwanese Intellectual Property Office in counterpart Taiwanese Application No. 102134656.
Office Action dated Aug. 23, 2016, issued by the Korean Intellectual Property Office in corresponding Korean Application No. 10-2015-7002527.

* cited by examiner

PATTERN FORMING METHOD, ACTINIC RAY-SENSITIVE OR RADIATION-SENSITIVE RESIN COMPOSITION, RESIST FILM, METHOD FOR MANUFACTURING ELECTRONIC DEVICE, AND ELECTRONIC DEVICE

CROSS-REFERENCE TO RELATED APPLICATIONS

This application is a Continuation of PCT International Application No. PCT/JP2013/076178, filed on Sep. 19, 2013, which claims priority under 35 U.S.C. §119(a) to Japanese Patent Application No. 2012-217564, filed on Sep. 28, 2012. Each of the above application(s) is hereby expressly incorporated by reference, in its entirety, into the present application.

BACKGROUND OF THE INVENTION

1. Field of the Invention

The present invention relates to a pattern forming method, an actinic ray-sensitive or radiation-sensitive resin composition, a resist film, a method for manufacturing an electronic device, and an electronic device, each of which is suitably used in a process for manufacturing semiconductors such as ICs, a process for manufacturing liquid crystals or circuit boards such as a thermal head, and lithographic processes in photo-fabrication in addition to these. In particular, the invention relates to a pattern forming method favorably used in exposure with a KrF exposure apparatus, an actinic ray-sensitive or radiation-sensitive resin composition, a resist film, a method for manufacturing an electronic device, and an electronic device.

2. Description of the Related Art

Since the development of a resist for use with a KrF excimer laser (248 nm), an image forming method known as chemical amplification has been used as an image forming method of a resist in order to compensate for sensitivity deterioration caused by light absorption. As an example, description will be given of a positive type chemical amplification image forming method, which is an image forming method in which, by exposure using an excimer laser, electron beams, extreme ultraviolet light, or the like, an acid generator is decomposed at exposed portions to generate an acid, the generated acid is used as a reaction catalyst in a post exposure bake (PEB: Post Exposure Bake) to convert an alkali-insoluble group into an alkali-soluble group, and the exposed portions are removed using an alkali developer.

In the above-described method, various alkali developers have been proposed; however, an aqueous alkali developer having 2.38%-by-mass TMAH (tetramethylammonium hydroxide) aqueous solution is generally used.

On the other hand, fine pattern forming is also being developed using negative images in addition to the current mainstream positive type method. This is because, in the manufacturing of semiconductor elements or the like, while there is a demand for pattern forming which has various shapes such as lines, trenches, and holes, there are patterns which are difficult to form in current positive type resists. In addition, in recent years, as cutting edge pattern forming methods which are being developed, in addition to the positive type method, there are methods where it is possible to form a pattern with high resolution by exposure using an ArF excimer laser with a negative tone method (for example, refer to JP2715881B).

SUMMARY OF THE INVENTION

However, in semiconductor manufacturing, in addition to the demand for extreme miniaturization, replacing the part of the process which was performed by conventional ArF exposure with KrF exposure is also being studied in terms of effective use of existing facilities, which reverses the historical trend of developing ArF exposure techniques in order to overcome the limitations of KrF exposure. In addition, regarding the replacement of a part of the ArF exposure process using the KrF exposure, in addition to the above-described problem of miniaturization, there are various problems which are technically difficult to solve, such as the improvement of the materials (resin and the like) to be used and challenges associated with differences in the exposure mechanism.

Furthermore, as applications of the above-described resist technique, microfabrication applications such as ion implantation applications using the resist composition in ion implanting (charge injection) which is one step during the creation of a logic device or the like are continuing to be developed.

In a case where the resist composition is used as an ion implantation application, the resist composition may be coated, exposed, and developed on a substrate (referred to below as an uneven substrate) patterned in advance, and there is a demand for fine processing on the uneven substrate.

However, according to the influence of standing waves due to reflection of the exposure light from the substrate and the diffuse reflection of the exposure light due to an uneven portion in the above-described uneven substrate, the shape of the obtained pattern may be adversely affected.

In consideration of the above-described problems, an object of the present invention is to provide a pattern forming method which is particularly favorable for KrF exposure where the generation of standing waves is suppressed, and it is possible to form a pattern with high rectangularity with little scum particularly in pattern forming on an uneven substrate and it is possible to realize an excellent exposure latitude and to provide an actinic ray-sensitive or radiation-sensitive resin composition, a resist film, a method for manufacturing an electronic device, and an electronic device where the pattern forming method is used.

The invention has the configurations below, thereby accomplishing the above-described objects of the invention.

(1) A pattern forming method including (i) forming a film using an actinic ray-sensitive or radiation-sensitive resin composition which contains a resin (A) which has a repeating unit including a group capable of generating a polar group by being decomposed due to an action of an acid and a repeating unit including a carboxyl group, a compound (B) which generates an acid according to irradiation with actinic rays or radiation, and a solvent (C); (ii) exposing the film using a KrF excimer laser, extreme ultraviolet rays, or an electron beam; and (iii) forming a negative tone pattern by developing the exposed film using a developer which includes an organic solvent.

(2) The pattern forming method according to (1), where the exposing in (ii) is exposing using the KrF excimer laser.

(3) The pattern forming method according to (1) or (2), where the resin (A) further contains a non-acid-decomposable repeating unit which is represented by the following general formula (1), which is different from the repeating unit including a carboxyl group.

[Chem. 1]

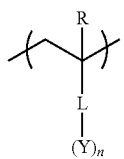

(1)

R represents a hydrogen atom, an alkyl group, a cycloalkyl group, a halogen atom, or an alkoxycarbonyl group.

L represents a single bond or an (n+1) valent linking group.

Y represents an alicyclic group, or an aromatic group.

n represents an integer of 1 or more.

(4) The pattern forming method according to any one of (1) to (3), where the resin (A) comprises a repeating unit which is represented by the following general formula (AI) as the above-described repeating unit including a group capable of generating a polar group by being decomposed due to an action of an acid.

[Chem. 2]

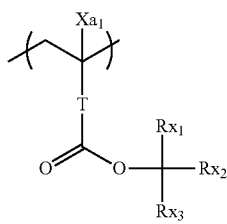

(AI)

In the general formula (AI), $Xa_1$ represents a hydrogen atom, an alkyl group, a cyano group, or a halogen atom.

T represents a single bond or a divalent linking group.

$Rx_1$ to $Rx_3$ each independently represent an alkyl group or a cycloalkyl group.

Two among $Rx_1$ to $Rx_3$ may be bonded to form a ring structure.

(5) The pattern forming method according to (4), where $R_{X1}$ to $R_{X3}$ in the general formula (AI) represent an alkyl group.

(6) The pattern forming method according to (4) or (5), where $R_{X1}$ to $R_{X3}$ in the general formula (AI) represent a methyl group.

(7) The pattern forming method according to any one of (3) to (6), where the repeating unit which is represented by the general formula (1) is a repeating unit which is represented by the following general formula (1-1).

[Chem. 3]

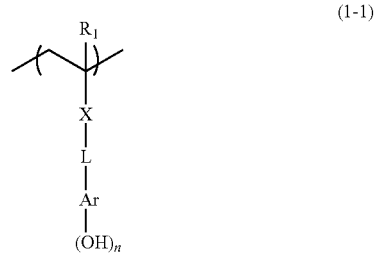

(1-1)

In the general formula (1-1), $R_1$ represents a hydrogen atom, an alkyl group, a halogen atom, or an alkoxycarbonyl group.

X represents a single bond, an alkylene group, —COO—, or —CONR$_{64}$—. $R_{64}$ represents a hydrogen atom or an alkyl group.

L represents a single bond, —COO—, or an alkylene group.

Ar represents an (n+1) valent aromatic ring group.

n represents an integer of 1 to 4.

(8) The pattern forming method according to any one of (1) to (7), where the resin (A) further comprises a repeating unit including a lactone structure, and the content of the repeating unit including a lactone structure is 25 mol % or less with respect to all the repeating units in the resin (A).

(9) An actinic ray-sensitive or radiation-sensitive resin composition which is subjected to the pattern forming method according to any one of (1) to (8).

(10) A resist film which is formed using the actinic ray-sensitive or radiation-sensitive resin composition according to (9).

(11) A method for manufacturing an electronic device which includes the pattern forming method according to any one of (1) to (8).

(12) An electronic device which is manufactured using the method for manufacturing an electronic device according to (11).

According to the present invention, it is possible to provide a pattern forming method which is particularly favorable for KrF exposure where the generation of standing waves is suppressed, and it is possible to form a pattern with high rectangularity with little scum particularly in pattern forming on an uneven substrate and it is possible to realize an excellent exposure latitude and to provide an actinic ray-sensitive or radiation-sensitive resin composition, a resist film, a method for manufacturing an electronic device, and an electronic device which are used in the pattern forming method.

DESCRIPTION OF THE PREFERRED EMBODIMENTS

Hereinbelow, the embodiments of the invention will be described in detail.

In the notation of the groups (atomic groups) in the present specification, notation where substituted or unsubstituted is not noted includes groups which do not have a substituent and groups which do have a substituent. For example, the term "alkyl group" includes not only an alkyl group having no substituent (unsubstituted alkyl group) but also an alkyl group having a substituent (substituted alkyl group).

In the invention, the term "actinic ray" or "radiation" refers to, for example, a bright line spectrum of a mercury lamp, far ultraviolet rays typified by an excimer laser, extreme ultraviolet rays (EUV light), X-rays, an electron beam (EB), or the like. Further, the light in the invention refers to actinic rays or radiation.

Furthermore, unless otherwise specifically indicated, the term "exposure" in the present specification includes not only exposure to a mercury lamp, far ultraviolet rays typified by an excimer laser, X-rays, EUV light, or the like but also lithography with a particle beam such as an electron beam and an ion beam.

The pattern forming method of the present invention includes (i) forming a film using an actinic ray-sensitive or radiation-sensitive resin composition which contains a resin (A) which has a repeating unit including a group capable of generating a polar group by being decomposed due to an action of an acid and a repeating unit including a carboxyl group, a compound (B) which generates an acid according to irradiation with actinic rays or radiation, and a solvent (C); (ii) exposing the film using a KrF excimer laser, extreme ultraviolet rays, or an electron beam; and (iii) forming a negative tone pattern by developing the exposed film using a developer which includes an organic solvent.

The pattern forming method of the present invention uses (i) an actinic ray-sensitive or radiation-sensitive resin composition which contains a resin (A) which has a repeating unit including a group capable of generating a polar group by being decomposed due to an action of an acid and a repeating unit including a carboxyl group, a compound (B) which generates an acid according to irradiation with actinic rays or radiation, and a solvent (C).

The pattern forming method of the present invention suppresses the generation of standing waves, and it is possible to form a pattern with high rectangularity with little scum particularly in pattern forming on an uneven substrate and it is possible to realize an excellent exposure latitude especially in the negative tone pattern forming using KrF exposure and development which uses a developer which includes an organic solvent; the reasons therefor are not certain but are thought to be as follows.

First, the actinic ray-sensitive or radiation-sensitive resin composition which is subjected to the pattern forming method according to the present invention contains a resin which has a repeating unit which has a carboxyl group with a large polarity. Due to this, it is considered that the solubility with respect to the developer which includes an organic solvent in an exposure portion is sufficiently decreased, and that it is possible to realize a wide exposure latitude in the pattern forming on the uneven substrate. In addition, by sufficiently decreasing the solubility with respect to an organic based developer in an exposure portion as described above, it is possible to suppress excessive dissolution with respect to the organic based developer of the resist film during the pattern forming and it is considered that the pattern shape is improved as a result.

In addition, the pattern forming method according to the present invention includes forming a negative tone pattern by developing the exposed film using an organic based developer.

Due to this, in the uneven substrate, the resist film is suppressed from melting and remaining in portions which are not sufficiently exposed, and it is considered that the pattern shape on the uneven substrate is improved as a result and that the generation of scum is suppressed.

For the pattern forming method of the invention, the developer is preferably a developer including at least one organic solvent selected from a group consisting of a ketone-based solvent, an ester-based solvent, an alcohol-based solvent, an amide-based solvent, and an ether-based solvent.

The pattern forming method of the invention preferably further includes (iv) washing with a rinsing liquid including an organic solvent.

The rinsing liquid is preferably a rinsing liquid including at least one organic solvent selected from a group consisting of a hydrocarbon-based solvent, a ketone-based solvent, an ester-based solvent, an alcohol-based solvent, an amide-based solvent, and an ether-based solvent.

The pattern forming method of the invention preferably includes (v) heating after the (ii) exposure.

For the pattern forming method of the invention, the resin (A) is a resin having an increased polarity by the action of an acid, and thus, having an increased solubility in an alkali developer, and the pattern forming method may further include (vi) developing using an alkali developer.

The pattern forming method of the invention may include (ii) exposure plural times.

The pattern forming method of the invention may include (v) heating plural times.

The resist film of the invention is a film formed by the actinic ray-sensitive or radiation-sensitive resin composition, and is also a film formed by, for example, coating a substrate with the actinic ray-sensitive or radiation-sensitive resin composition.

Hereinbelow, the actinic ray-sensitive or radiation-sensitive resin composition that is used and obtained in the invention will be described.

Furthermore, the invention also relates to the actinic ray-sensitive or radiation-sensitive resin composition as described later.

The actinic ray-sensitive or radiation-sensitive resin composition according to the invention is used for negative tone development (development in which the solubility in a developer decreases upon exposure, and thus, the exposed area remains as a pattern and the non-exposed area is removed). That is, the actinic ray-sensitive or radiation-sensitive resin composition according to the invention can be used as an actinic ray-sensitive or radiation-sensitive resin composition for organic solvent development, that is, used for development using a developer including an organic solvent. Here, the use for an organic solvent development refers to a use for development using at least a developer including an organic solvent.

The actinic ray-sensitive or radiation-sensitive resin composition of the invention is typically a resist composition, and is preferably a negative tone resist composition (that is, a resist composition for organic solvent development) from the viewpoint of obtaining particularly superior effects. In addition, the composition according to the invention is typically a chemically amplified resist composition.

[1] Resin (A) (Referred to Below Simply as "Resin (A)") which has a Repeating Unit Including a Group Capable of Generating a Polar Group by being Decomposed Due to an Action of an Acid (Referred to Below Simply as an "Acid-Decomposable Group") and a Repeating Unit Including a Carboxyl Group The resin (A) used in the actinic ray-sensitive or radiation-sensitive resin composition according to the invention is a resin having an acid-decomposable group (below, simply referred to as "acid-decomposable resin"), and is a resin in which the solubility with respect to the developer including the organic solvent is decreased by increasing the polarity using the action of an acid.

Examples of the resin (A) used in the actinic ray-sensitive or radiation-sensitive resin composition according to the invention can include resins having at least one kind of acid-decomposable group at the main chain or the side chain of the resin, or both the main chain and the side chain.

Here, resin (A) is also a resin where the solubility with respect to an alkali developer is increased by increasing the polarity by the action of an acid.

The acid-decomposable group preferably has a structure which is protected by a group which leaves and decomposes a polar group by the action of an acid.

The polar group is not particularly limited as long as it is a group that is sparingly soluble or insoluble in a developer including an organic solvent, but examples thereof include acidic groups such as a carboxyl group and a sulfonic acid group (groups that are dissociated in a 2.38%-by-mass aqueous tetramethylammonium hydroxide solution used as a developer for a resist), and an alcoholic hydroxyl group.

Herein, the alcoholic hydroxyl group refers to a hydroxyl group other than a hydroxyl group directly bonded to an aromatic ring as a hydroxyl group bonded to a hydrocarbon skeleton (phenolic hydroxyl group), excluding an aliphatic alcohol having the a position substituted with an electron withdrawing group such as a fluorine atom (for example, a fluorinated alcohol group (a hexafluoroisopropanol group or the like)). As the alcoholic hydroxyl group, a hydroxyl group having a pKa of 12 to 20 is preferred.

The acid-decomposable group is preferably a group formed by substituting a group which leaves the hydrogen atoms of the groups by the action of an acid.

Examples of the group which leaves by the action of an acid include —$C(R_{36})(R_{37})(R_{38})$, —$C(R_{36})(R_{37})(OR_{39})$, and —$C(R_{01})(R_{02})(OR_{39})$.

In the general formula, $R_{36}$ to $R_{39}$ each independently represent an alkyl group, a cycloalkyl group, an aryl group, an aralkyl group, or an alkenyl group. $R_{36}$ and $R_{37}$ may be bonded to each other to form a ring.

$R_{01}$ and $R_{02}$ each independently represent a hydrogen atom, an alkyl group, a cycloalkyl group, an aryl group, an aralkyl group, or an alkenyl group.

The alkyl group of $R_{36}$ to $R_{39}$, $R_{01}$, and $R_{02}$ is preferably an alkyl group having 1 to 8 carbon atoms, and examples thereof include a methyl group, an ethyl group, a propyl group, an n-butyl group, a sec-butyl group, a hexyl group, and an octyl group.

The cycloalkyl group of $R_{36}$ to $R_{39}$, $R_{01}$, and $R_{02}$ may be either monocyclic or polycyclic. The monocyclic cycloalkyl group is preferably a cycloalkyl group having 3 to 8 carbon atoms, and examples thereof include a cyclopropyl group, a cyclobutyl group, a cyclopentyl group, a cyclohexyl group, and a cyclooctyl group. The polycyclic cycloalkyl group is preferably a cycloalkyl group having 6 to 20 carbon atoms, and examples thereof include an adamantly group, a norbornyl group, an isobornyl group, a camphanyl group, a dicyclopentyl group, a α pinel group, a tricyclodecanyl group, a tetraclododecyl group, and an androstanyl group. Further, at least one carbon atom in the cycloalkyl group may be substituted with a heteroatom such as an oxygen atom.

The aryl group of $R_{36}$ to $R_{39}$, $R_{01}$, and $R_{02}$ is preferably an aryl group having 6 to 10 carbon atoms, and examples thereof include a phenyl group, a naphthyl group, and an anthryl group.

The aralkyl group of $R_{36}$ to $R_{39}$, $R_{01}$, and $R_{02}$ is preferably an aralkyl group having 7 to 12 carbon atoms, and examples thereof include a benzyl group, a phenethyl group, and a naphthylmethyl group.

The alkenyl group of $R_{36}$ to $R_{39}$, $R_{01}$, and $R_{02}$ is preferably an alkenyl group having 2 to 8 carbon atoms, and examples thereof include a vinyl group, an allyl group, a butenyl group, and a cyclohexenyl group.

The ring formed by the mutual bonding of $R_{36}$ and $R_{37}$ is preferably a cycloalkyl group (monocyclic or polycyclic). The cycloalkyl group is preferably a monocyclic cycloalkyl group such as a cyclopentyl group and a cyclohexyl group, or a polycyclic cycloalkyl group such as a norbornyl group, a tetracyclodecanyl group, a tetracyclododecanyl group, and an adamantyl group. A monocyclic cycloalkyl group having 5 or 6 carbon atoms is more preferred, and a monocyclic cycloalkyl group having 5 carbon atoms is particularly preferred.

Repeating Unit Having an Acid-Decomposable Group

As the repeating unit having an acid-decomposable group, which is contained in the resin (A), a repeating unit represented by the following general formula (AI) is preferred.

[Chem. 4]

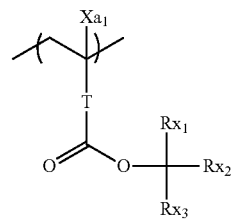

(AI)

In the general formula (AI), $Xa_1$ represents a hydrogen atom, an alkyl group, a cyano group, or a halogen atom (preferably a fluorine atom), and preferably represents a methyl group.

T represents a single bond or a divalent linking group.

$Rx_1$ to $Rx_3$ each independently represent an alkyl group or a cycloalkyl group.

Two among $Rx_1$ to $Rx_3$ may be bonded to form a ring structure.

As the linear or branched alkyl group for $Xa_1$, a linear or branched alkyl group having 1 to 4 carbon atoms which may have a substituent is preferred, and examples thereof include a methyl group, an ethyl group, an n-propyl group, an isopropyl group, an n-butyl group, an isobutyl group, and a t-butyl group. As the substituent, examples include a hydroxyl group, and a halogen atom (for example, a fluorine atom).

$Xa_1$ is preferably a hydrogen atom, a methyl group, a trifluoromethyl group or a hydroxymethyl group.

Examples of the divalent linking group of T include an alkylene group (preferably, 1 to 4 carbon atoms), a —COO-Rt-group, an —O-Rt-group, a phenylene group, and the like. In the formula, Rt represents an alkylene group or a cycloalkylene group.

T is preferably a single bond or a —COO-Rt-group. Rt is preferably an alkylene group having 1 to 5 carbon atoms, more preferably a —$CH_2$— group, a —$(CH_2)_2$— group, and a —$(CH_2)_3$— group. T is more preferably a single bond.

The alkyl group of $R_{X1}$ to $R_{X3}$ is preferably an alkyl group having 1 to 4 carbon atoms, such as a methyl group, an ethyl group, an n-propyl group, an isopropyl group, an n-butyl group, an isobutyl group, and a t-butyl group.

The total number of carbon atoms in the alkyl group of $R_{X1}$ to $R_{X3}$ is preferably 3 to 8, more preferably 3 or 4, and even more preferably 4.

The cycloalkyl group of $R_{X1}$ to $R_{X3}$ is preferably a monocyclic cycloalkyl group such as a cyclopentyl group and a cyclohexyl group, or a polycyclic cycloalkyl group such as a norbornyl group, a tetracyclodecanyl group, a tetracyclododecanyl group, and an adamantyl group.

The ring structure which is formed by bonding two of $R_{X1}$ to $R_{X3}$ may be a cycloalkyl group, and the cycloalkyl group is preferably a monocyclic cycloalkyl group such as a cyclopentyl group, or a cyclohexyl group, or a polycyclic cycloalkyl group such as a norbornyl group, a tetracyclodecanyl group, a tetracyclododecanyl group, or an adamantyl group. A monocyclic cycloalkyl group having 5 or 6 carbon atoms is particularly preferable.

As a preferred embodiment, examples include an embodiment where $R_{X1}$ is a methyl group or an ethyl group, and $R_{X2}$ and $R_{X3}$ are bonded to each other to form the above-described cyclo alkyl group.

Each of the groups above may have a substituent, and examples of the substituent include a hydroxyl group, a halogen atom (for example, a fluorine atom), an alkyl group (having 1 to 4 carbon atoms), a cycloalkyl group (having 3 to 8 carbon atoms), an alkoxy group (having 1 to 4 carbon atoms), a carboxyl group, and an alkoxycarbonyl group (having 2 to 6 carbon atoms), and the substituent preferably has 8 or less carbon atoms.

A preferable embodiment of the repeating unit which is represented by the general formula (AI) is an embodiment where $R_{X1}$, $R_{X2}$, and $R_{X3}$ each independently represent an alkyl group (which may be linear or branched), and a more preferable embodiment is an embodiment where $R_{X1}$ to $R_{X3}$ represent a linear alkyl group. The total number of carbon atoms in the alkyl group of $R_{X1}$ to $R_{X3}$ is preferably 3 to 8, more preferably 3 or 4, and even more preferably 4.

In this embodiment, as the linear or branched alkyl group for $R_{X1}$, $R_{X2}$, and $R_{X3}$, an alkyl group having 1 to 4 carbon atoms is preferred, and examples thereof include a methyl group, an ethyl group, an n-propyl group, an isopropyl group, an n-butyl group, an isobutyl group, and a tert-butyl group.

As $R_{X1}$, a methyl group, an ethyl group, an n-propyl group, and an n-butyl group are preferred, a methyl group and an ethyl group are more preferred, and a methyl group is particularly preferred.

As $R_{X2}$, a methyl group, an ethyl group, an n-propyl group, an isopropyl group, and an n-butyl group are preferred, a methyl group and an ethyl group are more preferred, and a methyl group is particularly preferred.

As $R_{X3}$, a methyl group, an ethyl group, an n-propyl group, an isopropyl group, an n-butyl group, an isobutyl group, and a tert-butyl group are preferred, a methyl group, an ethyl group, an isopropyl group, and an isobutyl group are more preferred, and a methyl group, an ethyl group, and an isopropyl group are particularly preferred.

The most preferable embodiment of the repeating unit which is represented by the general formula (AI) is an embodiment where $R_{X1}$, $R_{X2}$, and $R_{X3}$ are a methyl group.

Preferred specific examples of the repeating unit having an acid-decomposable group are illustrated below, but the invention is not limited thereto.

In the specific examples, Rx represents a hydrogen atom, $CH_3$, $CF_3$, or $CH_2OH$. Rxa and Rxb each represent an alkyl group having 1 to 4 carbon atoms. Z represents a substituent, and when a plurality of Z's are present, they may be the same as or different from each other. p represents 0 or a positive integer. Specific examples and preferred examples of Z are the same as specific examples and preferred examples of the substituent that each group of $R_1$ to $R_3$ and the like may have.

[Chem. 5]

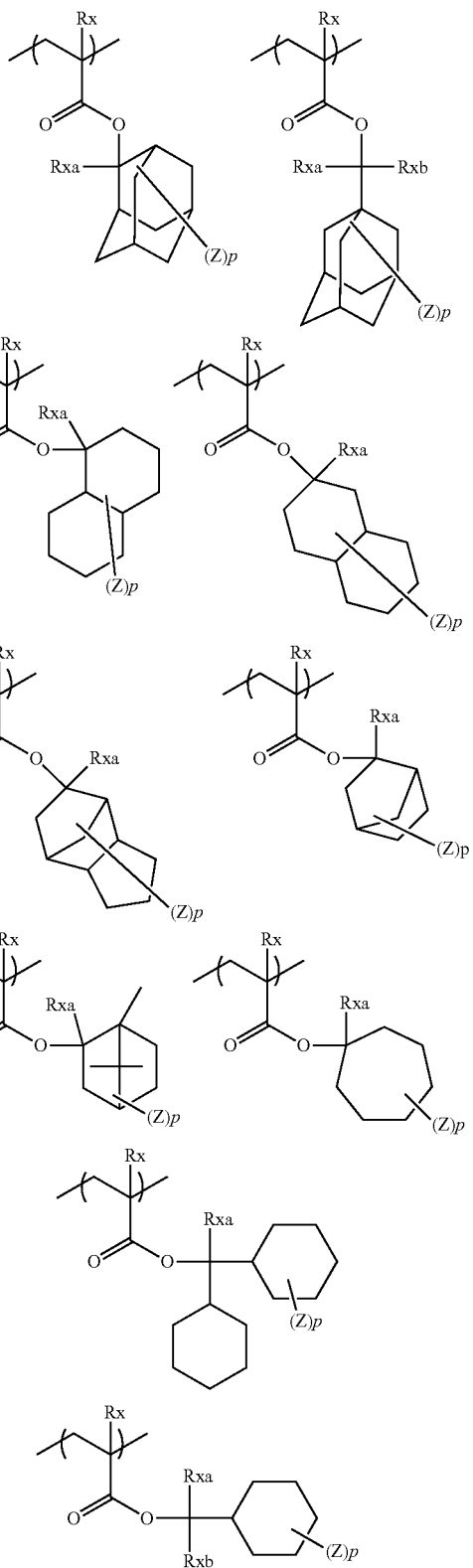

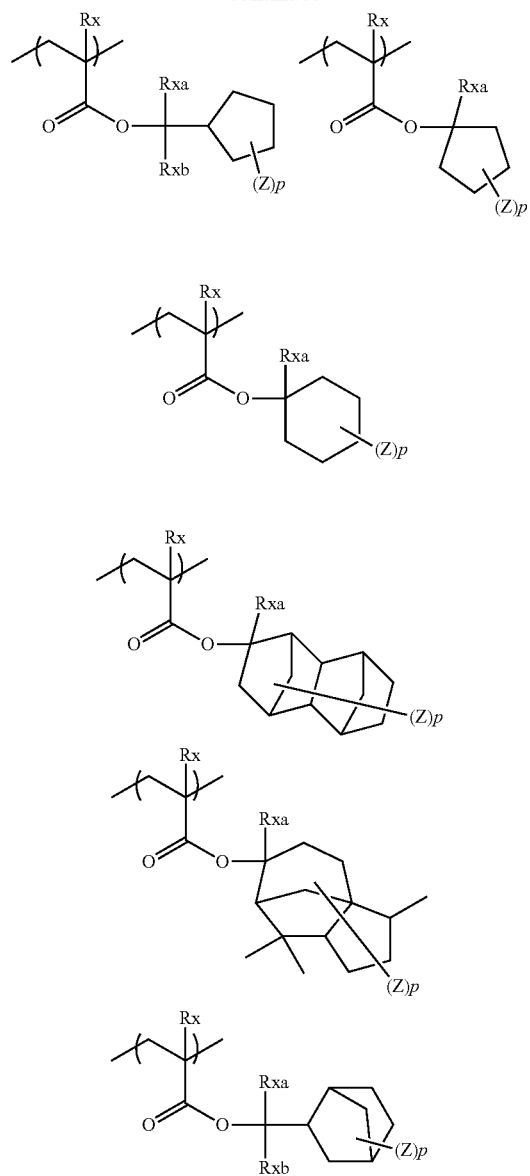
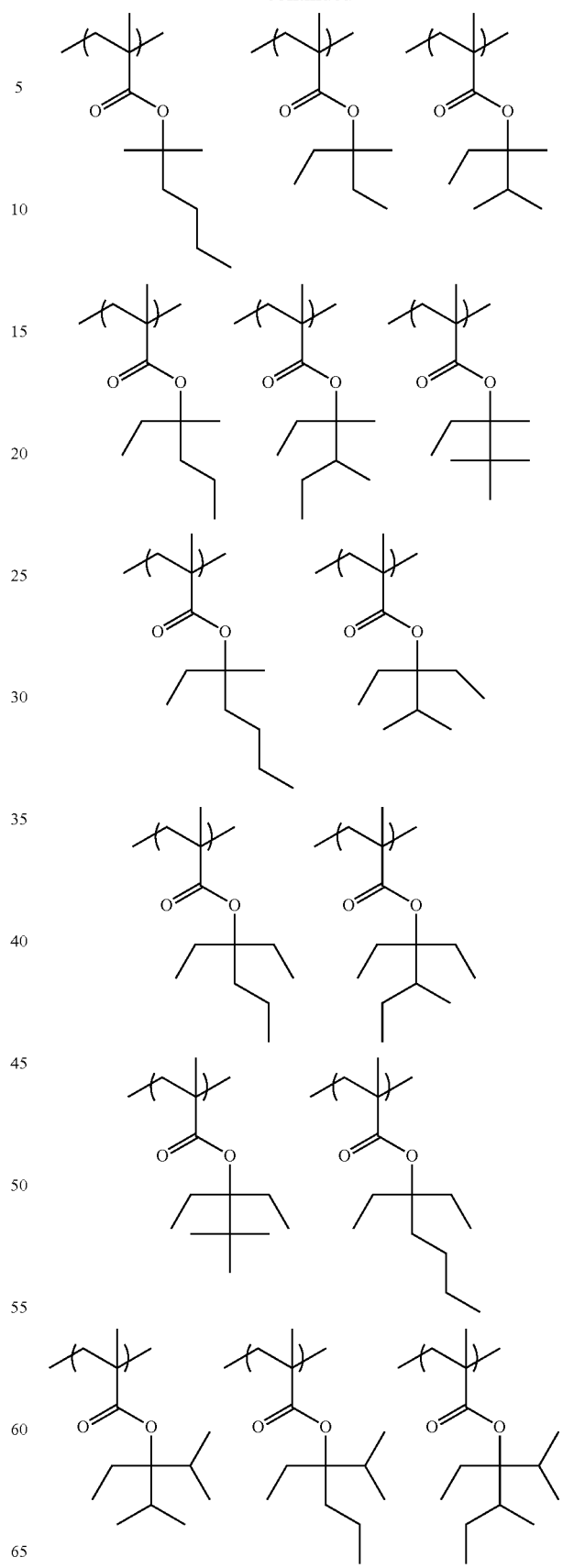

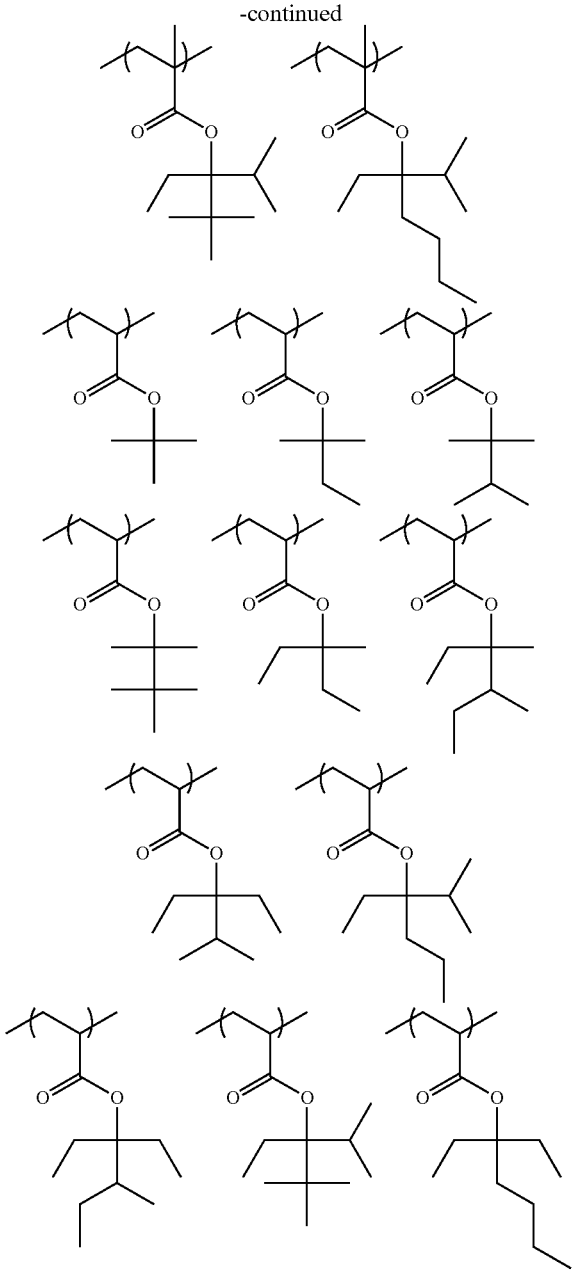

ent invention has a repeating unit having a carboxyl group. The repeating unit having a carboxyl group is preferably any of a repeating unit where an acid group is directly bonded to the main chain of the resin such as a repeating unit using acrylic acid or a methacrylic acid; a repeating unit where an acid group is bonded to the main chain of the resin via a linking group such as a repeating unit using para-carboxystyrene; or a repeating unit having an acid group which is introduced into the polymer chain terminal using a polymerization initiator having an acid group or a chain transfer agent during polymerization, and the linking group may have a monocyclic or polycyclic hydrocarbon structure. The repeating unit having a carboxyl group is preferably a repeating unit using acrylic acid, methacrylic acid, or para-carboxystyrene, and more preferably a repeating unit using methacrylic acid.

Specific examples of the repeating units having an acid group are shown below; however, the invention is not limited thereto.

In the specific examples, Rx represents H, $CH_3$, $CH_2OH$, or $CF_3$. a represents 1 or 2.

[Chem. 7]

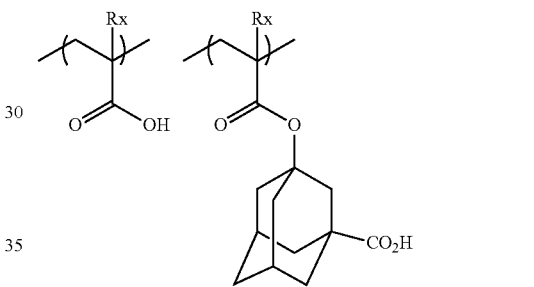

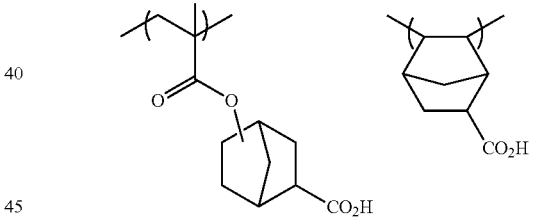

[Chem. 8]

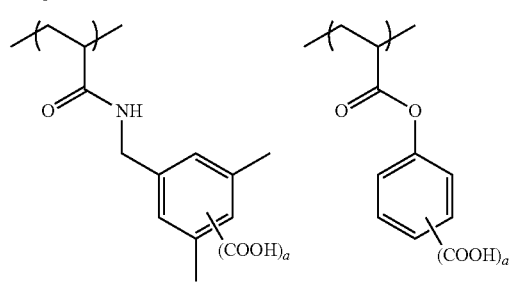

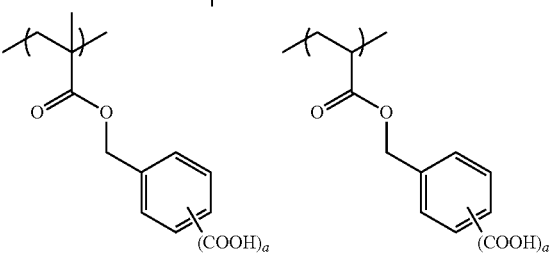

The repeating unit having the acid-decomposable group of the resin (A) may be used singly or in combination of two or more kinds thereof.

In the resin (A) in the present invention, the content (in a case where a plurality of types are contained, the total thereof) of the repeating unit which has the acid-decomposable group (preferably, the repeating unit which is represented by the general formula (AI)) is preferably 30 to 80 mol % with respect to all of the repeating units in the resin (A) and more preferably 40 to 70 mol % from the viewpoint of sufficiently decreasing the solubility with respect to the organic based developer in the exposure portion while sufficiently maintaining the solubility of the unexposed portions and improving the dissolution contrast.

Repeating Unit Having a Carboxyl Group

The resin (A) which is used in the actinic ray-sensitive or radiation-sensitive resin composition according to the pres-

[Chem. 9]

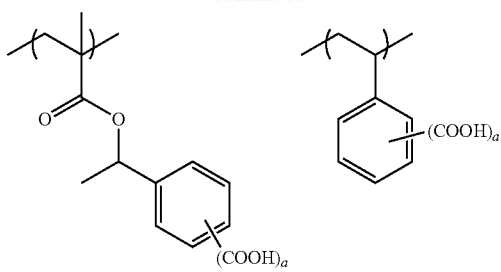
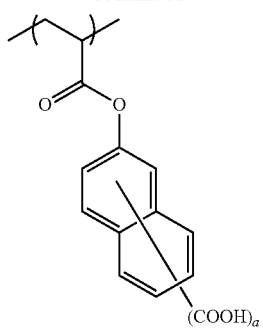
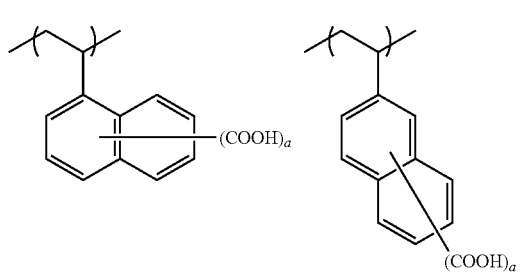
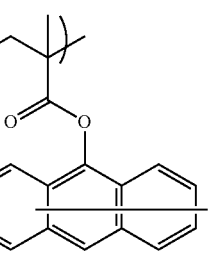
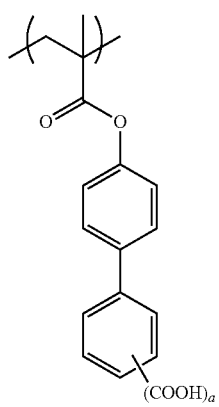
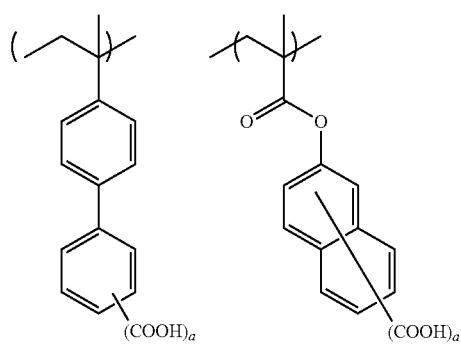
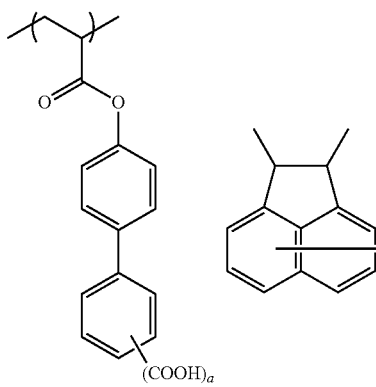
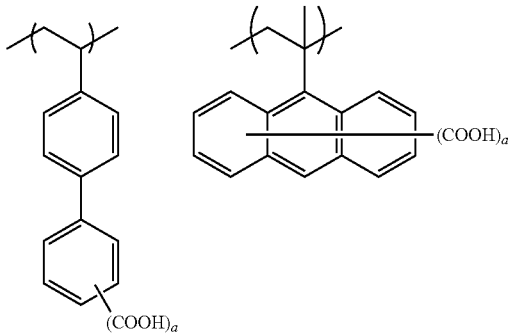
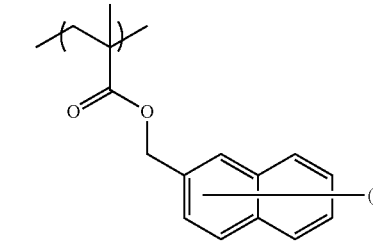
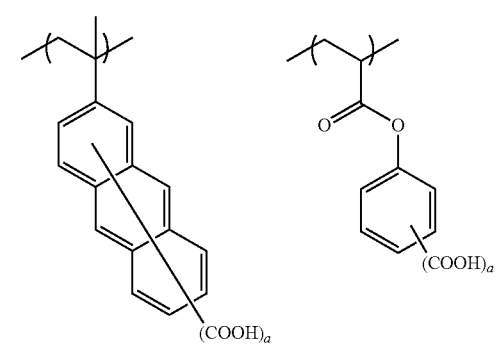

In the present invention, the resin (A) may include only one type of repeating unit having a carboxyl group, or may also include two or more types.

The content of the repeating unit having a carboxyl group is preferably 1 to 40 mol %, more preferably 1 to 30 mol %, and even more preferably 1 to 20 mol % with respect to all of the repeating units in the resin (A).

Repeating Unit Represented by General Formula (1)

The resin (A) preferably has a non-acid-decomposable repeating unit which is represented by the following general formula (1).

[Chem. 10]

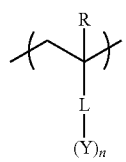

(1)

R represents a hydrogen atom, an alkyl group, a cycloalkyl group, a halogen atom, or an alkoxycarbonyl group.

L represents a single bond or an (n+1) valent linking group.

Y represents an alicyclic group, or an aromatic group.

n represents an integer of 1 or more.

Examples of the alkyl group of R in the general formula (1) preferably include a methyl group which may have a substituent, an ethyl group, a propyl group, an isopropyl group, an n-butyl group, a sec-butyl group, a hexyl group, a 2-ethylhexyl group, an octyl group, or an alkyl group having 20 or less carbon atoms such as a dodecyl group, more preferably an alkyl group having 8 or less carbon atoms, and particularly preferably an alkyl group having 3 or less carbon atoms.

Examples of the alkyl group which is included in the alkoxycarbonyl group are preferably the same as the alkyl groups in the above-described $R_{X1}$ to $R_{X3}$.

The cycloalkyl group may be either monocyclic or polycyclic. Preferable examples include a monocyclic cycloalkyl group having 3 to 8 carbon atoms such as a cyclopropyl group, cyclopentyl group, or a cyclohexyl group which may have a substituent.

Examples of the halogen atom include a fluorine atom, a chlorine atom, a bromine atom, and an iodine atom and a fluorine atom is particularly preferable.

Examples of preferable substituents in each of the above-described groups include an alkyl group, a cycloalkyl group, an aryl group, an amino group, an amide group, a ureido group, a urethane group, a hydroxyl group, a halogen atom (preferably a fluorine atom), an alkoxy group, a thioether group, an acyl group, an acyloxy group, an alkoxycarbonyl group, and a nitro group, and a fluorine atom is particularly preferable. The substituents preferably have 8 or less carbon atoms.

R is more preferably a hydrogen atom or an alkyl group, even more preferably a hydrogen atom or a methyl group, particularly preferably a methyl group.

Examples of the divalent linking group which is represented by L include an alkylene group, an aromatic ring group, a cycloalkylene group, —COO-$L_1$'-, —O-$L_1$'-, —CONH—, or a group which is formed by combining two or more of these, or the like. Here, $L_1$' represents an alkylene group (preferably having 1 to 20 carbon atoms), a cycloalkylene group (preferably having 3 to 20 carbon atoms), an aromatic ring group, or a group formed by combining an alkylene group and an aromatic ring group.

Examples of the alkylene group which is the divalent linking group which is represented by L preferably include alkylene groups having 1 to 8 carbon atoms such as a methylene group, an ethylene group, a propylene group, a butylene group, a hexylene group, an octylene group, and the like. Alkylene groups having 1 to 4 carbon atoms are more preferable, and alkylene groups having 1 or 2 carbon atoms are particularly preferable.

Examples of the cycloalkylene group as a divalent linking group which is represented by L preferably include a cycloalkylene group having 3 to 20 carbon atoms, for example, a cyclopropylene group, a cyclobutylene group, a cyclopentylene group, a cyclohexylene group, a cycloheptylene group, a cyclooctylene group, a norbornylene group, or an adamantylene group.

Preferable examples of the aromatic ring group as the divalent linking group which is represented by L include a benzene ring group, an aromatic ring group having 6 to 18 carbon atoms (more preferably 6 to 10 carbon atoms) such as a naphthalene ring group, or, for example, an aromatic ring group which includes a hetero ring such as a thiophene ring, a furan ring, a pyrrole ring, a benzothiophene ring, a benzofuran ring, a benzopyrrole ring, a triazine ring, an imidazole ring, a benzimidazole ring, a triazole ring, a thiadiazole ring, or a thiazole ring, and a benzene ring group is particularly preferable.

L is preferably a group which is formed by a single bond, an alkylene group, —COO-$L_1$'-, or a combination thereof, more preferably a single bond, an alkylene group, or —COO-$L_1$'-, even more preferably an alkylene group or —COO-$L_1$'-.

In a case where Y is an alicyclic group, the alicyclic group may be monocyclic or may be polycyclic. This alicyclic hydrocarbon group may be provided with a monocyclic, a bicyclic, a tricyclic, or a tetracyclic structure, for example. The number of carbon atoms of the alicyclic hydrocarbon group is usually 5 or more, preferably 6 to 30, and more preferably 7 to 25.

Examples of the alicyclic group include groups which are provided with a partial structure listed below, for example. Each of these partial structures may have a substituent, and examples of the substituents include the same ones as the substituents which may belong to each of the above-described groups in the general formula (1). In addition, in each of these partial structures, a methylene group (—$CH_2$—) is preferably not substituted with a hetero atom.

[Chem. 11]

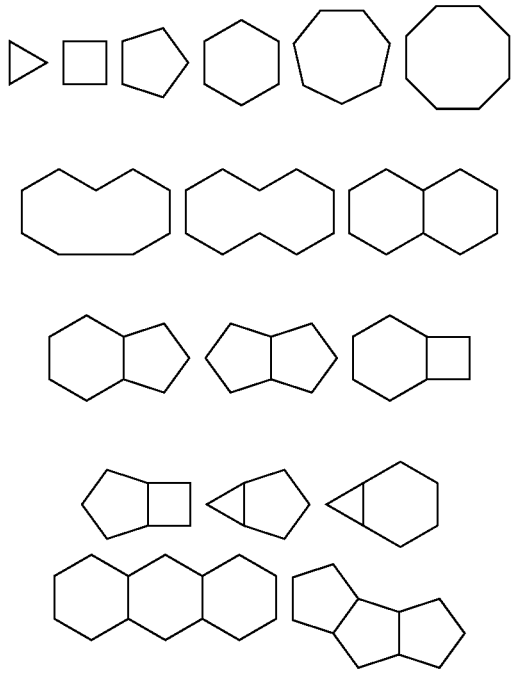

-continued

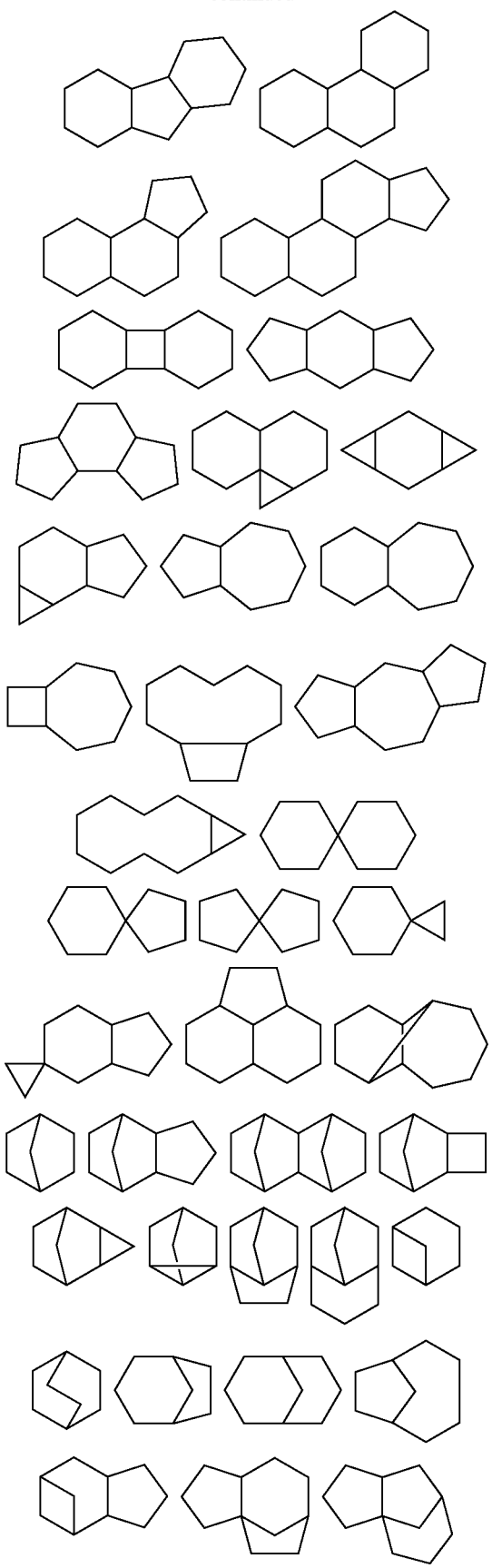

-continued

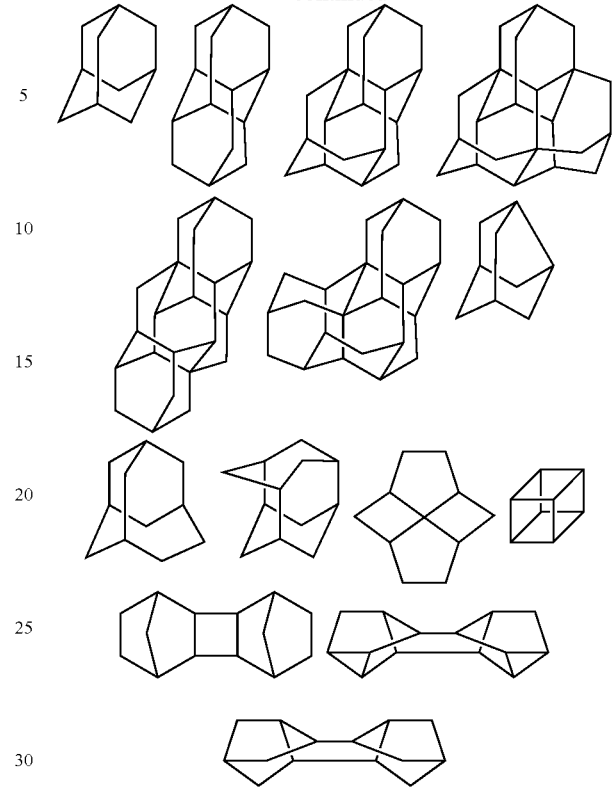

Y is preferably an adamantyl group, a noradamantyl group, a decahydronaphthyl group, a tricyclodecanyl group, a tetracyclododecanyl group, a norbornyl group, a cyclopentyl group, a cyclohexyl group, a cycloheptyl group, a cyclooctyl group, a cyclodecanyl group, or a cyclododecanyl group, more preferably an adamantyl group, a norbornyl group, a cyclohexyl group, a cyclopentyl group, a tetracyclododecanyl group, or a tricyclodecanyl group, and even more preferably a cyclohexyl group, a tricyclodecanyl group, a norbornyl group or an adamantyl group.

In a case where Y is an aromatic group, examples of the aromatic group of Y preferably include an aryl group having 6 to 18 carbon atoms such as a phenyl group, a tolyl group, a naphthyl group, or an anthracenyl group, or, for example, an aromatic ring group which includes a hetero ring such as thiophene, furan, pyrrole, benzothiophene, benzofuran, benzopyrrole, triazine, imidazole, benzimidazole, triazole, thiadiazole, or thiazole. The aromatic group of Y may have a substituent, and the substituents which may belong to the aromatic group of Y are the same as the substituents which may belong to the alicyclic group of Y as described above.

The aromatic group of Y is preferably a phenyl group or a naphthyl group.

Y is preferably an adamantyl group, a norbornyl group, a cyclohexyl group, a cyclopentyl group, a tetracyclododecanyl group, a phenyl group, a naphthyl group, or a tricyclodecanyl group, more preferably a cyclohexyl group, a norbornyl group, a phenyl group, or a naphthyl group.

The repeating unit which is represented by the general formula (1) is preferably a repeating unit which is represented by the following general formula (1-1).

[Chem. 12]

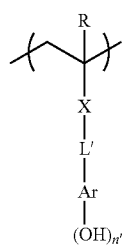

(1-1)

In the general formula (1-1), $R_1$ represents a hydrogen atom, an alkyl group, a halogen atom, or an alkoxycarbonyl group.

X represents a single bond, an alkylene group, —COO—, or —CONR$_{64}$—. $R_{64}$ represents a hydrogen atom or an alkyl group.

L' represents a single bond, —COO—, or an alkylene group.

Ar represents an (n+1) valent aromatic ring group.

n' represents an integer of 1 to 4.

Specific examples of the alkyl group, the halogen atom, and the alkoxycarbonyl group of $R_1$ in formula (1-1) and the substituents which may belong to these groups are the same as the specific examples which were described for each of the groups represented by R in the above-described general formula (1).

Specific examples and preferable examples of Ar include those where n hydrogen atoms are excluded from the specific examples and preferable examples of the aromatic group of Y in the above-described general formula (1).

The alkylene group which is represented by X is the same as the alkylene group which is the divalent linking group which is represented by L in the general formula (1), and the preferable ranges are also the same.

Examples of the alkyl group of $R_{64}$ in —CONR$_{64}$— ($R_{64}$ represents a hydrogen atom or an alkyl group) which is represented by X include the same ones as the alkyl group of R.

X is preferably a single bond, an alkylene group, —COO—, or —CONH—, and more preferably a single bond, or —COO—.

Examples of the substituents which may belong to the above-described alkyl group, alkoxycarbonyl group, alkylene group, and (n+1) valent aromatic ring group includes the same ones as the substituents which may belong to each of the groups in the general formula (1).

Examples of the alkylene group in L' preferably include ones having 1 to 8 carbon atoms such as a methylene group, an ethylene group, a propylene group, a butylene group, a hexylene group, or an octylene group, which may have a substituent, and the substituents which may belong to these groups are the same as the substituents which may belong to each of the groups in the above-described general formula (1).

L' is preferably a single bond.

Ar is more preferably an aromatic ring group having 6 to 18 carbon atoms or an alicyclic group having 3 to 20 carbon atoms which may have a substituent, and particularly preferably a benzene ring group, a naphthalene ring group, a biphenylene ring group, or an adamantane ring group. The substituents which may belong to these groups are the same as the substituents which may belong to each of the groups in the above-described general formula (1).

The repeating unit (b) is preferably provided with a hydroxystyrene structure. That is, Ar is preferably a benzene ring group.

Below, specific examples of the repeating units which are represented by the general formula (1-1) are shown; however, the present invention is not limited to these.

[Chem. 13]

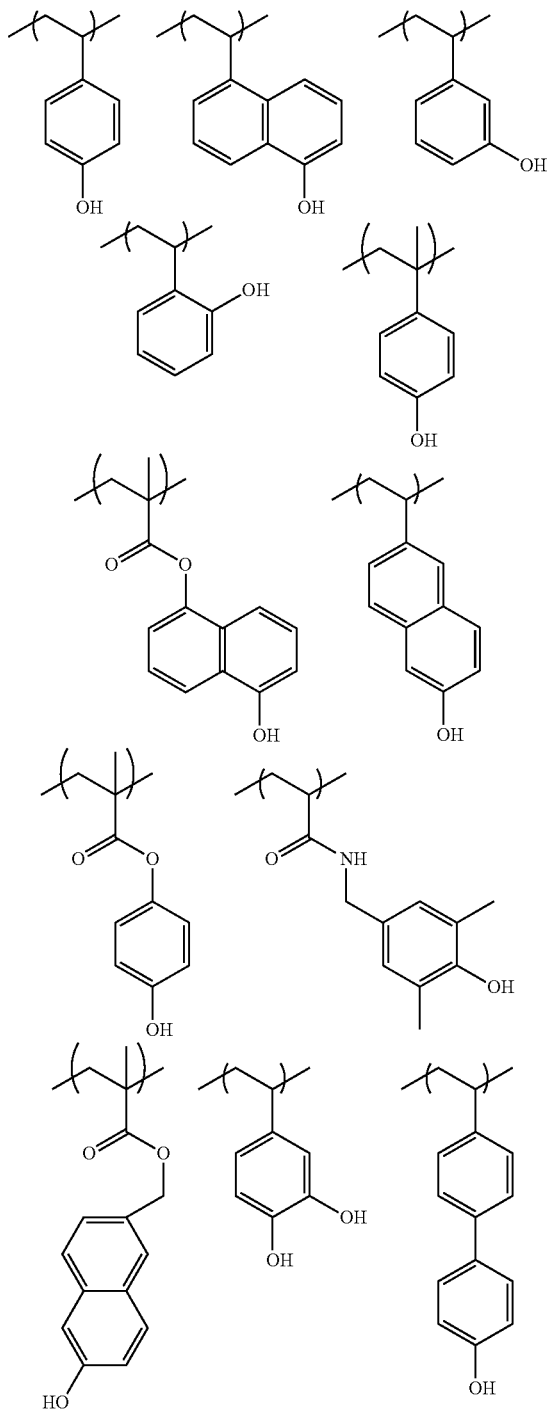

In the present invention, the resin (A) may include one type of repeating unit represented by the general formula (1-1) or may include two or more types. The content (in a case where a plurality of types of repeating units are contained, the total thereof) of the repeating unit which is represented by the general formula (1-1) with respect to all of the repeating units in the resin (A) is preferably 10 to 60 mol % or more, and more preferably 20 to 50 mol %.

The repeating unit which is represented by the general formula (1) is preferably a repeating unit which is represented by the following general formula (1-2).

[Chem. 14]

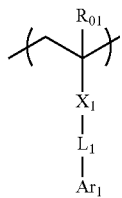

(1-2)

In the general formula (1-2), $R_{01}$ represents a hydrogen atom, an alkyl group, a halogen atom, or an alkoxycarbonyl group.

$X_1$ represents a single bond, an alkylene group, —COO—, or —CONR$_{64}$—. $R_{64}$ represents a hydrogen atom or an alkyl group.

$Ar_1$ represents a non-phenolic based aromatic group.

$L_1$ represents a single bond or an alkylene group.

Specific examples of the alkyl group, the halogen atom, and the alkoxycarbonyl group of $R_{01}$ and the substituents which may belong to these groups are the same as the specific examples which were described for each of the groups represented by R in the above-described general formula (1).

Specific examples and preferable examples of each of the groups of $X_1$ are the same as the specific examples and preferable examples of each of the groups of X in the general formula (1-1), and the preferable ranges are also the same.

The non-phenolic based aromatic groups of $Ar_1$ is an aromatic group having no hydroxyl group as a substituent, and the non-phenolic based aromatic group is preferably an aryl group having 6 to 12 carbon atoms, more preferably an aryl group having 6 to 10 carbon atoms, for example, a phenyl group, or a naphthyl group.

The non-phenolic based aromatic group of $Ar_1$ may have a substituent other than a hydroxyl group, and examples of the substituents include a linear or branched alkyl group having 1 to 4 carbon atoms, a cycloalkyl group having 3 to 10 carbon atoms, an aryl group having 6 to 10 carbon atoms, a halogen atom such as a fluorine atom, a cyano group, an amino group, a nitro group, and a carboxyl group.

The alkylene group for $L_1$ may have a substituent, and is preferably an alkylene group having 1 to 4 carbon atoms and examples thereof include a methylene group, an ethylene group, and a propylene group. As substituents which the alkylene group for $L_1$ may have, examples include an alkyl group having 1 to 4 carbon atoms, or a halogen atom such as a fluorine atom.

The substituents which the alkylene group for $L_1$ may have and the substituents which the aromatic group $Ar_1$ may have may be bonded to form a ring, and examples of the groups forming the ring include alkylene groups (for example, an ethylene group, and a propylene group).

$L_1$ is preferably a methylene group which may be substituted with a single bond or a substituent from the viewpoint of a suitable glass transition temperature (Tg) of the resin in the pattern forming.

Below, specific examples of the repeating units which are represented by the general formula (1-2) are shown; however, the present invention is not limited to these.

[Chem. 15]

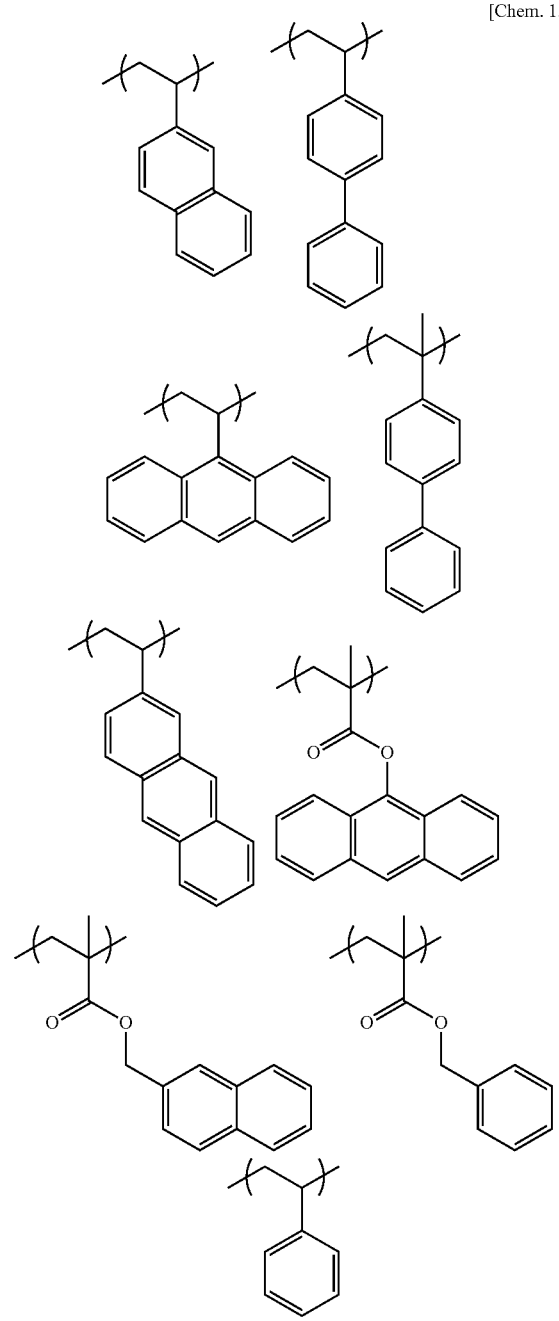

In the present invention, the resin (A) may include only one type of the repeating units which are represented by the general formula (1-2) and may also include two or more types. The content (in a case where a plurality of types of repeating units are contained, the total thereof) of the repeating unit which is represented by the general formula (1-2) with respect to all of the repeating units in the resin (A) is preferably 50 mol % or less, more preferably 1 to 40 mol %, and more preferably 1 to 25 mol %.

The resin (A) may have a repeating unit which has an alicyclic hydrocarbon having a hydroxyl group or a cyano group described below as the repeating unit which is represented by the general formula (1). This repeating unit can improve adhesion to a substrate and affinity for a developer. The repeating unit which has an alicyclic hydrocarbon having a hydroxyl group or a cyano group is preferably a repeating unit which has an alicyclic hydrocarbon structure which is substituted with a hydroxyl group or a cyano group and preferably does not have an acid-decomposable group. In the alicyclic hydrocarbon structure which is substituted with a hydroxyl group or a cyano group, the alicyclic hydrocarbon structure is preferably an adamantyl group, a diamantyl group, or a norbornane group, more preferably an adamantyl group.

Particularly, it is most preferred that the resin (A) contain a repeating unit having a hydroxyadamantyl group or a dihydroxyadamantyl group from the viewpoint of inhibition of diffusion of the generated acids. Examples of the alicyclic hydrocarbon structure which is substituted with a hydroxyl group or a cyano group include repeating units which are represented by the following general formulae (AIIa) to (AIId).

In the general formulae (AIIa) to (AIId), $R_1c$ represents a hydrogen atom, a methyl group, a trifluoromethyl group or a hydroxymethyl group.

$R_2c$ to $R_4c$ each independently represent a hydrogen atom, a hydroxyl group or a cyano group, provided that at least one of $R_2c$ to $R_4c$ represents a hydroxyl group or a cyano group. A structure where one or two members out of $R_2c$ to $R_4c$ are hydroxyl groups with the remaining being a hydrogen atom is preferred. In the general formula (VIIa), it is more preferred that two members out of $R_2c$ to $R_4c$ be hydroxyl groups and the remaining be a hydrogen atom.

Specific examples of the repeating units which have the alicyclic hydrocarbon having a hydroxyl group are given below; however, the present invention is not limited thereto.

[Chem. 17]

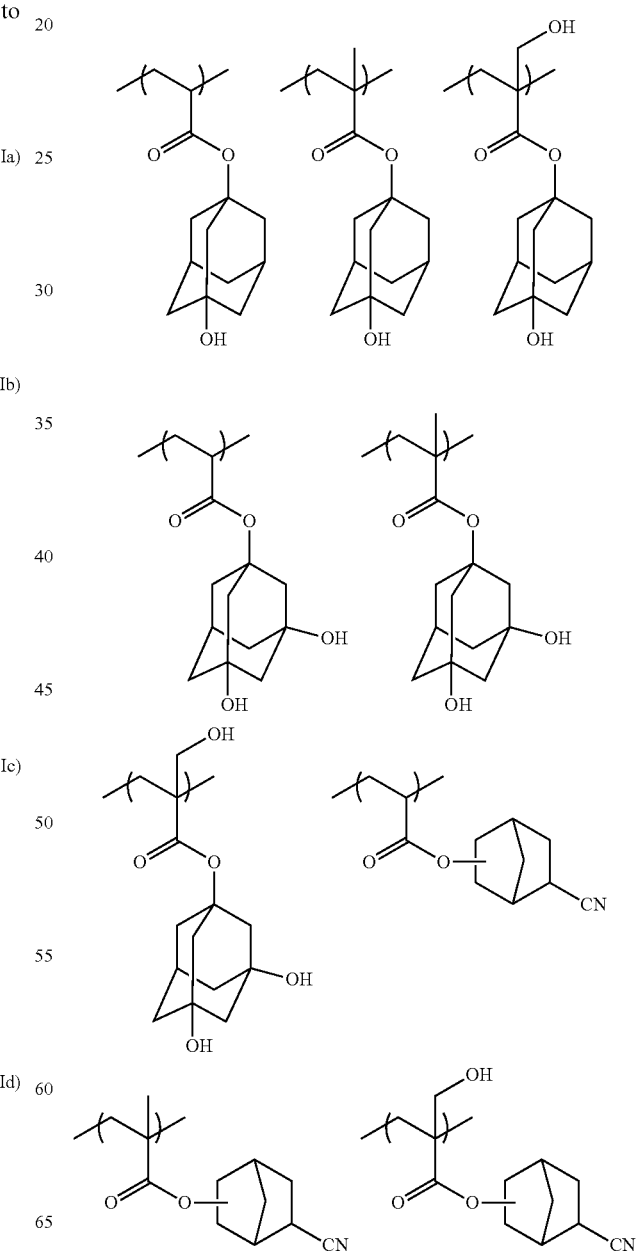

[Chem. 16]

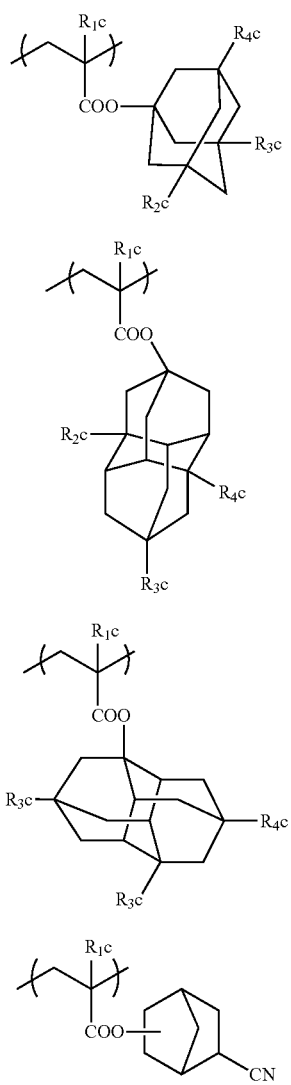

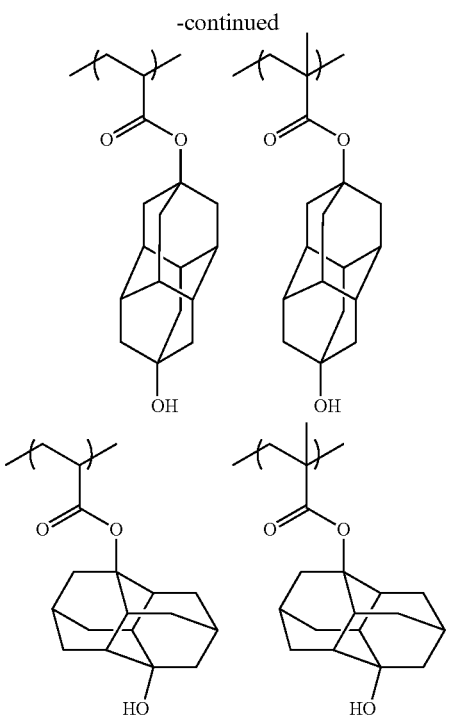

The resin (A) may include only one type of repeating unit which has an alicyclic hydrocarbon having a hydroxyl group, and may include two or more types.

In a case where the resin (A) contains a repeating unit which has a hydroxyl group, the content (in a case where a plurality of types are contained, the total thereof) of the repeating units is preferably 1 to 40 mol % with respect to all of the repeating units in the resin (A), more preferably 1 to 30 mol %, and even more preferably 3 to 20 mol %.

It is possible for the resin (A) in the present invention to have a repeating unit which does not exhibit acid decomposability and which has an alicyclic hydrocarbon structure which does not have a polar group (for example, the acid group, hydroxyl group, or cyano group) as the repeating unit which is represented by the general formula (1). In this manner, the solubility of the resin may be suitably adjusted when using the developer including the organic solvent. Examples of the repeating unit include a repeating unit represented by the general formula (1-3).

[Chem. 18]

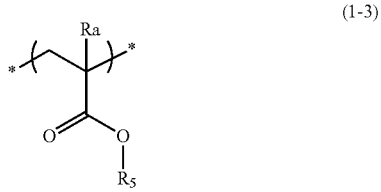

(1-3)

In the general formula (1-3), $R_5$ represents a hydrocarbon group having at least one ring structure and having no polar group.

Ra represents a hydrogen atom, an alkyl group or a —$CH_2$—O—$Ra_2$ group, wherein $Ra_2$ represents a hydrogen atom, an alkyl group or an acyl group. Ra is preferably a hydrogen atom, a methyl group, a hydroxymethyl group, or a trifluoromethyl group, and particularly preferably a hydrogen atom or a methyl group.

The ring structure contained in $R_5$ includes a monocyclic hydrocarbon group and a polycyclic hydrocarbon group. Examples of the monocyclic hydrocarbon group include a cycloalkyl group having 3 to 12 carbon atoms, such as a cyclopentyl group, a cyclohexyl group, a cycloheptyl group or a cyclooctyl group, and a cycloalkenyl group having 3 to 12 carbon atoms, such as a cyclohexenyl group. The monocyclic hydrocarbon group is preferably a monocyclic hydrocarbon group having 3 to 7 carbon atoms, and more preferably a cyclopentyl group or a cyclohexyl group.

The polycyclic hydrocarbon group includes a ring system hydrocarbon group and a cross-linked cyclic hydrocarbon group. Examples of the ring system hydrocarbon group include a bicyclohexyl group and a perhydronaphthalenyl group. Examples of the cross-linked cyclic hydrocarbon ring include a bicyclic hydrocarbon ring such as a pinane ring, a bornane ring, a norpinane ring, a norbornane ring or a bicyclooctane ring (for example, a bicyclo[2.2.2]octane ring, or a bicyclo[3.2.1]octane ring), a tricyclic hydrocarbon ring such as a homobrendane ring, an adamantane ring, a tricyclo[5.2.1.0$^{2,6}$]decane ring or a tricyclo[4.3.1.1$^{2,5}$]undecane ring, and a tetracyclic hydrocarbon ring such as a tetracyclo[4.4.0.1$^{2,5}$.1$^{7,10}$]dodecane ring and a perhydro-1,4-methano-5,8-methanonaphthalene ring. Further, the cross-linked cyclic hydrocarbon ring also includes a condensed cyclic hydrocarbon ring, for example, a condensed ring formed by fusing a plurality of 5- to 8-membered cycloalkane rings, such as a perhydronaphthalene (decalin) ring, a perhydroanthracene ring, a perhydrophenanthrene ring, a perhydroacenaphthene ring, a perhydrofluorene ring, a perhydroindene ring and a perhydrophenalene ring.

Preferred examples of the cross-linked cyclic hydrocarbon ring include a norbornyl group, an adamantyl group, a bicyclooctanyl group and a tricyclo[5.2.1.0$^{2,6}$]decanyl group. More preferred examples of the cross-linked cyclic hydrocarbon ring include a norbornyl group and an adamantyl group.

These alicyclic hydrocarbon groups may have a substituent, and preferred examples of the substituent include a halogen atom, an alkyl group, a hydroxyl group substituted with a hydrogen atom, and an amino group substituted with a hydrogen atom. The halogen atom is preferably a bromine atom, a chlorine atom, or a fluorine atom, and the alkyl group is preferably a methyl group, an ethyl group, a butyl group, or a t-butyl group. The alkyl group may further have a substituent, and the substituent which the alkyl group may further have includes a halogen atom, an alkyl group, a hydroxyl group substituted with a hydrogen atom, and an amino group substituted with a hydrogen atom.

Examples of the substituent for the hydrogen atom include an alkyl group, a cycloalkyl group, an aralkyl group, a substituted methyl group, a substituted ethyl group, an alkoxycarbonyl group, and an aralkyloxycarbonyl group. The alkyl group is preferably an alkyl group having 1 to 4 carbon atoms; the substituted methyl group is preferably a methoxymethyl group, a methoxythiomethyl group, a benzyloxymethyl group, a t-butoxymethyl group, or a 2-methoxyethoxymethyl group; the substituted ethyl group is preferably a 1-ethoxyethyl group or a 1-methyl-1-methoxyethyl group; the acyl group is preferably an aliphatic acyl group having 1 to 6 carbon atoms, such as a formyl group, an acetyl group, a propionyl group, a butyryl group, an isobutyryl group, a valeryl group, and a pivaloyl group; and the alkoxycarbonyl group is preferably an alkoxycarbonyl group having 1 to 4 carbon atoms.

The resin (A) may or may not contain a repeating unit having an alicyclic hydrocarbon structure free from a polar group and not exhibiting acid decomposability, but in the case where the resin (A) contains the repeating unit having an alicyclic hydrocarbon structure free from a polar group and not exhibiting acid decomposability, the content of the repeating unit is preferably from 1 to 40 mol %, and more preferably from 1 to 25 mol %, based on all the repeating units in the resin (A).

Specific examples of the repeating unit having an alicyclic hydrocarbon structure free from a polar group and not exhibiting acid decomposability are shown below; however, the invention is not limited thereto. In the formula, Ra represents H, $CH_3$, $CH_2OH$, or $CF_3$.

[Chem. 19]

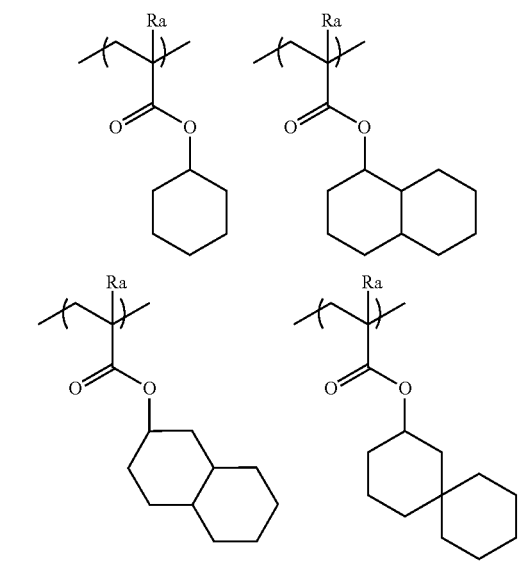
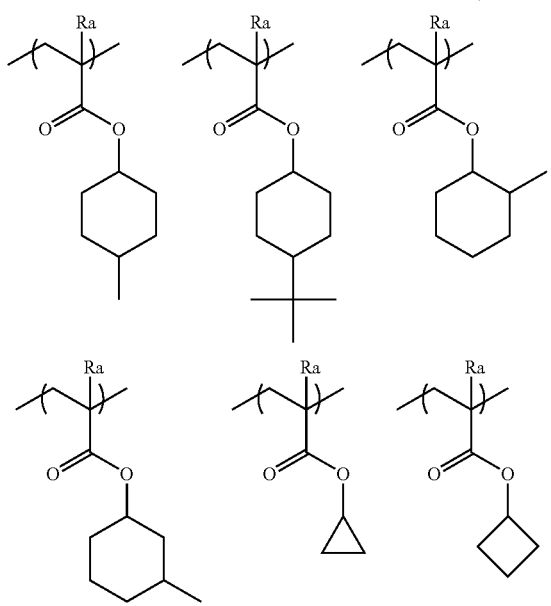
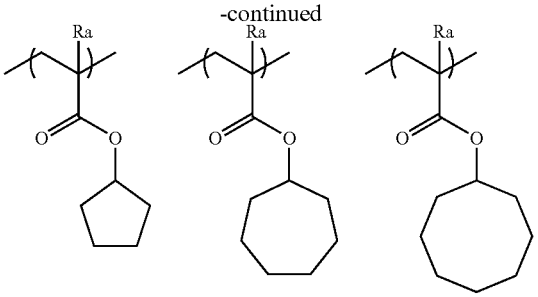
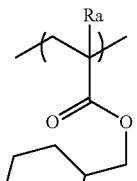
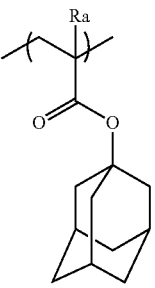
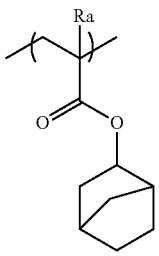
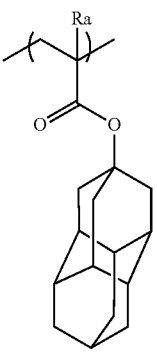
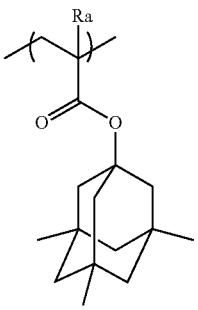
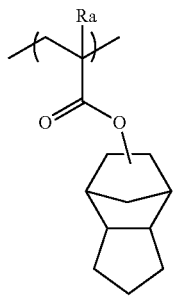

[Chem. 20]

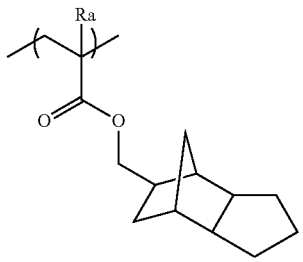
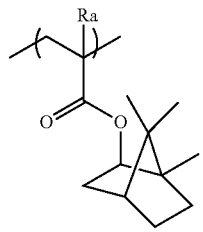

In the present invention, the resin (A) contains an alicyclic hydrocarbon structure which does not have a polar group (for example, the acid group, hydroxyl group, or cyano group) and may include only one type of repeating unit which does not exhibit acid decomposability, or may include two or more types.

The content (in a case where a plurality of types are contained, the total thereof) of the repeating unit which has an alicyclic hydrocarbon structure which does not have a polar group (for example, the acid group, hydroxyl group, or cyano group) and which does not exhibit acid decomposability is preferably 10 to 60 mol % or more with respect to all of the repeating units in the resin (A) and even more preferably 20 to 50 mol % from the viewpoint of sufficiently decreasing the solubility with respect to the organic based developer in the exposure portion while sufficiently maintaining the solubility of the unexposed portions and improving the dissolution contrast and from the viewpoint of imparting etching resistance.

In the present invention, the resin (A) may include only one type of repeating unit represented by general formula (1), and may include two or more types.

The content (in a case where a plurality of types are contained, the total thereof) of the repeating unit represented by the general formula (1) is preferably 70 mol % or less with respect to all of the repeating units in the resin (A), more preferably 1 to 60 mol %, and even more preferably 1 to 50 mol %, and particularly preferably 1 to 40 mol % from the viewpoint of sufficiently decreasing the solubility with respect to the organic based developer in the exposure portion while sufficiently maintaining the solubility of the unexposed portions and improving the dissolution contrast and from the viewpoint of imparting etching resistance.

Other Repeating Units

The resin (A) may further have a repeating unit having a lactone structure.

The resin (A) may or may not have a repeating unit having a lactone structure resin (A); however, not having the repeating unit is preferable in practice. More specifically, the content of the repeating unit having a lactone structure in the resin (A) is preferably 40 mol % or less with respect to all of the repeating units in the resin (A), more preferably 25 mol % or less, even more preferably 10 mol % or less, ideally 0 mol %, that is, not having a repeating unit having a lactone structure is particularly preferable.

Below, specific examples of the repeating unit having a lactone structure in resin (A) are shown; however, the present invention is not limited thereto. In the formula, Rx represents H, CH$_3$, CH$_2$OH, or CF$_3$.

[Chem. 21]

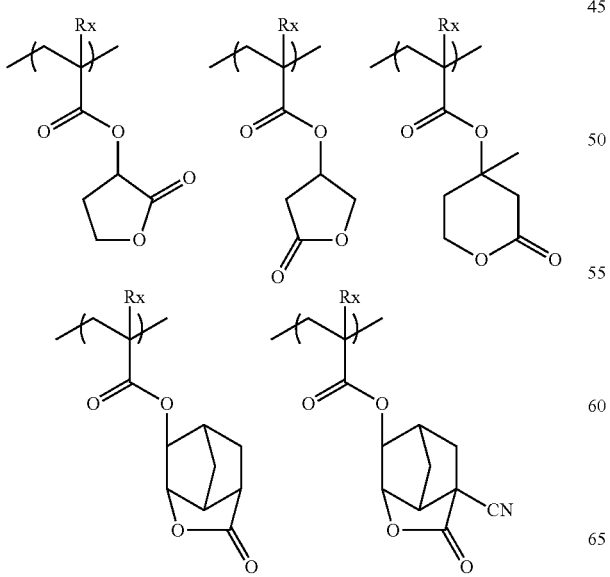

[Chem. 22]

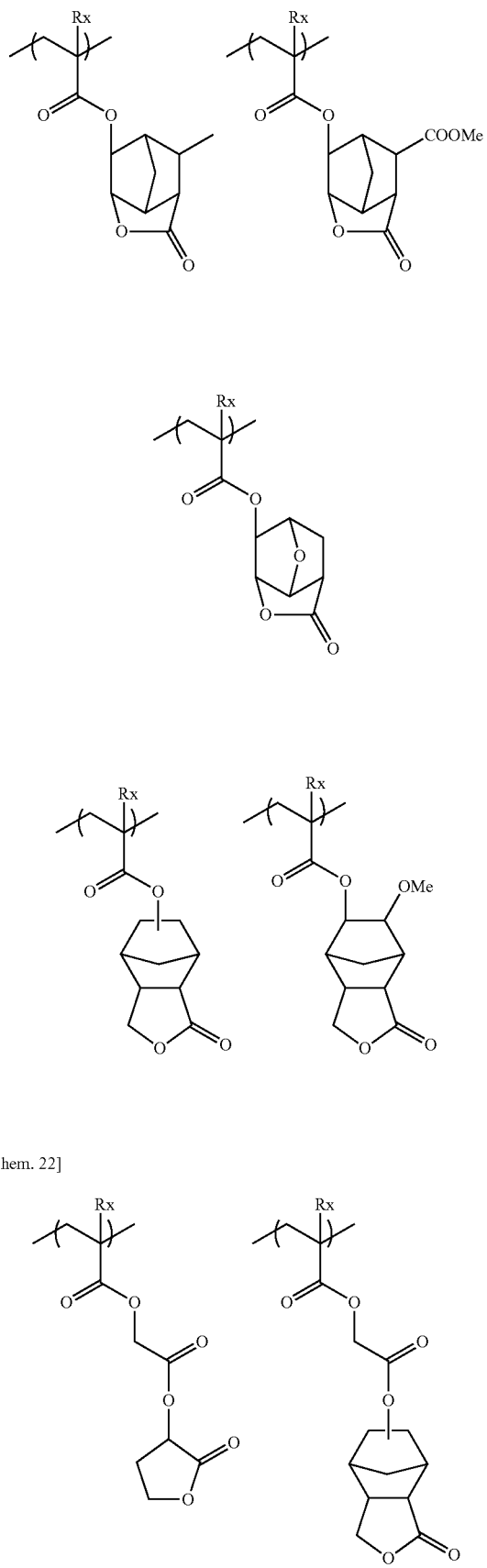

-continued

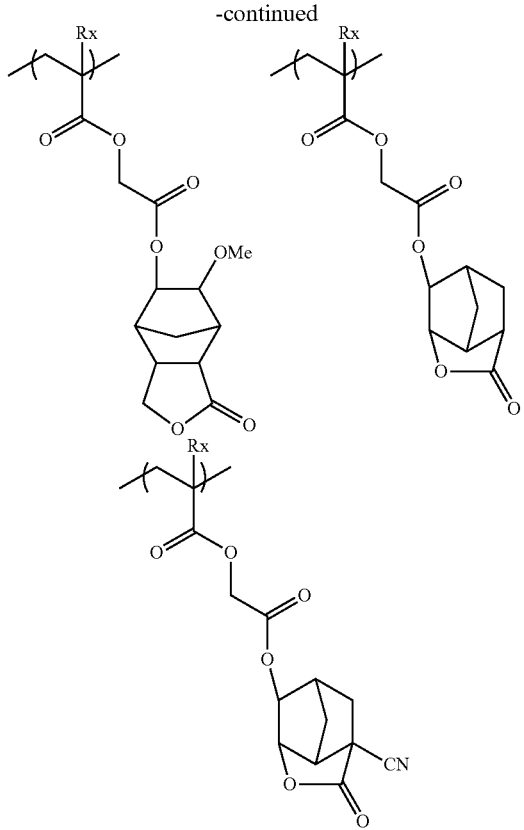

The resin (A) used in the composition of the invention may contain, in addition to the above-described repeating structural units, various repeating structural units for the purpose of controlling the dry etching resistance, suitability for standard developer, adhesion to a substrate, a resist profile, and characteristics generally required for an actinic ray-sensitive or radiation-sensitive resin composition, such as resolving power, heat resistance, and sensitivity.

Examples of such a repeating structural unit include, but are not limited to, repeating structural units corresponding to the monomers described below.

Due to this, it is possible to finely adjust the performances which are demanded in the resin which is used in the composition of the present invention, in particular,
(1) solubility with respect to the coating solvent,
(2) film-forming properties (glass transition point),
(3) alkali developability,
(4) film loss (hydrophilic and hydrophobic properties, alkali-soluble group selection),
(5) adhesion to the substrate in the unexposed portions, and
(6) dry etching resistance.

Examples of the monomer include a compound having one addition-polymerizable unsaturated bond selected from acrylic acid esters, methacrylic acid esters, acrylamides, methacrylamides, allyl compounds, vinyl ethers, vinyl esters, styrenes, crotonic acid esters, or the like.

In addition to the above, an addition-polymerizable unsaturated compound copolymerizable with the monomers corresponding to the above-described various repeating structural units may be copolymerized.

In the resin (A) used in the composition of the invention, the molar ratio of the respective repeating structural units is appropriately set for the purpose of controlling the dry etching resistance or suitability for a standard developer of an actinic ray-sensitive or radiation-sensitive resin composition, adhesion to a substrate, resist profile, and properties generally required for a resist, such as resolving power, heat resistance, and sensitivity.

The type of the resin (A) in the invention may be any one of a random type, a block type, a comb type, and a star type. The resin (A) can be synthesized by, for example, radical, cationic, or anionic polymerization of unsaturated monomers corresponding to the respective structures. Further, it may also be that polymerization is carried out using unsaturated monomers corresponding to the precursors of the respective structures, and then a polymer reaction is carried out, thereby obtaining a desired resin.

The resin (A) of the invention may be synthesized by a conventional method (for example, radical polymerization). Examples of the general synthetic method include a batch polymerization method in which a monomer species and an initiator are dissolved in a solvent and heated so as to accomplish polymerization and a dropping polymerization method in which a solution of monomer species and initiator is added by dropwise addition to a heated solvent over a period of 1 to 10 hours. The dropping polymerization method is preferred. Examples of the reaction solvent include tetrahydrofuran, 1,4-dioxane, ethers such as diisopropyl ether, ketones such as methylethyl ketone and methyl isobutyl ketone, an ester solvent such as ethyl acetate, an amide solvent such as dimethylformamide and dimethylacetamide, and the later-described solvents capable of dissolving the composition of the invention, such as propylene glycol monomethyl ether acetate, propylene glycol monomethyl ether, and cyclohexanone. The polymerization is more preferably carried out using the same solvent as the solvent used in the actinic ray-sensitive or radiation-sensitive resin composition of the invention. By the use of the same solvent, generation of particles during storage may be inhibited.

The polymerization reaction is preferably carried out in an inert gas atmosphere such as nitrogen and argon. Regarding the polymerization initiator, the polymerization is started using a commercially available radical initiator (for example, an azo-based initiator, or peroxide). The radical initiator is preferably an azo-based initiator, and an azo-based initiator having an ester group, a cyano group or a carboxyl group is preferred. Preferred examples of the initiator include azobisisobutyronitrile, azobisdimethylvaleronitrile and dimethyl 2,2'-azobis(2-methylpropionate). The initiator is added or added in parts, if desired. After the completion of the reaction, the reaction solution is poured into a solvent, and the desired polymer is collected by powder or solid recovery, or other methods. The concentration during the reaction is in the range of 5 to 50% by mass, preferably 10 to 30% by mass, and the reaction temperature is usually in the range of 10 to 150° C., preferably 30 to 120° C., more preferably 60 to 100° C.

After the completion of the reaction, the reaction solution is allowed to cool to room temperature and purified. The purification may be carried out by a normal method, for example, a liquid-liquid extraction method of applying water washing or combining appropriate solvents to remove residual monomers or oligomer components; a purification method in a solution state, such as ultrafiltration of extracting and removing only polymers having a molecular weight not more than a specific value; a reprecipitation method of adding dropwise the resin solution in a poor solvent to solidify the resin in the poor solvent and thereby remove residual monomers and the like; and a purification method in a solid state, such as washing of a resin slurry with a poor solvent after separation of the slurry by filtration. For example, the resin may be precipitated as a solid by contacting the reaction solution with a solvent in which the resin is sparingly soluble or insoluble (poor solvent) and which has a volumetric amount of 10 times or less, preferably from 10 to 5 times, the reaction solution.

The solvent used during the operation of precipitation or reprecipitation from the polymer solution (a precipitation or reprecipitation solvent) may be sufficient if it is a poor solvent for the polymer, and the solvent which can be used may be appropriately selected from a hydrocarbon, a halogenated hydrocarbon, a nitro compound, an ether, a ketone, an ester, a carbonate, an alcohol, a carboxylic acid, water, a mixed solvent containing these solvents, and the like, according to the kind of the polymer.

The amount of the precipitation or reprecipitation solvent used may be appropriately selected by taking into consideration the efficiency, yield and the like, but in general, the amount used is from 100 to 10,000 parts by mass, preferably from 200 to 2,000 parts by mass, and more preferably from 300 to 1,000 parts by mass, based on 100 parts by mass of the polymer solution.

The temperature during the precipitation or reprecipitation may be appropriately selected by taking into consideration the efficiency or operability but is usually approximately of 0 to 50° C., and preferably in the vicinity of room temperature (for example, approximately from 20 to 35° C.). The precipitation or reprecipitation operation may be carried out using a commonly employed mixing vessel such as a stirring tank by a known method such as a batch system or a continuous system.

The precipitated or reprecipitated polymer is usually subjected to commonly employed solid-liquid separation such as filtration and centrifugation, then dried and used. The filtration is carried out using a solvent-resistant filter element preferably under pressure. The drying is carried out under atmospheric pressure or reduced pressure (preferably under reduced pressure) at a temperature of approximately from 30 to 100° C., preferably on the order of 30 to 50° C.

Incidentally, after the resin is once precipitated and separated, the resin may be dissolved again in a solvent and then put into contact with a solvent in which the resin is sparingly soluble or insoluble. That is, there may be used a method including, after the completion of radical polymerization reaction, bringing the polymer into contact with a solvent in which the polymer is sparingly soluble or insoluble, to precipitate a resin (step a), separating the resin from the solution (step b), dissolving the resin again in a solvent to prepare a resin solution A (step c), bringing the resin solution A into contact with a solvent in which the resin is sparingly soluble or insoluble and which has a volumetric amount of less than 10 times (preferably 5 times or less) the resin solution A, to precipitate a resin solid (step d), and separating the precipitated resin (step e).

Moreover, in order to inhibit the aggregation or the like of the resin after preparation of the composition, for example, as described in JP2009-037108A, steps of dissolving the synthesized resin in a solvent to form a solution and heating the resulting solution at a temperature of about 30° C. to 90° C. for about 30 minutes to 4 hours may be added.

The weight average molecular weight of the resin (A) used in the composition of the present invention is preferably 50,000 or less, more preferably 30,000 or less, and even more preferably 1,000 to 20,000 in terms of polystyrene by the GPC method.

The degree of dispersion (molecular weight distribution, Mw/Mn) is normally from 1.0 to 3.0, and may be used preferably from 1.0 to 2.6, more preferably from 1.0 to 2.4, and particularly preferably in the range of 1.0 to 2.2. When the molecular weight distribution is within the above-described ranges, the resolution and the resist shape are superior, the side wall of the resist pattern is smoother, and the roughness is more improved.

In the actinic ray-sensitive or radiation-sensitive resin composition in the invention, the content of the resin (A) in the entire composition is preferably from 30 to 99% by mass, and more preferably from 60 to 95% by mass, based on the total solid content. In the present invention, the weight average molecular weight (Mw) and the number average molecular weight (Mn) of the resin (A) may be calculated by using, for example, an HLC-8120 (manufactured by Tosoh Corporation) using TSK gel Multipore HXL-M columns (manufactured by Tosoh Corporation, 7.8 mm ID×30.0 cm) and THF (tetrahydrofuran) as an eluent.

In addition, in the invention, the resin (A) may be used singly or in combination of a plurality of kinds thereof.

Further, the actinic ray-sensitive or radiation-sensitive resin composition in the invention may further contain the resin (A) as well as acid-decomposable resins (a resin which has increased polarity by the action of an acid and has reduced solubility in a developer including an organic solvent) other than resin (A). The acid-decomposable resin other than the resin (A) is an acid-decomposable resin including the same repeating units as those that may be included in the resin (A), and the preferred ranges or content in the resin of the repeating units are the same as described for the resin (A).

In the case where the acid-decomposable resin other than the resin (A) is included, the content of the acid-decomposable resin in the composition according to the invention needs to satisfy the condition that the total content of the resin (A) and the acid-decomposable resin other than the resin (A) is within the above-described ranges. The mass ratio of the resin (A) and the acid-decomposable resin other than the resin (A) can be suitably adjusted to a range in which a good effect of the invention is exhibited, but the range of [resin (A)/acid-decomposable resin other than the resin (A)] is preferably from 99.9/0.1 to 10/90, and more preferably from 99.9/0.1 to 60/40.

That the actinic ray-sensitive or radiation-sensitive resin composition of the present invention contains only the resin (A) as the acid-decomposable resin is preferable from the viewpoint of providing high resolution and a rectangular profile in the resist pattern and imparting etching resistance during dry etching.

[2] Compound (B) Generating Organic Acid Upon Irradiation with Actinic Rays or Radiation The actinic ray-sensitive or radiation-sensitive resin composition of the invention contains (B) a compound generating acid upon irradiation with actinic rays or radiation (below, referred to as "acid generator (B)"). As such an acid generator (B), photoinitiators for photo-cation polymerization, photoinitiators for photo-radical polymerization, photodecoloring agents of dyes, photo-discoloring agents, known compounds that generate an acid by irradiation with actinic rays or radiation, which are used in microresists, or the like, and mixtures thereof may be suitably selected and used.

Examples thereof include a diazonium salt, a phosphonium salt, a sulfonium salt, an iodonium salt, an imide sulfonate, an oxime sulfonate, a diazo disulfone, a disulfone, and an o-nitrobenzyl sulfonate, and the acid generator (B) preferably includes a sulfonium salt or an iodonium salt.

Further, use can be made of compounds obtained by introducing any of these groups or compounds generating an acid when irradiated with actinic rays or radiation into a polymer main chain or side chain; for example, compounds described in U.S. Pat. No. 3,849,137A, DE3914407, JP1988-26653A (JP-S63-26653A), JP1980-164824A (JP-S55-164824A), JP1987-69263A (JP-S62-69263A), JP1988-146038A (JP-S63-146038A), JP1988-163452A (JP-S63-163452A), JP1987-153853A (JP-S62-153853A), JP1988-146029A (JP-S63-146029A), and the like.

Furthermore, use can also be made of compounds generating an acid upon being irradiated with light, described in U.S. Pat. No. 3,779,778A and EP126,712B.

As the acid generator (B), examples of preferred compounds among the compounds generating acid upon decomposing caused by irradiation with actinic rays or radiation include compounds represented by the following general formulae (ZI), (ZII), and (ZIII).

[Chem. 23]

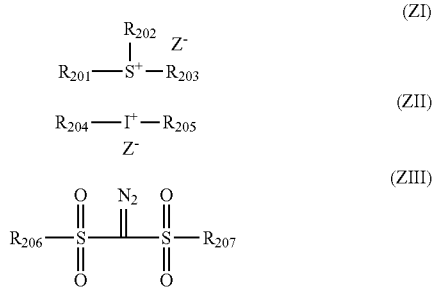

In the above-described general formula (ZI), $R_{201}$, $R_{202}$ and $R_{203}$ each independently represent an organic group.

$Z^-$ represents a non-nucleophilic anion, preferred examples thereof including a sulfonate anion, a bis (alkylsulfonyl) amide anion, a tris (alkylsulfonyl) methide anion, BF4-, PF6-, SbF6-, or the like, and is preferably an organic anion containing a carbon atom. Preferable examples of the organic anions include the organic anions shown in the formulae AN1 to AN3 below.

[Chem. 24]

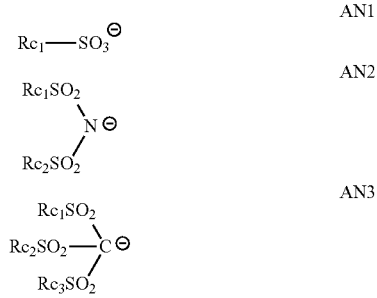

In the formulae AN1 to AN3, $Rc_1$ to $Rc_3$ each independently represent an organic group. The organic groups of $Rc_1$ to $Rc_3$ include ones having 1 to 30 carbon atoms, preferably alkyl groups which may be substituted, monocyclic or polycyclic cycloalkyl groups, heteroatom-containing cyclic groups, an aryl group, or a group in which a plurality of these are linked by a single bond or a linking group such as, —O—, —$CO_2$—, —S—, —$SO_3$—, or —$SO_2N(Rd_1)$-. Furthermore, the organic groups may form a ring structure with other bonded alkyl groups and aryl groups.

$Rd_1$ represents a hydrogen atom, or an alkyl group, and may form a ring structure with bonded alkyl groups and aryl groups.

The organic groups of $Rc_1$ to $Rc_3$ may be an alkyl group in which the first position is substituted with a fluorine atom, or a fluoroalkyl group, or a phenyl group substituted with a fluorine atom or a fluoroalkyl group. By having the fluorine atom or the fluoroalkyl group, the acidity of the acid generated by light irradiation increases and sensitivity is improved. When the carbon atoms in $Rc_1$ to $Rc_3$ number 5 or more, at least a single carbon atom is preferably substituted with a hydrogen atom, and the number of hydrogen atoms is more preferably greater than that of the fluorine atoms. By not having a perfluoroalkyl group having 5 or more carbon atoms, the ecological toxicity is reduced.

The organic group as $R_{201}$, $R_{202}$, and $R_{203}$ generally has 1 to 30 carbon atoms, and preferably 1 to 20 carbon atoms.

Further, two members of $R_{201}$ to $R_{203}$ may be bonded to each other to form a ring structure, and the ring may contain an oxygen atom, a sulfur atom, an ester bond, an amide bond or a carbonyl group.

Examples of the group formed by the combination of two members of $R_{201}$ to $R_{203}$ include an alkylene group (for example, a butylene group and a pentylene group).

Specific examples of the organic groups as $R_{201}$, $R_{202}$ and $R_{203}$ include the corresponding groups in compounds (ZI-1) and (ZI-2) which will be described later.

Moreover, the compound may be a compound having a plurality of structures represented by the general formula (ZI). For example, the compound may be a compound having a structure where at least one of $R_{201}$ to $R_{203}$ in the compound represented by the general formula (ZI) is bonded to at least one of $R_{201}$ to $R_{203}$ in another compound represented by the general formula (ZI).

As the component (Z1), the compounds (ZI-1) and (ZI-2) described below are more preferred.

The compound (ZI-1) is an arylsulfonium compound where at least one of $R_{201}$ to $R_{203}$ in the general formula (ZI) is an aryl group, that is, a compound having an arylsulfonium as the cation.

In the arylsulfonium compound, all of $R_{201}$ to $R_{203}$ may be an aryl group or a part of $R_{201}$ to $R_{203}$ may be an aryl group, with the remaining ones being an alkyl group.

Examples of the arylsulfonium compound include a triarylsulfonium compound, a diarylalkylsulfonium compound, and an aryldialkylsulfonium compound.

The aryl group of the arylsulfonium compound is preferably an aryl group such as a phenyl group, a naphthyl group, or a fluorene group, a heteroaryl group such as an indole residue, or a pyrrole residue is preferred, and a phenyl group or an indole residue is more preferred. In the case where the arylsulfonium compound has two or more aryl groups, these two or more aryl groups may be the same as or different from each other.

The alkyl group which is present, as necessary, in the arylsulfonium compound is preferably a linear, branched or cyclic alkyl group having 1 to 15 carbon atoms, and examples thereof include a methyl group, an ethyl group, a propyl group, an n-butyl group, a sec-butyl group, a t-butyl group, a cyclopropyl group, a cyclobutyl group, and a cyclohexyl group.

The aryl group, and alkyl group of $R_{201}$ to $R_{203}$ may have, as the substituent, an alkyl group (for example, having 1 to 15 carbon atoms), an aryl group (for example, having 6 to 14 carbon atoms), an alkoxy group (for example, having 1 to 15 carbon atoms), a halogen atom, a hydroxyl group or a phenylthio group. The substituent is preferably a linear, branched, or cyclic alkyl group having 1 to 12 carbon atoms, a linear, branched or cyclic alkoxy group having 1 to 12 carbon atoms, and most preferably an alkyl group having 1 to 4 carbon atoms, or an alkoxy group having 1 to 4 carbon atoms. The substituent may be substituted on any one of three members $R_{201}$ to $R_{203}$ or may be substituted on all of these three members. In the case where $R_{201}$ to $R_{203}$ are an aryl group, the substituent is preferably substituted on the p-position of the aryl group.

Next, the compound (ZI-2) will be described.

The compound (ZI-2) is a compound of a case where $R_{201}$ to $R_{203}$ in formula (ZI) each independently represent an organic group containing no aromatic ring. Here, the aromatic ring also includes an aromatic ring containing a heteroatom.

The organic group containing no aromatic ring as $R_{201}$ to $R_{203}$ generally contains 1 to 30 carbon atoms, and preferably 1 to 20 carbon atoms.

$R_{201}$ to $R_{203}$ each independently preferably represent an alkyl group, a cycloalkyl group, a 2-oxoalkyl group, a 2-oxocycloalkyl group, an alkoxycarbonylmethyl group, an allyl group or a vinyl group, more preferably a linear or branched 2-oxoalkyl group, a 2-oxocycloalkyl group or an alkoxycarbonylmethyl group, and most preferably a linear or branched 2-oxoalkyl group.

Preferable examples of the alkyl group and the cycloalkyl group of $R_{201}$ to $R_{203}$ include a linear or branched alkyl group having 1 to 10 carbon atoms (for example, a methyl group, an ethyl group, a propyl group, a butyl group, and a pentyl group), and a cycloalkyl group having 3 to 10 carbon atoms (a cyclopentyl group, a cyclohexyl group, and a norbornyl group).

The 2-oxoalkyl group as $R_{201}$ to $R_{203}$ may be either linear or branched and is preferably a group having >C=O at the 2-position of the above-described alkyl group.

The 2-oxocycloalkyl group as $R_{201}$ to $R_{203}$ is preferably a group having >C=O at the 2-position of the above-described cycloalkyl group.

The alkoxy group in the alkoxycarbonylmethyl group as $R_{201}$ to $R_{203}$ is preferably an alkoxy group having 1 to 5 carbon atoms (for example, a methoxy group, an ethoxy group, a propoxy group, a butoxy group, or a pentoxy group).

$R_{201}$ to $R_{203}$ may be further substituted with a halogen atom, an alkoxyl group (for example, having 1 to 5 carbon atoms), a hydroxyl group, a cyano group, or a nitro group.

Two members of $R_{201}$ to $R_{203}$ may be bonded to each other to form a ring structure, and the ring may contain an oxygen atom, a sulfur atom, an ester bond, an amide bond or a carbonyl group. Examples of the group formed by the combination of two members of $R_{201}$ to $R_{203}$ include an alkylene group (for example, a butylene group and a pentylene group).

Next, the general formulae (ZII) and (ZIII) will be described.

In the general formulae (ZII) and VIM, $R_{204}$ to $R_{207}$ each independently represent an aryl group which may be substituted, an alkyl group which may be substituted or a cycloalkyl group which may be substituted.

Specific and preferred examples of the aryl group of $R_{204}$ to $R_{207}$ are the same as those described as the aryl group of $R_{201}$ to $R_{203}$ in the compound (ZI-1).

Specific and preferred examples of the alkyl group and cycloalkyl group of $R_{204}$ to $R_{207}$ are the same as those described as the linear, branched, or cyclic alkyl group of $R_{201}$ to $R_{203}$ in the compound (ZI-2).

$Z^-$ has the same meaning as $Z^-$ in the general formula (ZI).

As the acid generator (B), examples of preferred compounds among the compounds generating acid upon irradiation with actinic rays or radiation further include compounds represented by the following general formulae (ZIV), (ZV), and (ZVI).

[Chem. 25]

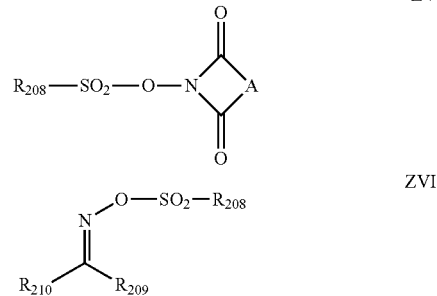

In the general formulae (ZIV) to (ZVI), $Ar_3$ and $Ar_4$ each independently represent substituted or unsubstituted aryl group.

$R_{208}$ in the general formulae (ZV) and (ZVI) each independently represent a substituted or unsubstituted alkyl group, a substituted or unsubstituted cycloalkyl group, or a substituted or unsubstituted aryl group. In terms of increasing the strength of the generated acid, $R_{208}$ is preferably substituted by a fluorine atom.

$R_{209}$ and $R_{210}$ each independently represent a substituted or unsubstituted alkyl group, a substituted or unsubstituted cycloalkyl group, a substituted or unsubstituted aryl group, an alkylthio group or an electron withdrawing group.

In addition, $R_{209}$ and $R_{210}$ may be bonded to form a ring structure. These ring structures may include an oxygen atom, a sulfur atom, an alkylene group, alkenylene group, an arylene group, or the like.

$R_{209}$ is preferably a substituted or unsubstituted aryl group. $R_{210}$ is preferably an electron withdrawing group, more preferably a cyano group or a fluoroalkyl group.

A represents a substituted or unsubstituted alkylene group, a substituted or unsubstituted cycloalkylene group, a substituted or unsubstituted alkenylene group, or a substituted or unsubstituted arylene group.

Specific examples of the aryl group of $Ar_3$, $Ar_4$, $R_{208}$, $R_{209}$, and $R_{210}$ are the same as specific examples of the aryl group of $R_{201}$ to $R_{203}$ in the general formula (ZI-1).

Specific examples of the alkyl group and cycloalkyl group of $R_{208}$, $R_{209}$, and $R_{210}$ are the same as specific examples of the alkyl group and cycloalkyl group of $R_{201}$ to $R_{203}$ in the general formula (ZI-2), respectively.

Examples of the alkyl moiety of the alkylthio group for $R_{209}$ and $R_{210}$ include the same ones as specific examples of the alkyl group of $R_{201}$ to $R_{203}$ in the above-described general formula (ZI-2).

Examples of the alkylene group of A include alkylene groups having 1 to 12 carbon atoms (for example, a methylene group, an ethylene group, a propylene group, an isopropylene group, a butylene group, and an isobutylene group), examples of the cycloalkylene group of A include monocyclic or polycyclic cycloalkylene groups having 3 to 12 carbon atoms (for example, a cyclohexylene group, a norbornylene group, and an adamantylene group), examples of the alkenylene group of A include alkenylene groups having 2 to 12 carbon atoms (for example, an ethenylene group, a propenylene group, and a butenylene group), and examples of the arylene group of A include arylene groups having 6 to 10 carbon atoms (for example, a phenylene group, a tolylene group, and a naphthylene group), respectively.

Moreover, a compound having a plurality of structures represented by the general formula (ZVI) is also preferred in the invention. For example, either of $R_{209}$ or $R_{210}$ of the compound represented by the general formula (ZVI) may be a compound having a structure bonded with either of $R_{209}$ or $R_{210}$ of another compound represented by the general formula (ZVI).

In the compounds generating acid upon decomposing caused by irradiation with actinic rays or radiation, the acid generator (B) is more preferably a compound represented by the general formula (ZIII) to (ZVI) from the viewpoint of a good solubility with respect to a developer containing the organic solvent of the unexposed portions and the tendency not to generate development defects, that is, preferably a nonionic compound. Among these, the compound is more preferably a compound represented by the general formula (ZV) or (ZVI).

In addition, from the viewpoint of improving the acid generating efficiency and the acid strength, the acid generator (B) preferably has a structure generating an acid containing a fluorine atom.

Specific examples of the acid generator (B) are shown below; however, the invention is not limited thereto.

[Chem. 26]

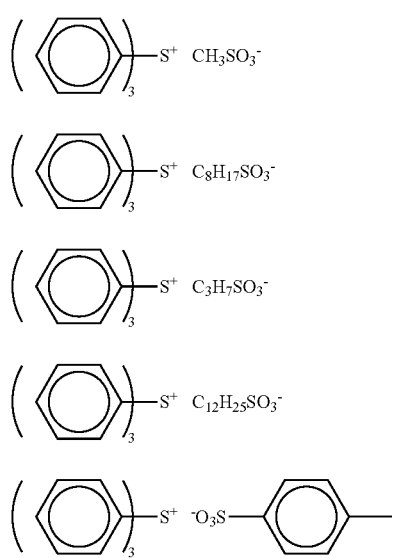

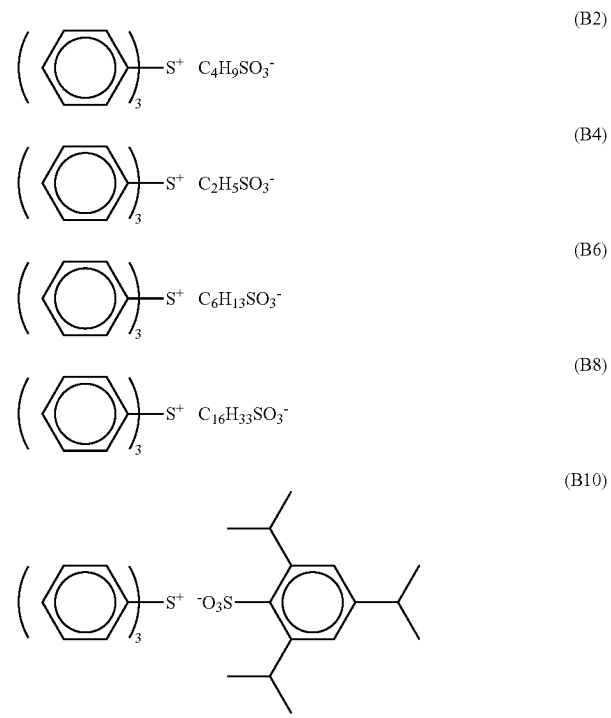

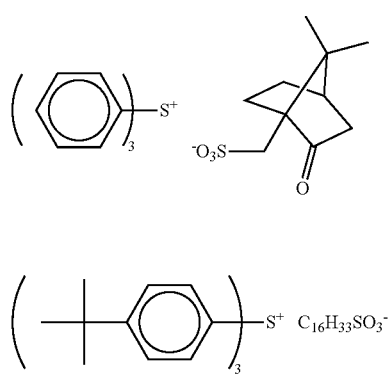

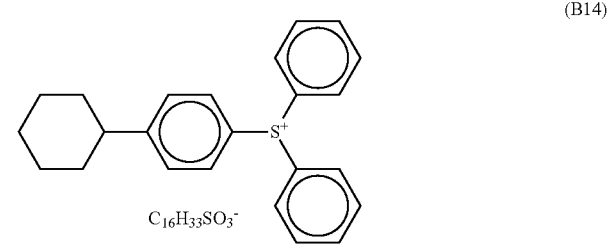

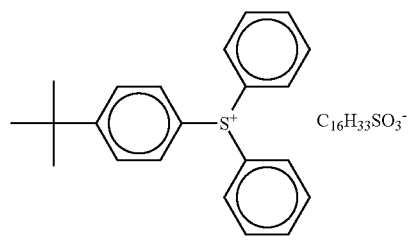 (B15)
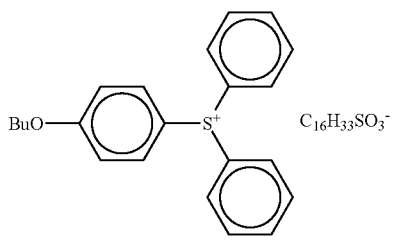 (B16)
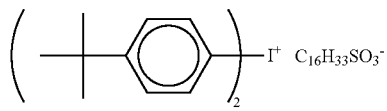 (B17)
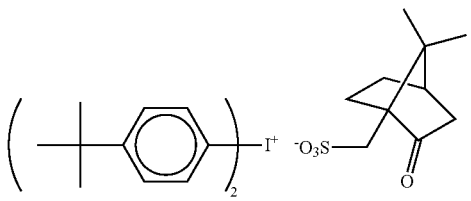 (B18)
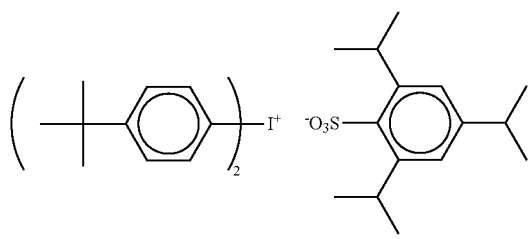 (B19)
[Chem. 27]
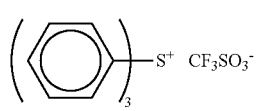 (B20)
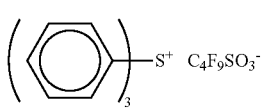 (B21)
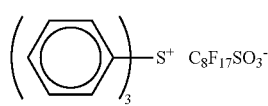 (B22)
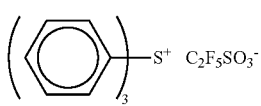 (B23)
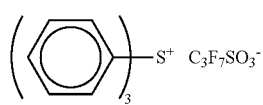 (B24)
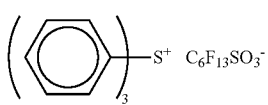 (B25)
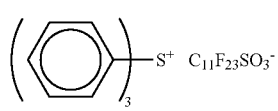 (B26)
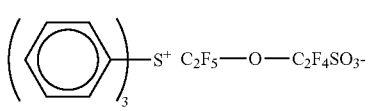 (B27)
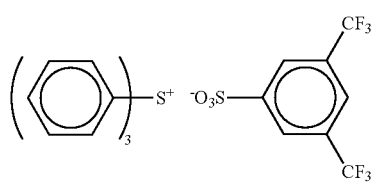 (B28)
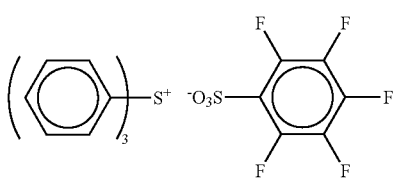 (B29)
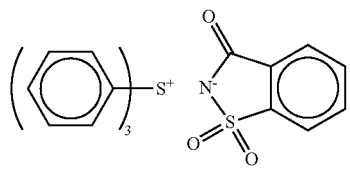 (B30)

-continued
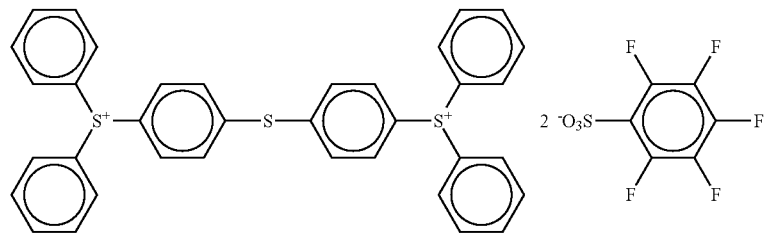
(B31)
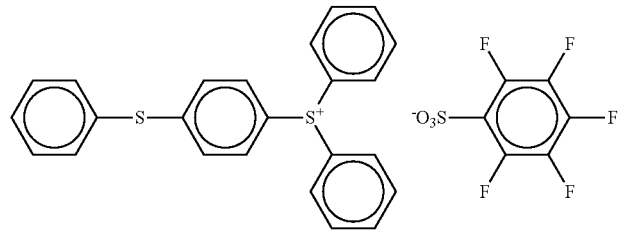
(B32)
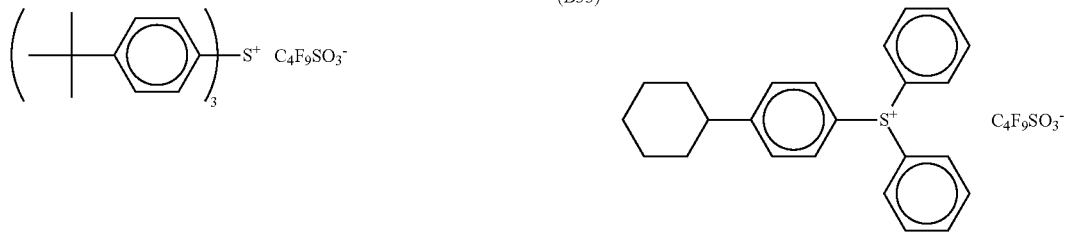
(B33) (B34)
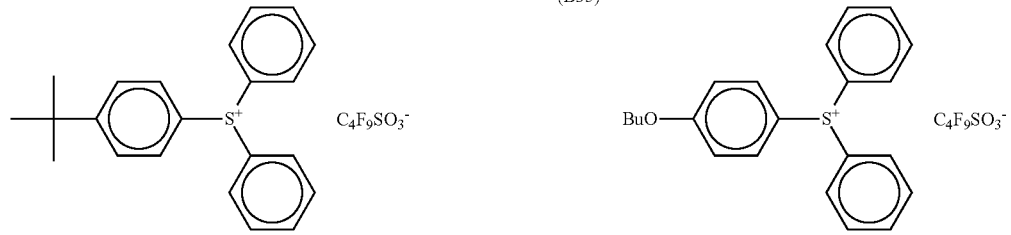
(B35) (B36)
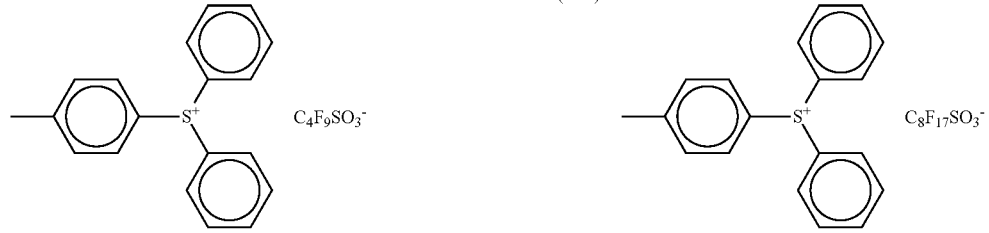
(B37) (B38)
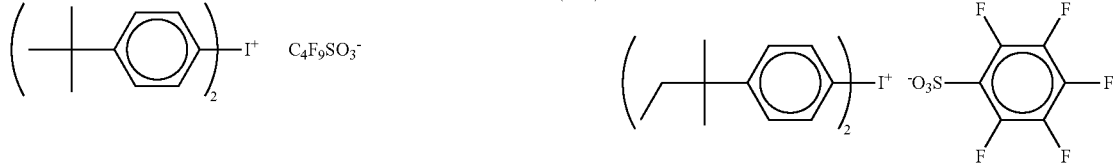
(B39) (B40)
[Chem. 28]
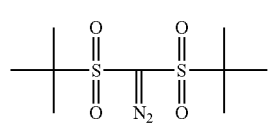
(B41) (B42)

(B43) 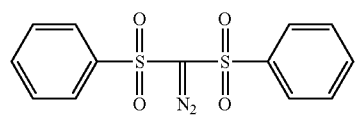
(B44) 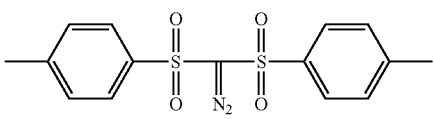
[Chem. 29]
(B45) 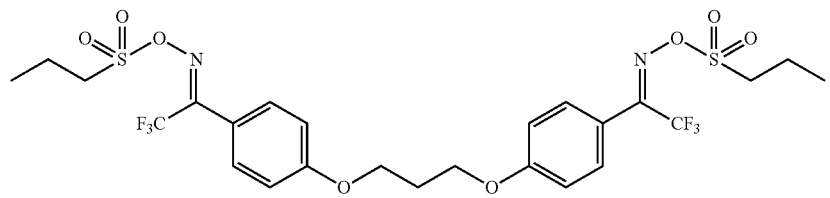
(B46) 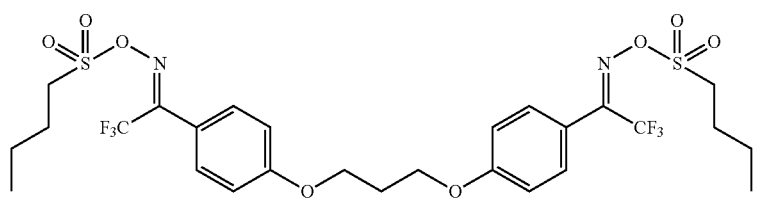
(B47) 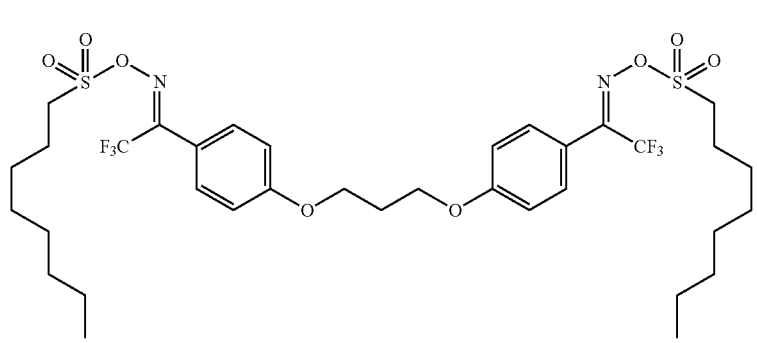
(B48) 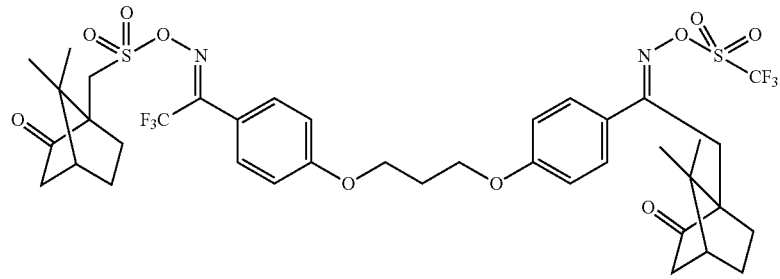
(B49) 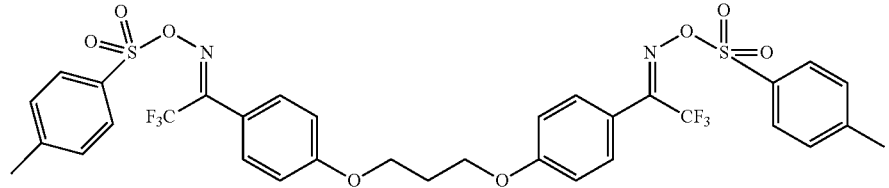
(B50) 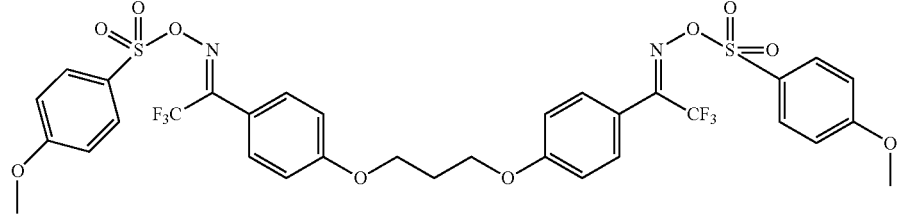

-continued
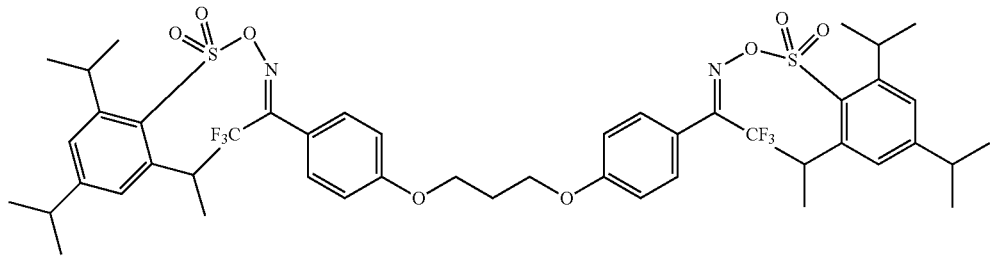
(B51)
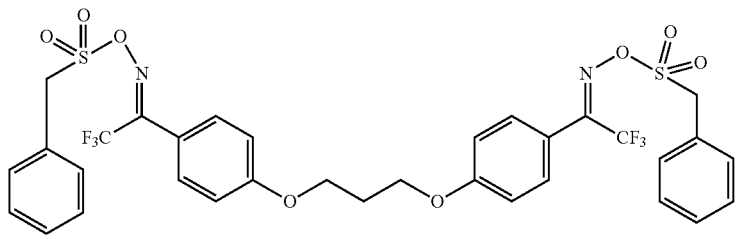
(B52)
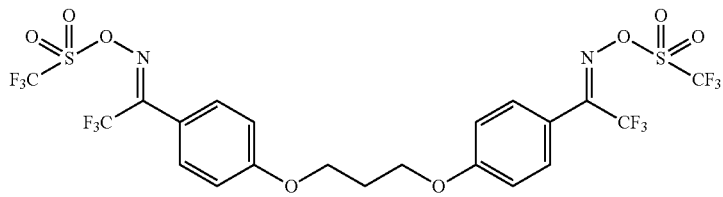
(B53)
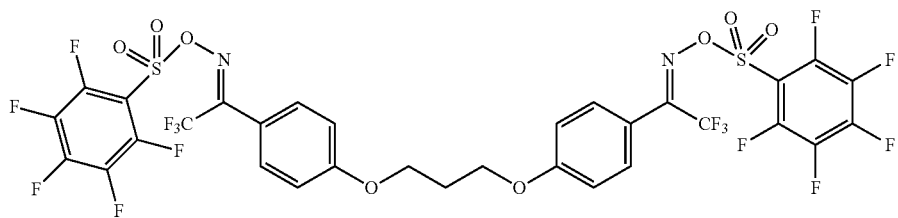
(B54)
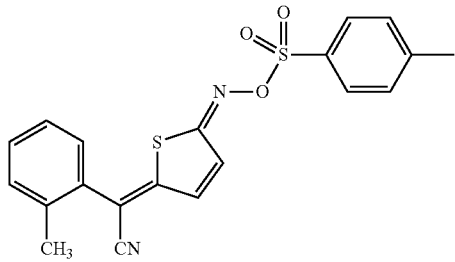
(B55)
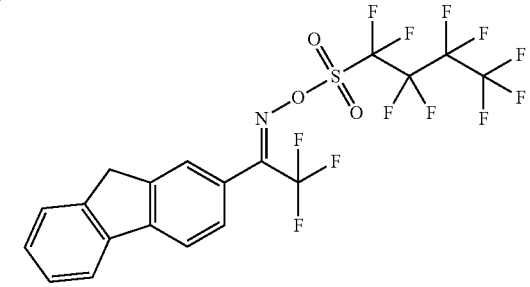
(B56)
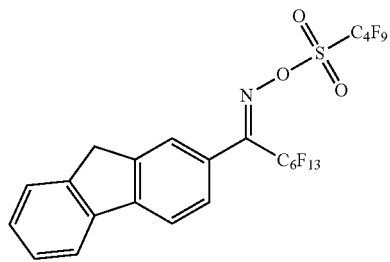
(B57)
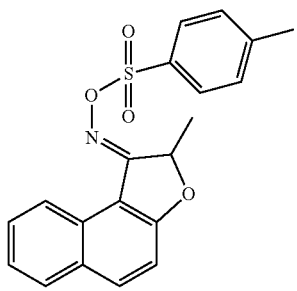
(B58)

-continued
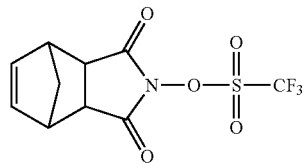 (B59)
[Chem. 30]
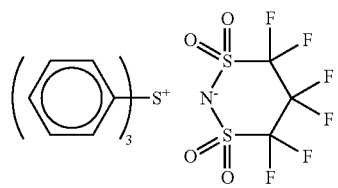 (B60)
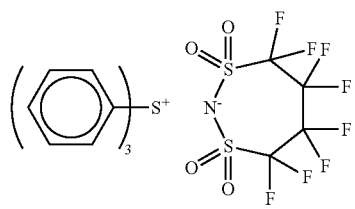 (B61)
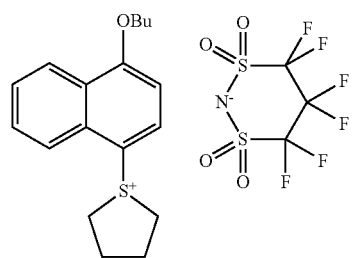 (B62)
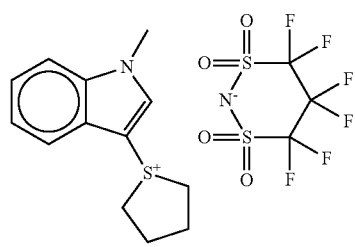 (B63)
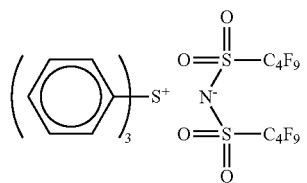 (B64)
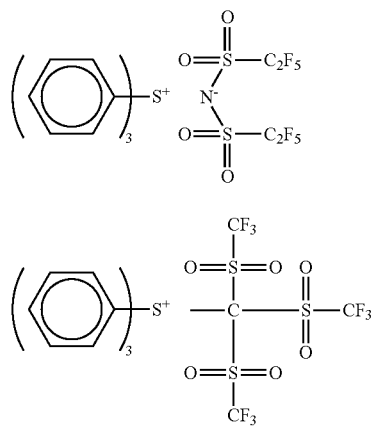 (B66)
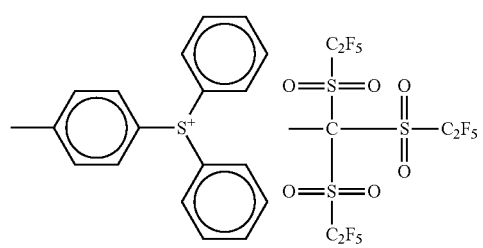 (B67)
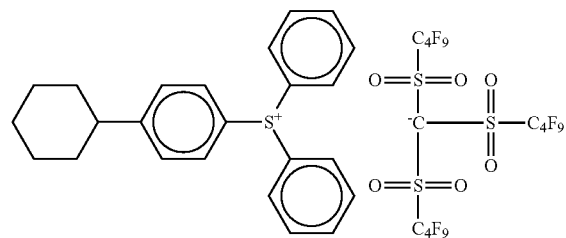 (B68)
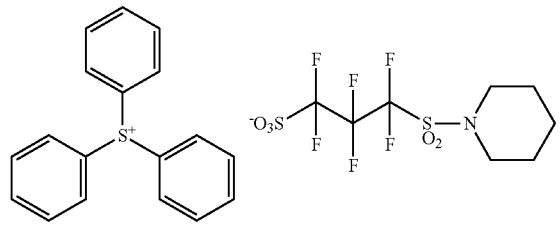 (B69)
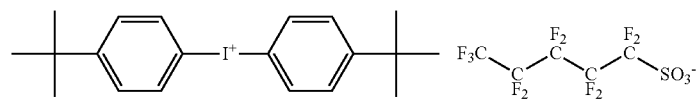 (B70)

The acid generator (B) may be used alone or in combination of two or more thereof. When used in a combination of two or more, a combination of compounds generating two different types of organic acid having two or more total atoms excluding hydrogen atoms is preferred.

For example, from the viewpoint of improving the acid generating efficiency and the acid strength, examples include an embodiment in which a compound having a structure generating an acid containing a fluorine atom and a compound not containing such a structure are combined.

The content (in a case where a plurality of types are contained, the total thereof) in the composition of the acid generator (B) is preferably 0.1 to 20 mass %, more preferably 0.5 to 15 mass %, and even more preferably 1 to 10 mass % based on the total solid content of the actinic ray-sensitive or radiation-sensitive resin composition.

[3] Solvent (C)

Examples of the solvent which can be used at the time of preparing the actinic ray-sensitive or radiation-sensitive resin composition in the invention include an organic solvent such as alkylene glycol monoalkyl ether carboxylate, alkylene glycol monoalkyl ether, alkyl lactate ester, alkyl alkoxypropionate, cyclic lactone (preferably having 4 to 10 carbon atoms), monoketone compound (preferably having 4 to 10 carbon atoms) which may contain a ring, alkylene carbonate, alkyl alkoxyacetate, and alkyl pyruvate.

Specific examples of these solvents are the same as those described in paragraphs 0441 to 0455 of US2008/0187860A.

In the invention, a mixed solvent prepared by mixing a solvent containing a hydroxyl group in the structure and a solvent not containing a hydroxyl group may be used as the organic solvent.

The solvent containing a hydroxyl group and the solvent not containing a hydroxyl group may be appropriately selected from the compounds exemplified above, but the solvent containing a hydroxyl group is preferably, for example, an alkylene glycol monoalkyl ether or an alkyl lactate, more preferably propylene glycol monomethyl ether (PGME, alternative name, 1-methoxy-2-propanol), or ethyl lactate. Further, the solvent not containing a hydroxyl group is preferably, for example, an alkylene glycol monoalkyl ether acetate, an alkyl alkoxypropionate, a monoketone compound which may contain a ring, a cyclic lactone or an alkyl acetate, more preferably propylene glycol monomethyl ether acetate (PGMEA, alternative name, 1-methoxy-2-acetoxypropanol), ethyl ethoxypropionate, 2-heptanone, -butyrolactone, cyclohexanone, or butyl acetate, and most preferably propylene glycol monomethyl ether acetate, ethyl ethoxypropionate or 2-heptanone.

The mixing ratio (by mass) of the solvent containing a hydroxyl group to the solvent not containing a hydroxyl group is from 1/99 to 99/1, preferably from 10/90 to 90/10, and more preferably from 20/80 to 60/40. A mixed solvent in which the solvent not containing a hydroxyl group is contained in an amount of 50% by mass or more is particularly preferred in view of coating uniformity.

The solvent is preferably a mixed solvent of two or more kinds of solvent containing propylene glycol monomethyl ether acetate, and more preferably a solvent of propylene glycol monomethyl ether acetate alone, or a mixed solvent of two or more kinds, containing propylene glycol monomethyl ether acetate.

[4] Basic Compound (D)

The actinic ray-sensitive or radiation-sensitive resin composition in the invention may contain a basic compound (D) in order to reduce the change in performance with aging from exposure to heating.

Preferred examples of the basic compound include compounds having structures represented by the following formulae (A) to (E).

[Chem. 31]

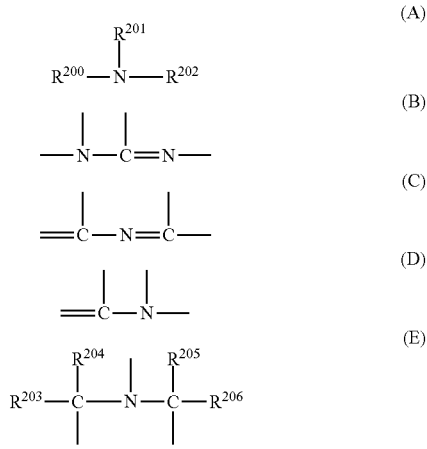

In the general formulae (A) and (E), $R^{200}$, $R^{201}$, and $R^{202}$ may be the same as or different from each other, and each independently represent a hydrogen atom, an alkyl group (preferably having 1 to 20 carbon atoms), a cycloalkyl group (preferably 3 to 20 carbon atoms), or an aryl group (having 6 to 20 carbon atoms), in which $R^{201}$ and $R^{202}$ may be bonded to each other to form a ring; and $R^{203}$, $R^{204}$, $R^{205}$, and $R^{206}$ may be the same as or different from each other, and each independently represent an alkyl group having 1 to 20 carbon atoms.

The alkyl group having a substituent as the alkyl group is preferably an aminoalkyl group having 1 to 20 carbon atoms, a hydroxyalkyl group having 1 to 20 carbon atoms, or a cycloalkyl group having 1 to 20 carbon atoms.

The alkyl group in the general formulae (A) and (E) is more preferably unsubstituted.

Preferred examples of the compound include guanidine, aminopyrrolidine, pyrazole, pyrazoline, piperazine, aminomorpholine, aminoalkylmorpholine, and piperidine; and more preferred examples of the compound include a compound having an imidazole structure, a diazabicyclo structure, an onium hydroxide structure, an onium carboxylate structure, a trialkylamine structure, an aniline structure, or a pyridine structure; an alkylamine derivative having a hydroxyl group and/or an ether bond; and an aniline derivative having a hydroxyl group and/or an ether bond.

Examples of the compound having an imidazole structure include imidazole, 2,4,5-triphenylimidazole, and benzimidazole. Examples of the compound having a diazabicyclo structure include 1,4-diazabicyclo[2,2,2]octane, 1,5-diazabicyclo[4,3,0]non-5-ene, and 1,8-diazabicyclo[5,4,0]undeca-7-ene. Examples of the compound having an onium hydroxide structure include triarylsulfonium hydroxide, phenacylsulfonium hydroxide, and sulfonium hydroxide having a 2-oxoalkyl group, specifically, triphenylsulfonium hydroxide, tris(tert-butylphenyl)sulfonium hydroxide, bis(tert-butylphenyl)iodonium hydroxide, phenacylthiophenium hydroxide, and 2-oxopropylthiophenium hydroxide. The compound having an onium carboxylate structure is a compound where the anion moiety of the compound having an onium hydroxide structure becomes a carboxylate, and examples thereof include acetate, adamantane-1-carboxylate, and perfluoroalkyl carboxylate. Examples of the compound having a trialkylamine structure include tri(n-butyl)amine and tri(n-octyl)amine. Examples of the compound having an aniline structure include 2,6-diisopropylaniline, N,N-dimethylaniline, N,N-dibutylaniline, and N,N-dihexylaniline. Examples of the alkylamine derivative having a hydroxyl group and/or an ether bond include ethanolamine, diethanolamine, triethanolamine, and tris(methoxyethoxyethyl)amine. Examples of the aniline derivative having a hydroxyl group and/or an ether bond include N,N-bis(hydroxyethyl)aniline.

Preferred examples of the basic compound further include a phenoxy group-containing amine compound, a phenoxy group-containing ammonium salt compound, a sulfonic acid ester group-containing amine compound, and a sulfonic acid ester group-containing ammonium salt compound.

As for the phenoxy group-containing amine compound, the phenoxy group-containing ammonium salt compound, the sulfonic acid ester group-containing amine compound, and the sulfonic acid ester group-containing ammonium salt compound, it is preferred that at least one alkyl group be bonded to the nitrogen atom. Further, it is preferred that the compound have an oxygen atom in the alkyl chain to form an oxyalkylene group. The number of the oxyalkylene groups within the molecule is 1 or more, preferably from 3 to 9, and more preferably from 4 to 6. Among the oxyalkylene groups, the structures of —$CH_2CH_2O$—, —$CH(CH_3)CH_2O$—, or —$CH_2CH_2CH_2O$— are preferred.

Specific examples of the ammonium salt compound having the phenoxy group-containing amine compound, the phenoxy group-containing ammonium salt compound, the sulfonic acid ester group-containing amine compound, and the sulfonic acid ester group-containing ammonium salt compound include, but are not limited to, Compounds (C1-1) to (C3-3) illustrated in paragraph 0066 in the specification of US2007/0224539A.

The actinic ray-sensitive or radiation-sensitive resin composition in the invention may or may not contain the basic compound, but in the case of the basic compound being contained, the amount of the basic compound used is usually from 0.001 to 10% by mass, and preferably from 0.01 to 5% by mass, based on the solid content of the actinic ray-sensitive or radiation-sensitive resin composition.

The ratio between the acid generator and the basic compound used in the composition is preferably a ratio of acid generator/basic compound (molar ratio)=2.5 to 300. That is, the molar ratio is preferably 2.5 or more from the viewpoint of sensitivity and resolution, and preferably 300 or less from the viewpoint of inhibiting the reduction in resolution due to thickening of the resist pattern with aging after exposure until heat treatment. The acid generator/basic compound (molar ratio) is more preferably from 5.0 to 200, and still more preferably from 7.0 to 150.

[5] Surfactant (E)

The actinic ray-sensitive or radiation-sensitive resin composition in the invention may or may not further contain a surfactant, and in the case where it contains a surfactant, it is preferred to include any one fluorine-based and/or silicone-based surfactant (a fluorine-based surfactant, a silicone-based surfactant or a surfactant containing both fluorine atoms and silicon atoms) or two or more kinds thereof.

When the actinic ray-sensitive or radiation-sensitive resin composition in the invention contains the surfactant, a resist pattern with good sensitivity, resolution and adherence as well as few development defects can be obtained in using an exposure light source of 250 nm or less, and in particular, 220 nm or less.

Examples of the fluorine-based and/or silicone-based surfactant include the surfactants described in paragraph 0276 in the specification of US2008/0248425A, such as EFtop EF301 and EF303 (manufactured by Shin-Akita Kasei K. K.); Florad FC430, 431, and 4430 (manufactured by Sumitomo 3M Inc.); Megaface F171, F173, F176, F189, F113, F110, F177, F120, and R08 (manufactured by Dainippon Ink & Chemicals, Inc.); Surflon S-382, SC101, 102, 103, 104, 105, and 106, and KH-20 (manufactured by Asahi Glass Co., Ltd.); Troysol S-366 (manufactured by Troy Chemical); GF-300, and GF-150 (manufactured by Toagosei Chemical Industry Co., Ltd.); Surflon S-393 (manufactured by Seimi Chemical Co., Ltd.); EFtop EF121, EF122A, EF122B, RF122C, EF125M, EF135M, EF351, EF352, EF801, EF802, and EF601 (manufactured by JEMCO Inc.); PF636, PF656, PF6320, and PF6520 (manufactured by OMNOVA); and FTX-204G, 208G, 218G, 230G, 204D, 208D, 212D, 218D, and 222D (manufactured by NEOS Co., Ltd.). In addition, a polysiloxane polymer KP-341 (manufactured by Shin-Etsu Chemical Co., Ltd.) may also be used as the silicone-based surfactant.

Furthermore, other than those known surfactants above, a surfactant using a polymer having a fluoro-aliphatic group derived from a fluoro-aliphatic compound which is produced by a telomerization method (also called a telomer method) or an oligomerization method (also called an oligomer method), may also be used. The fluoro-aliphatic compound can be synthesized by the method described in JP2002-90991A.

Examples of the above-described type of surfactant include Megaface F178, F-470, F-473, F-475, F-476, and F-472 (manufactured by Dainippon Ink & Chemicals, Inc.), a copolymer of a C6F13 group-containing acrylate (or methacrylate) with a (poly(oxyalkylene)) acrylate (or methacrylate), and a copolymer of a C3F7 group-containing acrylate (or methacrylate) with a (poly(oxyethylene))acrylate (or methacrylate), and a (poly(oxypropylene))acrylate (or methacrylate).

Moreover, a surfactant other than the fluorine-based and/or silicone-based surfactant, described in paragraph 0280 in the specification of US2008/0248425A, may also be used in the invention.

The surfactants may be used singly or in combination of several kinds thereof.

The actinic ray-sensitive or radiation-sensitive resin composition of the invention may or may not contain a surfactant; however, in a case where the actinic ray-sensitive or radiation-sensitive resin composition contains a surfactant, the usage amount of the surfactant is preferably 0.0001 to 2% by mass, and more preferably 0.0005 to 1% by mass based on the total content of the actinic ray-sensitive or radiation-sensitive resin composition (excluding the solvent).

[6] Other Additives (F)

The actinic ray-sensitive or radiation-sensitive resin composition in the invention may or may not contain an onium carboxylate. Examples of the onium carboxylate include those described in paragraphs 0605 to 0606 in the specification of US2008/0187860A.

These onium carboxylates can be synthesized by reacting sulfonium hydroxide, iodonium hydroxide, ammonium hydroxide, and carboxylic acid with silver oxide in a suitable solvent.

In the case where the actinic ray-sensitive or radiation-sensitive resin composition contains onium carboxylate, the content of the onium carboxylate is generally from 0.1 to 20% by mass, preferably 0.5 to 10% by mass, and still more preferably 1 to 7% by mass, based on the total solid content of the composition.

The actinic ray-sensitive or radiation-sensitive resin composition of the invention may further contain, for example, a dye, a plasticizer, a photosensitizer, a light absorber, an alkali-soluble resin, a dissolution inhibitor, a compound for accelerating dissolution in a developer (for example, a phenol compound having a molecular weight of 1000 or less, or a carboxyl group-containing alicyclic or aliphatic compound), or the like, if desired.

The phenol compound having a molecular weight of 1000 or less can be easily synthesized by a person skilled in the art by referring to the methods described, for example, in JP1992-122938A (JP-H04-122938A), JP1990-28531A (JP-H02-28531A), U.S. Pat. No. 4,916,210B, EP219,294B, and the like.

Examples of the carboxyl group-containing alicyclic or aliphatic compound include a carboxylic acid derivative having a steroid structure, such as cholic acid, deoxycholic acid, and lithocholic acid, an adamantanecarboxylic acid derivative, adamantanedicarboxylic acid, cyclohexanecarboxylic acid, and cyclohexanedicarboxylic acid; however, the invention is not limited thereto.

The actinic ray-sensitive or radiation-sensitive resin composition in the invention is preferably used in a film thickness of 30 to 250 nm, and more preferably from 30 to 200 nm, from the viewpoint of improving the resolving power. Such a film thickness can be obtained by setting the solid concentration in the actinic ray-sensitive or radiation-sensitive resin composition to an appropriate range, thereby imparting an appropriate viscosity and improving the coatability and the film-forming property.

On the other hand, in the present invention, when used in an ion implantation application which uses the uneven substrate or the like to be described later, the film thickness of the film which is formed by the actinic ray-sensitive or radiation-sensitive resin composition is preferably 150 nm or more, more preferably 200 nm or more, and even more preferably 250 nm or more from the viewpoint of obtaining a sufficient ion interruption property. In addition, from the viewpoint of rectangularity and resolution, the film thickness is preferably 500 nm or less, and even more preferably 400 nm or less.

Here, the uneven substrate refers to a substrate on which at least one uneven shape is formed.

In a case where the actinic ray-sensitive or radiation-sensitive resin composition are coated on the above-described uneven substrate, the film thickness of the film which is formed by the actinic ray-sensitive or radiation-sensitive resin composition refers to the height from the bottom surface of an uneven groove portion on the uneven substrate up to the upper surface of the formed film. Accordingly, in a case where coating is performed on the uneven substrate, the film thickness of the film is preferably 200 nm or more.

The height from the bottom surface of the uneven groove portion on the uneven substrate up to the upper surface of the uneven shape is preferably smaller than the film thickness of the resist film, for example, preferably less than 200 nm.

The height from the bottom surface of the uneven groove portion on the uneven substrate up to the upper surface of the uneven shape is preferably 10 nm or more (that is, preferably an uneven substrate which has a step with a height of 10 nm or more).

Examples of the uneven substrate include an uneven substrate or the like which has steps with a space of 20 nm to 200 nm, a pitch of 40 nm to 700 nm, and a height of 10 nm to 200 nm repeated at even intervals.

The solid content concentration of the actinic ray-sensitive or radiation-sensitive resin composition for use in the invention is usually from 1.0 to 15% by mass, preferably from 2.5 to 13% by mass, and more preferably from 3.0 to 12% by mass. By setting the solid content concentration in this range, the resist solution can be uniformly coated on a substrate, and furthermore a resist pattern having a high resolution and a rectangular profile, and which is excellent in etching resistance can be formed. The reasons therefor are not clearly known, but it is considered that by setting the solid content concentration to 10% by mass or less, and preferably 5.7% by mass or less, the materials, particularly the photo-acid generator, in the resist solution are inhibited from aggregating, and as a result, a uniform resist film can be formed.

The solid content concentration is a weight percentage of the weight of the resist components excluding the solvents, based on the total weight of the actinic ray-sensitive or radiation-sensitive resin composition.

The actinic ray-sensitive or radiation-sensitive resin composition of the invention is used, for example, after the above components are dissolved in a predetermined organic solvent, filtered using a filter, and then applied onto a predetermined support (substrate). The filter used in the filtration is preferably made of polytetrafluoroethylene, polyethylene, or nylon having a pore size of 0.1 µm or less, more preferably 0.05 µm or less, and still more preferably 0.03 µm or less. In the filtration using a filter, for example, cyclic filtration may be carried out as described in JP2002-62667A or filtration with serial or parallel connection of plural kinds of filters may be carried out. Further, the composition may be filtered plural times. In addition to the filtration using a filter, the composition may be subjected to a deaeration treatment or the like.

[7] Pattern Forming Method

The pattern forming method (negative pattern forming method) of the present invention includes at least (i) forming a film (resist film) using an actinic ray-sensitive or radiation-sensitive resin composition, (ii) exposing the film, and (iii) developing using a developer.

The exposure in (ii) may be liquid-immersion exposure.

The pattern forming method of the invention preferably includes (iv) heating after the (ii) exposure.

The pattern forming method of the invention may further include (v) developing using an alkali developer.

The pattern forming method of the invention may include (ii) exposure plural times.

The pattern forming method of the invention may include (v) heating plural times.

The resist film is formed from the actinic ray-sensitive or radiation-sensitive resin composition according to the invention, and more specifically, it is preferably formed on a substrate. In the pattern forming method of the invention, the processes of forming a film from the actinic ray-sensitive or radiation-sensitive resin composition on a substrate; exposing the film; and developing may be carried out by a generally known method.

After preparing the film and before the exposing, a prebake process (PB; Prebake) is also preferably included.

In addition, after the exposing and before the developing, heating (PEB; Post Exposure Bake) is also preferably included.

Regarding the heating temperature, heating of any of PB and PEB is preferably at a temperature of 70 to 130° C., and more preferably at a temperature of 80 to 120° C.

The heating time is preferably 30 to 300 seconds, more preferably 30 to 180 seconds, and still more preferably 30 to 90 seconds.

Heating may be carried out by a unit included in a normal exposure/development apparatus, and may also be carried out using a hot plate or the like.

By the baking, the reaction of the exposed portion is accelerated and the sensitivity or pattern profile is improved.

Examples of the wavelength of the light source used in the exposure apparatus of the invention include a KrF excimer laser (248 nm), an EUV (13 nm), an electron beam, or the like, and a KrF excimer laser is preferred.

In the invention, the substrate on which the film is formed is not particularly limited, and a substrate generally used for lithography in the production of a semiconductor device such as an IC, a liquid crystal device or a circuit board such as a thermal head and further in other photo-fabrication processes, such as an inorganic substrate, for example, silicon, SiN, $SiO_2$, and SiN and a coating-type inorganic substrate, for example, SOG, can be used.

The pattern forming method of the invention can use an uneven substrate as the substrate in the fine processing such as usage in ion implantation, for example.

For example, in a case of fine processing such as usage in ion implantation, a substrate in which fins and gates are patterned on a flat substrate can be used as the uneven substrate. The film thickness of the resist film coated with the actinic ray-sensitive or radiation-sensitive resin composition and formed on the uneven substrate patterned with fins and gates in this manner refers to the height from the bottom surface on the uneven substrate as described above to the top surface of the formed resist film, not to the height from the upper surface of the fins or gates to the upper surface of the formed resist film.

As the size (width, length, height, or the like), spacing, structure, configuration, or the like, of the fins and gates, for example, the ones described in pages 25 to 29 of "Cutting-edge FinFET processing and integration technology" Journal of the institute of Electronics, Information and Communication Engineers Vol. 91 No. 1 2008, or Jpn. J. Appl. Phys. Vol. 42 (2003) pp. 4142-4146 Part 1 No. 6B June 2003 "Fin-Type Double-Gate Metal-Oxide-Semiconductor Field-Effect Transistors Fabricated by Orientation-Dependent Etching and Electron Beam Lithography" can be appropriately applied.

The pattern forming method of the invention does not require an antireflection film from the viewpoint of achieving the effect of the invention; however, an organic antireflection film may be formed between the film and the substrate as necessary.

For example, the antireflection film may be provided at the lower layer of the resist. The antireflection film used may be either an inorganic film type such as titanium, titanium dioxide, titanium nitride, chromium oxide, carbon or amorphous silicon, or an organic film type formed of a light absorber and a polymer material. In the former case, the provision of a vacuum deposition apparatus, a CVD apparatus, a sputtering apparatus, or the like is necessary in the film forming. As the organic antireflection film, examples include ones formed of a condensate of a diphenylamine derivative and a formaldehyde modified melamine resin, an alkali-soluble resin, and a light-absorbing agent described in JP1995-69611B (JP-H07-69611B); a reactant of a maleic anhydride copolymer and a diamine type light-absorbing agent described in U.S. Pat. No. 5,294,680A; ones containing a resin binder and a methylol melamine-based heat cross-linking agent described in JP1994-118631A (JP-H06-118631A); an acrylic resin-type antireflection film having a carboxylic acid group, an epoxy group, and a light-absorbing group in the same molecule described in JP1994-118656A (JP-H06-118656A); ones formed of methylol melamine and a benzophenone-based light-absorbing agent described in JP1996-87115A (JP-H08-87115A); and ones in which a low molecular weight light-absorbing agent is attached to a polyvinyl alcohol resin described in JP1996-179509A (JP-H08-179509A);

In addition, as the organic antireflection film, a commercially available organic antireflection film such as DUV30 Series and DUV-40 Series manufactured by Brewer Science, Inc. and AR-2, AR-3 and AR-5 manufactured by Shipley Co., Ltd. can also be used.

In addition, as necessary, the antireflection film can be used on the upper layer of the resist.

Examples of the antireflection film include AQUATAR-II, AQUATAR-III, AQUATAR-VII, and the like manufactured by AZ Electronic Materials Corp.

As the developer (hereinafter also referred to as an organic developer) in the development with a developer including an organic solvent in the pattern forming method of the invention, a polar solvent such as a ketone-based solvent, an ester-based solvent, an alcohol-based solvent, an amide-based solvent, and an ether-based solvent, or a hydrocarbon-based solvent may be used.

Examples of the ketone-based solvent include 1-octanone, 2-octanone, 1-nonanone, 2-nonanone, acetone, 2-heptanone (methyl amyl ketone), 4-heptanone, 1-hexanone, 2-hexanone, diisobutyl ketone, cyclohexanone, methylcyclohexanone, phenyl acetone, methylethyl ketone, methyl isobutyl ketone, acetylacetone, acetonylacetone, ionone, diacetonyl alcohol, acetylcarbinol, acetophenone, methyl naphthyl ketone, isophorone, and propylene carbonate.

Examples of the ester-based solvent include methyl acetate, butyl acetate, ethyl acetate, isopropyl acetate, pentyl acetate, isopentyl acetate, amyl acetate, propylene glycol monomethyl ether acetate, ethylene glycol monoethyl ether acetate, diethylene glycol monobutyl ether acetate, diethylene glycol monoethyl ether acetate, ethyl-3-ethoxypropionate, 3-methoxybutyl acetate, 3-methyl-3-methoxybutyl acetate, methyl formate, ethyl formate, butyl formate, propyl formate, ethyl lactate, butyl lactate, and propyl lactate.

Examples of the alcohol-based solvent include alcohols such as methyl alcohol, ethyl alcohol, n-propyl alcohol, isopropyl alcohol, n-butyl alcohol, sec-butyl alcohol, tert-butyl alcohol, isobutyl alcohol, n-hexyl alcohol, n-heptyl alcohol, n-octyl alcohol and n-decanol; glycol-based solvents such as ethylene glycol, diethylene glycol, and triethylene glycol; and glycol ether-based solvents such as ethylene glycol monomethyl ether, propylene glycol monomethyl ether, ethylene glycol monoethyl ether, propylene glycol monoethyl ether, diethylene glycol monomethyl ether, triethylene glycol monoethyl ether, and methoxymethyl butanol.

Examples of the ether-based solvent include, in addition to the glycol ether-based solvents above, dioxane, and tetrahydrofuran.

Examples of the amide-based solvent include N-methyl-2-pyrrolidone, N,N-dimethylacetamide, N,N-dimethylformamide, hexamethylphosphoric triamide, and 1,3-dimethyl-2-imidazolidinone.

Examples of the hydrocarbon-based solvent include aromatic hydrocarbon-based solvents such as toluene and xylene, and aliphatic hydrocarbon-based solvents such as pentane, hexane, octane, and decane.

A plurality of these solvents may be mixed, or the solvent may be used by mixing with a solvent other than those described above or water. However, in order to sufficiently bring out the effects of the invention, the water content of the entire developer is preferably less than 10% by mass, and it is more preferred to include substantially no water.

That is, the content of the organic solvent in the organic developer is preferably from 90% by mass to 100% by mass, and more preferably from 95% by mass to 100% by mass, based on the total amount of the developer.

In particular, the organic developer is preferably a developer containing at least one organic solvent selected from a group consisting of a ketone-based solvent, an ester-based solvent, an alcohol-based solvent, an amide-based solvent, and an ether-based solvent.

The vapor pressure at 20° C. of the organic developer is preferably 5 kPa or less, more preferably 3 kPa or less, and particularly preferably 2 kPa or less. By setting the vapor pressure of the organic developer to 5 kPa or less, evaporation of the developer on a substrate or in a development cup is inhibited and the temperature uniformity in the wafer plane is enhanced, as a result, the dimensional uniformity in the wafer plane is improved.

Specific examples which have a vapor pressure of 5 kPa or less include ketone based solvents such as 1-octanone, 2-octanone, 1-nonanone, 2-nonanone, 2-heptanone (methyl amyl ketone), 4-heptanone, 2-hexanone, diisobutyl ketone, cyclohexanone, methyl cyclohexanone, phenyl acetone, and methyl isobutyl ketone; ester-based solvents such as butyl acetate, pentyl acetate, isopentyl acetate, amyl acetate, propylene glycol monomethyl ether acetate, ethylene glycol monomethyl ether acetate, diethylene glycol monobutyl ether acetate, diethylene glycol monoethyl ether acetate, ethyl-3-ethoxy propionate, 3-methoxy butyl acetate, 3-methyl-3-methoxy butyl acetate, butyl formate, propyl formate, ethyl lactate, butyl lactate, propyl lactate; alcohol-based solvents such as n-propyl alcohol, isopropyl alcohol, n-butyl alcohol, sec-butyl alcohol, tert-butyl alcohol, isobutyl alcohol, n-hexyl alcohol, n-heptyl alcohol, n-octyl alcohol, and n-decanol; glycol-based solvents such as ethylene glycol, diethylene glycol, and triethylene glycol; glycol ether solvents such as ethylene glycol monomethyl ether, propylene glycol monomethyl ether, ethylene glycol monoethyl ether, propylene glycol mono ethyl ether, diethylene glycol monomethyl ether, triethylene glycol monoethyl ether, and methoxy methyl butanol; ether-based solvents such as tetrahydrofuran; amide-based solvents such as N-methyl-2-pyrrolidone, N,N-dimethylacetamide, and N,N-dimethylformamide; aromatic hydrocarbon-based solvents such as toluene, and xylene; aliphatic hydrocarbon-based solvents such as octane, decane, and the like.

Specific examples which have a vapor pressure of 2 kPa or less which is a particularly preferable range include ketone-based solvents such as 1-octanone, 2-octanone, 1-nonanone, 2-nonanone, 4-heptanone, 2-hexanone, diisobutyl ketone, cyclohexanone, methyl cyclohexanone, and acetone phenyl; ester solvents such as butyl acetate, amyl acetate, propylene glycol monomethyl ether acetate, ethylene glycol monomethyl ether acetate, diethylene glycol monobutyl ether acetate, diethylene glycol monoethyl ether acetate, ethyl-3-ethoxy propionate, 3-methoxy butyl acetate, 3-methyl-3-methoxy butyl acetate, ethyl lactate, butyl lactate, and lactic acid propyl; alcohol-based solvents such as n-butyl alcohol, sec-butyl alcohol, tert-butyl alcohol, isobutyl alcohol, n-hexyl alcohol, n-heptyl alcohol, n-octyl alcohol, and n-decanol; glycol-based solvents such as ethylene glycol, diethylene glycol, and triethylene glycol; glycol ether solvents such as ethylene glycol monomethyl ether, propylene glycol monomethyl ether, ethylene glycol monoethyl ether, propylene glycol mono ethyl ether, diethylene glycol monomethyl ether, triethylene glycol monoethyl ether, and methoxy methyl butanol; amide solvents such as N-methyl-2-pyrrolidone, N,N-dimethylacetamide, and N,N-dimethylformamide; aromatic hydrocarbon solvents such as xylene; aliphatic hydrocarbon solvents such as octane, decane and the like.

An appropriate amount of a surfactant may be added to the organic developer, if desired.

The surfactant is not particularly limited but, for example, an ionic or nonionic fluorine-based and/or silicone-based surfactant can be used. Examples of such a fluorine-based and/or silicone-based surfactant include surfactants described in JP1987-36663A (JP-S62-36663A), JP1986-226746A (JP-S61-226746A), JP1986-226745A (JP-S61-226745A), JP1987-170950A (JP-S62-170950A), JP1988-34540A (JP-S63-34540A), JP1995-230165A (JP-H07-230165A), JP1996-62834A (JP-H08-62834A), JP1997-54432A (JP-H09-54432A), JP1997-5988A (JP-H09-5988A), U.S. Pat. No. 5,405,720B, U.S. Pat. No. 5,360,692B, U.S. Pat. No. 5,529,881B, U.S. Pat. No. 5,296,330B, U.S. Pat. No. 5,436,098B, U.S. Pat. No. 5,576,143B, U.S. Pat. No. 5,294,511B, and U.S. Pat. No. 5,824,451B. A nonionic surfactant is preferred. The nonionic surfactant is not particularly limited, but use of a fluorine-based surfactant or a silicone-based surfactant is more preferred.

The amount of the surfactant used is usually from 0.001 to 5% by mass, preferably from 0.005 to 2% by mass, and more preferably from 0.01 to 0.5% by mass, based on the total amount of the developer.

Regarding the developing method, for example, a method of dipping the substrate in a bath filled with the developer for a fixed time (dipping method), a method of raising the developer on the substrate surface by the effect of a surface tension and keeping it still for a fixed time, thereby performing the development (puddle method), a method of spraying the developer on a substrate surface (spraying method), a method of continuously discharging the developer on the substrate rotating at a constant speed while scanning the developer discharging nozzle at a constant rate (dynamic dispense method), or the like may be applied.

In the case where the above-described various developing methods include a step of discharging the developer toward the resist film from a development nozzle of a developing apparatus, the discharge pressure of the developer discharged (the flow velocity per unit area of the developer discharged) is preferably 2 mL/sec/mm$^2$ or less, more preferably 1.5 mL/sec/mm$^2$ or less, and still more preferably 1 mL/sec/mm$^2$ or less. The flow velocity is not particularly limited in the lower limit, but from the viewpoint of throughput, is preferably 0.2 mL/sec/mm$^2$ or more.

By setting the discharge pressure of the discharged developer to the range above, pattern defects attributable to the resist residue after development can be greatly reduced.

Details of this mechanism are not clearly known, but it is considered that it may be that, due to the discharge pressure in the above-described range, the pressure imposed on the resist film by the developer is small and the resist film or resist pattern is kept from inadvertent chipping or collapse.

Here, the discharge pressure (mL/sec/mm$^2$) of the developer is a value at the outlet of a development nozzle in a developing apparatus.

Examples of the method for adjusting the discharge pressure of the developer include a method of adjusting the discharge pressure by a pump or the like, and a method of supplying the developer from a pressurized tank and adjusting the pressure to change the discharge pressure.

Further, after the development step using a developer including an organic solvent, stopping of the development by replacement with another solvent may be carried out.

After the development step using a developer including an organic solvent, washing with a rinsing liquid is preferably included.

The rinsing liquid used in the rinsing step with a rinsing liquid including an organic solvent after the development using a developer including an organic solvent is not particularly limited as long as it does not dissolve the resist pattern, and a solution including an ordinary organic solvent may be used. As the rinsing liquid, a rinsing liquid including at least one organic solvent selected from a group consisting of a hydrocarbon-based solvent, a ketone-based solvent, an ester-based solvent, an alcohol-based solvent, an amide-based solvent, and an ether-based solvent is preferably used.

Specific examples of the hydrocarbon-based solvent, the ketone-based solvent, the ester-based solvent, the alcohol-based solvent, the amide-based solvent, and the ether-based solvent include those described above for the developer including an organic solvent.

After the development step using a developer including an organic solvent, more preferably, washing with a rinsing liquid containing at least one organic solvent selected from the group consisting of a ketone-based solvent, an ester-based solvent, an alcohol-based solvent, and an amide-based solvent is carried out; still more preferably, washing with a rinsing liquid containing an alcohol-based solvent or an ester-based solvent is carried out; particularly preferably, washing with a rinsing liquid containing a monohydric alcohol is carried out; and most preferably, washing with a rinsing liquid containing a monohydric alcohol having 5 or more carbon atoms is carried out.

Here, the monohydric alcohol used in the rinsing step includes linear, branched, and cyclic monohydric alcohols, and specifically 1-butanol, 2-butanol, 3-methyl-1-butanol, tert-butyl alcohol, 1-pentanol, 2-pentanol, 1-hexanol, 4-methyl-2-pentanol, 1-heptanol, 1-octanol, 2-hexanol, cyclopentanol, 2-heptanol, 2-octanol, 3-hexanol, 3-heptanol, 3-octanol, 4-octanol, or the like may be used. As the particularly preferred monohydric alcohol having or more carbon atoms, 1-hexanol, 2-hexanol, 4-methyl-2-pentanol, 1-pentanol, 3-methyl-1-butanol, or the like may be used.

A plurality of these respective components may be mixed or the solvent may be used by mixing it with an organic solvent other than those described above.

The water content in the rinsing liquid is preferably 10% by mass or less, more preferably 5% by mass or less, and particularly preferably 3% by mass or less. By setting the water content to 10% by mass or less, good development characteristics can be obtained.

The vapor pressure at 20° C. of the rinsing liquid used after the development using a developer including an organic solvent is preferably from 0.05 kPa to 5 kPa, more preferably from 0.1 kPa to 5 kPa, and most preferably from 0.12 kPa to 3 kPa. By setting the vapor pressure of the rinsing liquid to a value ranging from 0.05 kPa to 5 kPa, the temperature uniformity in the wafer plane is enhanced and moreover, swelling due to permeation of the rinsing liquid is inhibited, as a result, the dimensional uniformity in the wafer plane is improved.

The rinsing liquid may also be used after adding a surfactant in an appropriate amount.

In the rinsing, the wafer that has been subjected to development using a developer including an organic solvent is washed using the above-described rinsing liquid including an organic solvent. The method for the washing treatment is not particularly limited, but examples of the method which can be applied include a method of continuously discharging the rinsing liquid on the substrate spinning at a fixed speed (rotation coating method), a method of dipping the substrate in a bath filled with the rinsing liquid for a fixed time (dipping method), and a method of spraying the rinsing liquid on the substrate (spraying method). Above all, it is preferred to perform the washing treatment by the spin coating method and after the washing, remove the rinsing liquid from the substrate surface by spinning the substrate at a rotational speed of 2000 rpm to 4000 rpm. Further, it is also preferred to include heating (Post Bake) after the rinsing. The developer and the rinsing liquid remaining between the patterns and inside the patterns are removed by the baking. The heating after the rinsing is carried out at usually from 40 to 160° C., and preferably from 70 to 95° C., and for usually from 10 seconds to 3 minutes, and preferably from 30 seconds to 90 seconds.

In the case where the pattern forming method of the invention further includes development using an alkali developer, examples of the alkali developer include alkaline aqueous solutions of inorganic alkali such as sodium hydroxide, potassium hydroxide, sodium carbonate, sodium silicate, sodium metasilicate, and aqueous ammonia, primary amines such as ethylamine and n-propylamine, secondary amines such as diethylamine and di-n-butylamine, tertiary amines such as triethylamine and methyldiethylamine, alcoholamines such as dimethylethanolamine and triethanolamine, quaternary ammonium salts such as tetramethylammonium hydroxide and tetraethylammonium hydroxide, and cyclic amines such as pyrrole and piperidine.

Further, an alcohol and a surfactant may be each added in an appropriate amount to the alkaline aqueous solution and used.

The alkali concentration of the alkali developer is usually from 0.1 to 20% by mass.

The pH of the alkali developer is usually from 10.0 to 15.0.

In particular, a 2.38%-by-mass aqueous tetramethylammonium hydroxide solution is preferred.

As for the rinsing liquid in the rinsing treatment carried out after the alkali development, pure water is used, and the pure water may be used after adding a surfactant in an appropriate amount thereto.

Further, after the development treatment or the rinsing treatment, a treatment of removing the developer or the rinsing liquid adhering on the pattern by a supercritical fluid may be carried out.

In addition, the present invention relates to a method for manufacturing an electronic device, including the pattern forming method of the invention as described above, and an electronic device prepared by the preparation method.

The electronic device of the invention is suitably mounted on an electric/electronic device (domestic appliances, OA medium-related devices, optical devices, communication devices, and the like).

EXAMPLES

Hereinafter, more detailed description will be given according to Examples of the invention, but the present invention is not limited to the following Examples.

Synthesis Example

Synthesis of Resin P-01

141.8 parts by mass of cyclohexanone were heated to 80° C. under a nitrogen stream. While stirring the solution, a mixed solution of 13.2 parts by mass of the monomer represented by the following structural formula A, 12.6 parts by mass of the monomer represented by the following structural formula B, 17.1 parts by mass of the monomer represented by the following structural formula C, 2.6 parts by mass of the monomer represented by the following structural formula D, 116.0 parts by mass of cyclohexanone, and 2.76 parts by mass of 2,2'-dimethyl azobisisobutyrate [V-601, manufactured by Wako Pure Chemical Industries (Ltd.)] was added dropwise over 4 hours. After the completion of the dropwise addition, stirring was further performed for two hours at 80° C. After cooling the reaction solution, 40.4 parts by mass of the resin (P-01) of the present invention were obtained by vacuum drying the solid which was obtained by re-precipitating and filtering in a large amount of methanol/water (mass ratio 6:4).

[Chem. 32]

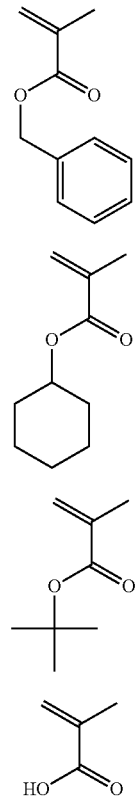

The weight average molecular weight (Mw: polystyrene conversion) determined from GPC (carrier: tetrahydrofuran (THF)) of the obtained resin was Mw=10700 and the degree of dispersion was Mw/Mn=1.81. The composition ratio (molar ratio) which was measured by $^{13}$C-NMR was 25/25/40/10.

The same operation as for the synthesis of the resin (P-01) was performed and resins (P-02) to (P-12) and (R-01) were synthesized.

The repeating units, the composition ratio (molar ratios), the weight average molecular weights, and the degrees of dispersion for the resins (P-01) to (P-12) and (R-01) are given in the following description.

[Chem. 33]

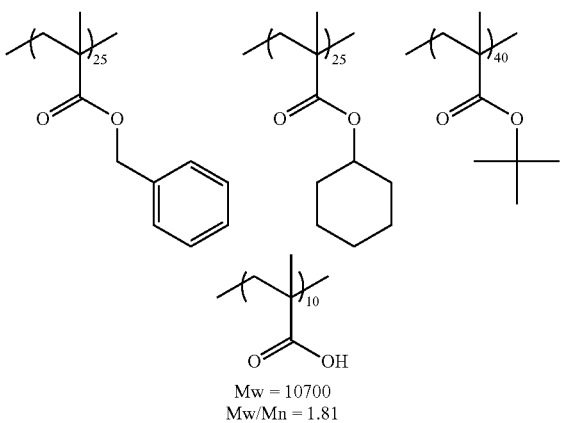

P-01

Mw = 10700
Mw/Mn = 1.81

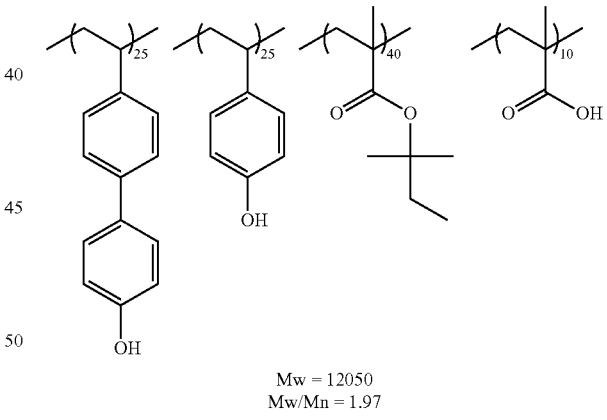

P-02

Mw = 12050
Mw/Mn = 1.97

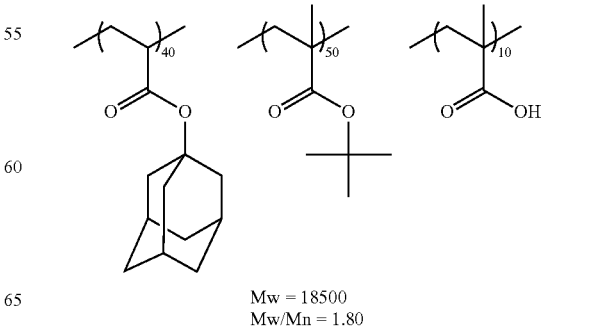

P-03

Mw = 18500
Mw/Mn = 1.80

-continued
P-04
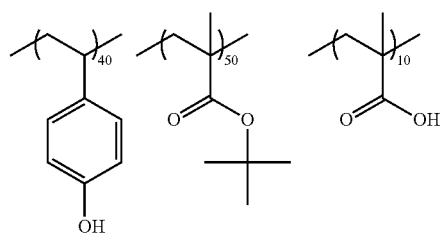
Mw = 19400
Mw/Mn = 1.94
P-05
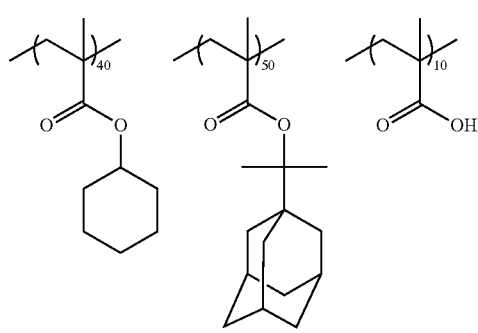
Mw = 104400
Mw/Mn = 1.89
P-06
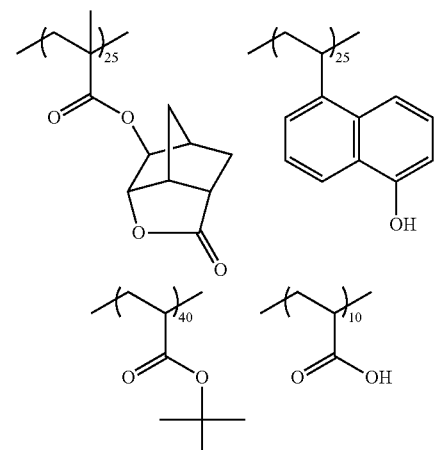
Mw = 10350
Mw/Mn = 1.80
P-07
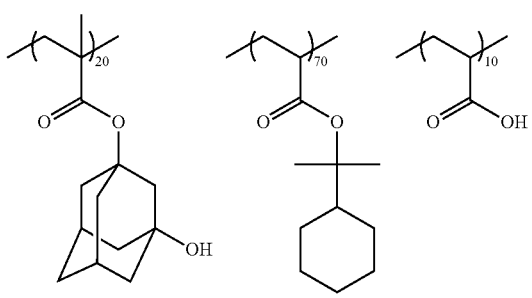
Mw = 13600
Mw/Mn = 2.02
-continued
P-08
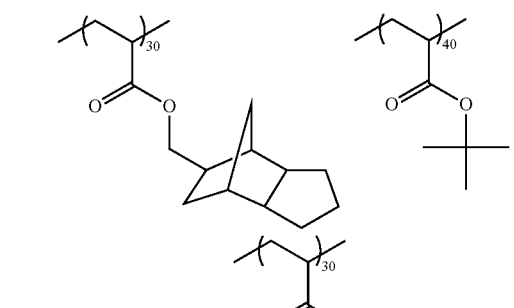
Mw = 22400
Mw/Mn = 1.65
[Chem. 34]
P-09
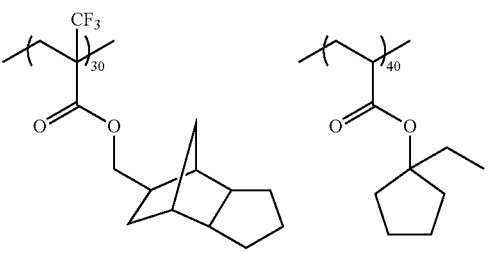
Mw = 30560
Mw/Mn = 1.80
P-10
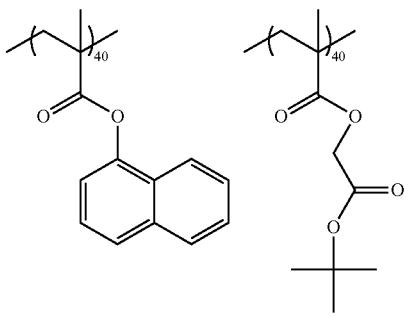
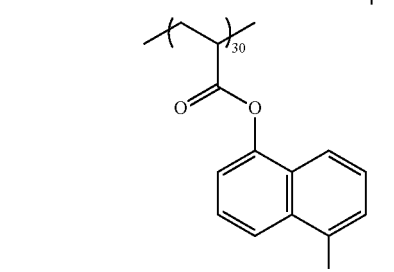
Mw = 20100
Mw/Mn = 1.72

P-11

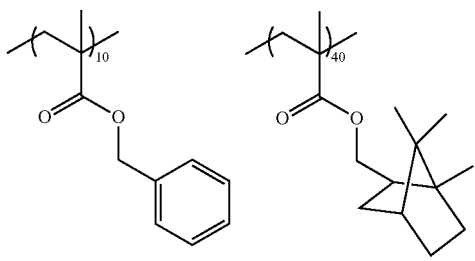

Mw = 11000
Mw/Mn = 1.68

P-12

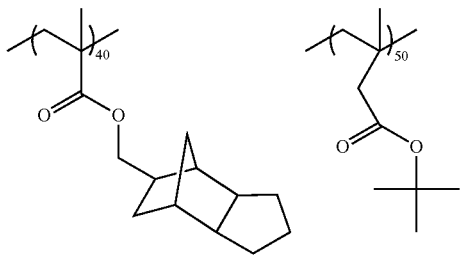

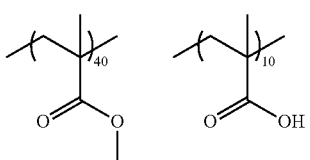

Mw = 12000
Mw/Mn = 1.71

R-01

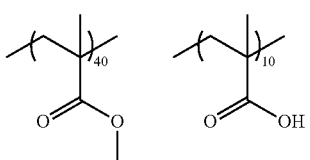

Mw = 20000
Mw/Mn = 1.60

Preparation of Actinic Ray-Sensitive or Radiation-Sensitive Resin Composition

The components shown in Table 1 below were dissolved in a solvent to prepare a resist solution for each Example. Each solution was filtered through a polyethylene filter having a pore size of 0.03 μm to prepare an actinic ray-sensitive or radiation-sensitive resin composition (resin composition) with a solid content density of 6.0% by mass.

TABLE 1

|  | Resin (A) (mass %) | Acid generator (mass %) | Basic compound (mass %) | Additive (mass %) | Solvent (mass ratio) |
|---|---|---|---|---|---|
| Resist-1 | P-01 (91.97) | PAG-3 (7.552) | Amine-2 (0.178) | W-4 (0.3) | A1/A3 (50/50) |
| Resist-2 | P-02 (91.97) | PAG-3 (7.552) | Amine-2 (0.178) | W-4 (0.3) | A1 (100) |
| Resist-3 | P-03 (91.97) | PAG-3 (7.552) | Amine-2 (0.178) | W-1 (0.3) | A1/B1 (80/20) |
| Resist-4 | P-04 (91.8) | PAG-3/PAG-4 (3.67/4.052) | Amine-1/Amine-2 (0.008/0.17) | W-2 (0.3) | A1/B2 (80/20) |
| Resist-5 | P-05 (91.91) | PAG-3/PAG-4 (5.051/2.561) | Amine-1/Amine-3 (0.118/0.06) | W-3 (0.3) | A1/A2 (99.99/0.01) |
| Resist-6 | P-06 (91.87) | PAG-3/PAG-5 (5.531/2.121) | Amine-3/Amine-1 (0.078/0.1) | W-4 (0.3) | A1/B1 (80/20) |
| Resist-7 | P-07 (91.87) | PAG-1 (7.652) | Amine-3/Amine-1 (0.078/0.1) | W-4 (0.3) | A1/B1 (80/20) |
| Resist-8 | P-08 (91.97) | PAG-1 (7.552) | Amine-3 (0.178) | W-4 (0.3) | A1/B1 (80/20) |
| Resist-9 | P-09 (91.97) | PAG-1 (7.552) | Amine-3 (0.178) | W-4 (0.3) | A1/B1 (80/20) |
| Resist-10 | P-10/P-09 (47.27/45) | PAG-1 (7.552) | Amine-3 (0.178) |  | A1/B1 (80/20) |
| Resist-11 | P-11 (91.97) | PAG-3 (7.552) | Amine-2 (0.178) | W-4 (0.3) | A1/A3 (50/50) |
| Resist-12 | P-12 (91.116) | PAG-2 (8.406) | Amine-2 (0.178) | W-4 (0.3) | A1/A3 (50/50) |
| Resist-R01 | R-01 (91.97) | PAG-3 (7.552) | Amine-2 (0.178) | W-4 (0.3) | A1/A3 (50/50) |

Components and reference numerals in the above Table 1 are as follows.

Acid Generator

[Chem. 35]

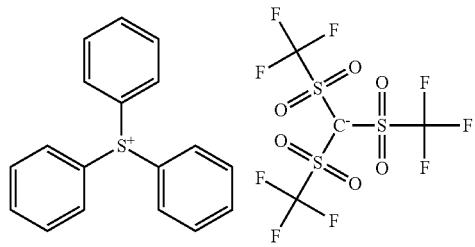

PAG-1

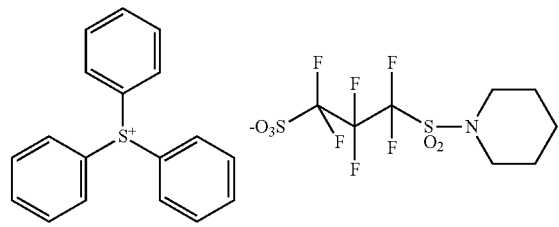

PAG-2

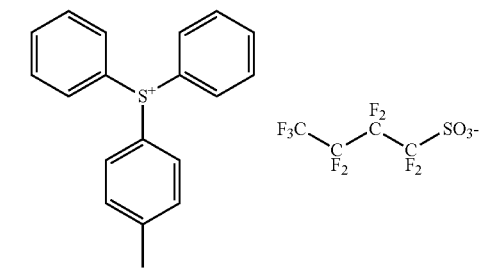

PAG-3

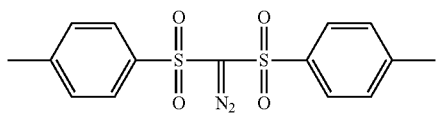

PAG-4

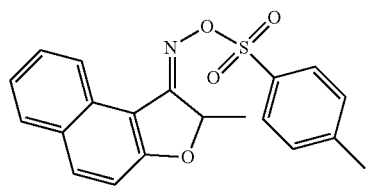

PAG-5

[Basic Compound]

[Chem. 36]

Amine-1

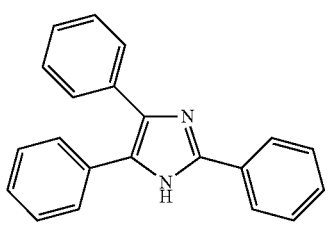

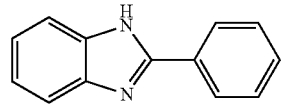

Amine-2

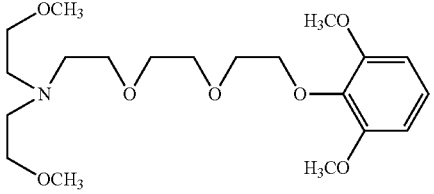

Amine-3

Additive (Surfactant)
W-1: Megaface F176 (manufactured by Dainippon Ink & Chemicals, Inc.; fluorine-based)
W-2: Megaface R08 (manufactured by Dainippon Ink & Chemicals, Inc.; fluorine- and silicone-based)
W-3: Polysiloxane Polymer KP-341 (manufactured by Shin-Etsu Chemical Co., Ltd.; silicone-based)
W-4: Compound having the following structure

[Chem. 37]

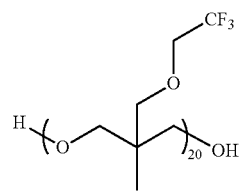

[ Solvent]
A1: Propylene glycol monomethyl ether acetate (PGMEA)
A 2: γ-butyrolactone
A 3: Cyclohexanone
B 1: Propylene glycol monomethyl ether (PGME)
B 2: Ethyl lactate
Developer and Rinsing Liquid
ND-1: Butyl acetate
ND-2: EEP (3-ethoxy ethyl propionate)
ND-3: MAK (2-heptanone)
NR-1: 1-hexanol
NR-2: 4-methyl-2-pentanol
PD-1: 2.38 mass % tetramethylammonium hydroxide aqueous solution
PR-1: Pure water Example 1 to Example 12 and Comparative
Example 1 to Comparative Example 2

Evaluation Method

Execution Method on Uneven Substrate

Using the prepared resist composition, the resist composition was coated on substrates (manufactured by Advanced Materials Technology Co., Ltd.) which have steps with a space of 100 nm, a pitch of 500 nm, and a height of 100 nm repeated at even intervals, baking (PreBake; PB) was performed for 60 seconds at the temperatures shown in the following Table 2, and films with a film thickness of 200 nm were formed. Pattern exposure was performed on the obtained wafer using a KrF excimer laser scanner (NA 0.80) via an exposure mask. Subsequently, developing was performed by paddling with the organic based developer shown in Table 2 after baking (Post Exposure Bake; PEB) for 60 seconds at the temperatures shown in the following Table 2, then, after rinsing was performed by paddling with the rinsing liquid shown in Table 2, a line and space pattern with lines of 400 nm and a pitch of 600 nm was obtained by rotating the wafer for 30 seconds at a rotational speed of 4000 rpm.

Evaluation Method (Shape of Uneven Substrate)

A cross-sectional shape of the lines of the line and space pattern with lines of 400 nm and a pitch of 600 nm was observed using a scanning electron microscope (S-4800 manufactured by Hitachi, Ltd.) and was evaluated as rectangle, taper shape, or reverse taper shape. The shape of the rectangle is most preferable.

Evaluation Method (Scum on Uneven Substrate)

In the line and space pattern with lines of 400 nm and a pitch of 600 nm, the dissolved resist (scum) remaining in the groove portions on the uneven substrate was observed at a cross-section, and the level of scum was evaluated using five levels. The lower the value, the better the scum performance.

(Determining Criteria)

A: cases where the height of the residue which is present in the groove portion is 0% or more and less than 20% with respect to the depth of the groove portion
B: cases where the height of the residue which is present in the groove portion is 20% or more and less than 40% with respect to the depth of the groove portion
C: cases where the height of the residue which is present in the groove portion is 40% or more and less than 60% with respect to the depth of the groove portion
D: cases where the height of the residue which is present in the groove portion is 60% or more and less than 80% with respect to the depth of the groove portion
E: cases where the height of the residue which is present in the groove portion is 80% or more with respect to the depth of the groove portion Evaluation Method (EL in Pattern Forming on Uneven Substrate)

The exposure amount which forms the line and space pattern with lines of 400 nm and a pitch of 600 nm was set as the optimum exposure amount, an exposure amount width which allows a pattern size of 400 nm±10% when the exposure amount is changed was determined, and this value was displayed as a percentage by dividing with the optimal exposure amount. The higher the value, the smaller the performance variations due to changes in exposure amount, whereby the exposure latitude (EL) becomes favorable.

Evaluation Method (Execution Method on Flat Substrate)

The resist composition was coated on a silicon wafer where a hexamethyldisilazane (HMDS) process was performed under conditions of 110° C. for 35 seconds without providing an antireflection layer, baking (PreBake; PB) was performed for 60 seconds at the temperatures shown in the following Table 2, and a resist film with a film thickness of 200 nm was formed. Pattern exposure was performed on the obtained wafer using a KrF excimer laser scanner (NA 0.80) via an exposure mask. Subsequently, developing was performed by paddling with the developer after baking (Post Exposure Bake; PEB) for 60 seconds at the temperatures shown in the following Table 2, then, after rinsing was performed by paddling with the rinsing liquid, a line and space pattern with lines of 400 nm and a pitch of 600 nm was obtained by rotating the wafer for 30 seconds at a rotational speed of 4000 rpm.

Evaluation Method (Standing Wave)

A cross-sectional shape of the lines of the line and space pattern with lines of 400 nm and a pitch of 600 nm was observed and the degree of standing waves was evaluated using five levels. In a case where the line width in the portion where the line width is the narrowest due to the influence of the standing waves is set as a and the line width of the portion where reduction in the line width is not seen is set as b, evaluation was performed using the ratio (referred to as "ratio C" below with the units in "%") represented by {(b−a)/b}×100. The smaller the value, the smaller the degree of the standing waves, which is preferable.

(Determining Criteria)

A: cases where the ratio C is 0% or more and less than 20%
B: cases where the ratio C is 20% or more and less than 40%
C: cases where the ratio C is 40% or more and less than 60%
D: cases where the ratio C is 60% or more and less than 80%
E: cases where the ratio C is 80% or more The above-described evaluation results are shown in the following Table 2.

TABLE 2

|  | Resist Composition | PB | PEB | Developer | Rinsing Liquid | Shape | Scum | EL/% | Standing Waves |
|---|---|---|---|---|---|---|---|---|---|
| Example-1 | Resist-1 | 100° C. 60 s | 100° C. 60 s | ND-1 | None | Rectangle | A | 22 | A |
| Example-2 | Resist-2 | 100° C. 60 s | 100° C. 60 s | ND-1 | None | Rectangle | A | 22 | A |
| Example-3 | Resist-3 | 100° C. 60 s | 110° C. 60 s | ND-1 | NR-1 | Rectangle | A | 19 | B |
| Example-4 | Resist-4 | 100° C. 60 s | 100° C. 60 s | ND-1 | None | Rectangle | A | 19 | A |
| Example-5 | Resist-5 | 100° C. 60 s | 100° C. 60 s | ND-1 | NR-2 | Rectangle | B | 19 | A |
| Example-6 | Resist-6 | 100° C. 60 s | 100° C. 60 s | ND-1 | NR-2 | Rectangle | B | 17 | C |
| Example-7 | Resist-7 | 100° C. 60 s | 110° C. 60 s | ND-2 | NR-2 | Rectangle | C | 17 | C |
| Example-8 | Resist-8 | 100° C. 60 s | 100° C. 60 s | ND-2 | None | Rectangle | C | 17 | C |
| Example-9 | Resist-9 | 100° C. 60 s | 110° C. 60 s | ND-3 | None | Rectangle | C | 17 | C |
| Example-10 | Resist-10 | 100° C. 60 s | 110° C. 60 s | ND-3 | None | Rectangle | C | 17 | C |
| Example-11 | Resist-11 | 100° C. 60 s | 100° C. 60 s | ND-1 | None | Rectangle | A | 25 | A |

TABLE 2-continued

| | Resist Composition | PB | PEB | Developer | Rinsing Liquid | Shape | Scum | EL/% | Standing Waves |
|---|---|---|---|---|---|---|---|---|---|
| Example-12 | Resist-12 | 90° C. 60 s | 95° C. 60 s | ND-1 | None | Rectangle | A | 17 | B |
| Comparative Example-1 | Resist-6 | 100° C. 60 s | 100° C. 60 s | PD-1 | PR-1 | Taper shape | E | 12 | E |
| Comparative Example-2 | Resist-R01 | 100° C. 60 s | 100° C. 60 s | ND-1 | None | Pattern formation not possible | — | 0 | — |

According to Table 2, it was found that it was possible to stably form a pattern where the pattern shape and the exposure latitude are excellent and the scum and the standing waves are reduced by developing the actinic ray-sensitive or radiation-sensitive resin composition of the present invention using a developer which includes an organic solvent.

Example 101 to Example 112 and Comparative Example 101 and Comparative Example 102

Pattern Manufacturing and Evaluation Using EB Exposure

The resist solution which was prepared as described above was uniformly coated on the silicon wafer which was subjected to a hexamethyldisilazane process using spin coating, baking was performed for 60 seconds at the temperatures shown in the following Table 3 (PB), and a resist film with a film thickness of 200 nm was formed. Electron beam irradiation was performed with respect to the resist film using an electron beam lithography apparatus (HL 750 manufactured by Hitachi, Ltd. with an acceleration voltage of 50 KeV). Baking was performed for 60 seconds at the temperatures shown in the following Table 3 (PEB) after the irradiation and developing was performed by paddling using the developer shown in Table 3, then, after rinsing was performed by paddling with the rinsing liquid shown in Table 3, a line and space pattern with lines of 100 nm and a pitch of 200 nm was obtained by rotating the wafer for 30 seconds at a rotational speed of 4000 rpm.

Evaluation Method (Shape on Flat Substrate)

A cross-sectional shape of lines of the line and space pattern with lines of 100 nm and a pitch of 200 nm was observed using a scanning type electron microscope (S-4800, manufactured by Hitachi, Ltd.) and was evaluated as rectangle, taper shape, or reverse taper shape. The shape of the rectangle is most preferable.

Evaluation Method (EL in Pattern Manufacturing of Flat Substrate)

The exposure amount which forms the line and space pattern with lines of 100 nm and a pitch of 200 nm was set as the optimum exposure amount, and an exposure amount width which allows a pattern size of 100 nm±10% when the exposure amount is changed was determined, and this value was displayed as a percentage by dividing with the optimal exposure amount. The higher the value, the smaller the performance variations due to changes in exposure amount, whereby the exposure latitude (EL) becomes favorable.

TABLE 3

| | Resist Composition | PB | PEB | Developer | Rinsing Liquid | Shape | EL/% |
|---|---|---|---|---|---|---|---|
| Example-101 | Resist-1 | 100° C. 60 s | 100° C. 60 s | ND-1 | None | Rectangle | 24 |
| Example-102 | Resist-2 | 100° C. 60 s | 100° C. 60 s | ND-1 | None | Rectangle | 24 |
| Example-103 | Resist-3 | 100° C. 60 s | 110° C. 60 s | ND-1 | NR-1 | Rectangle | 21 |
| Example-104 | Resist-4 | 100° C. 60 s | 100° C. 60 s | ND-1 | None | Rectangle | 21 |
| Example-105 | Resist-5 | 100° C. 60 s | 100° C. 60 s | ND-1 | NR-2 | Rectangle | 21 |
| Example-106 | Resist-6 | 100° C. 60 s | 100° C. 60 s | ND-1 | NR-2 | Rectangle | 17 |
| Example-107 | Resist-7 | 100° C. 60 s | 110° C. 60 s | ND-2 | NR-2 | Rectangle | 17 |
| Example-108 | Resist-8 | 100° C. 60 s | 100° C. 60 s | ND-2 | None | Rectangle | 17 |
| Example-109 | Resist-9 | 100° C. 60 s | 110° C. 60 s | ND-3 | None | Rectangle | 17 |
| Example-110 | Resist-10 | 100° C. 60 s | 110° C. 60 s | ND-3 | None | Rectangle | 17 |
| Example-111 | Resist-11 | 100° C. 60 s | 100° C. 60 s | ND-1 | None | Rectangle | 25 |
| Example-112 | Resist-12 | 90° C. 60 s | 95° C. 60 s | ND-1 | None | Rectangle | 17 |
| Comparative Example-101 | Resist-6 | 100° C. 60 s | 100° C. 60 s | PD-1 | PR-1 | Taper shape | 11 |
| Comparative Example-102 | Resist-R01 | 100° C. 60 s | 100° C. 60 s | ND-1 | None | Pattern formation not possible | 0 |

From Table 3, it was found that it was possible to stably form a pattern where the pattern shape and the exposure latitude are excellent by exposing the actinic ray-sensitive or radiation-sensitive resin composition of the present invention using an electron beam and performing development using a developer which includes an organic solvent.

Example 201 to Example 212 and Comparative Example 201

Sensitivity Evaluation in Pattern Manufacturing Using EUV Exposure and Pattern Manufacturing on Flat Substrate The resist solution which was prepared as described above was uniformly coated on the silicon wafer which was subjected to a hexamethyldisilazane process using spin coating, baking was performed for 60 seconds at the temperatures shown in the following Table 4 (PB), and a resist film with a film thickness of 200 nm was formed. Surface exposure was performed with respect to the resist film using EUV light (wavelength 13 nm) while changing the exposure amount by 0.5 mJ/cm$^2$ in a range of 0 to 10.0 mJ/cm$^2$. After the irradiation, baking was performed for 60 seconds at the temperature shown in the following Table 4 (PEB). Subsequently, developing was performed by paddling using the developers shown in Table 4, then, after rinsing by paddling with the rinsing liquid shown in Table 4, the wafer was rotated for 30 seconds at a rotation speed of 4000 rpm and dried. After that, for each of the exposure amounts, the film thicknesses were measured, a curved line of the sensitivity-residual film ratio was obtained, and the exposure amount (Eth) which starts to generate residual film was evaluated.

TABLE 4

| | Resist Composition | PB | PEB | Developer | Rinsing Liquid | Sensitivity (mJ/cm$^2$) |
|---|---|---|---|---|---|---|
| Example-201 | Resist-1 | 100° C. 60 s | 100° C. 60 s | ND-1 | None | 8 |
| Example-202 | Resist-2 | 100° C. 60 s | 100° C. 60 s | ND-1 | None | 8 |
| Example-203 | Resist-3 | 100° C. 60 s | 110° C. 60 s | ND-1 | NR-1 | 9 |
| Example-204 | Resist-4 | 100° C. 60 s | 100° C. 60 s | ND-1 | None | 9 |
| Example-205 | Resist-5 | 100° C. 60 s | 100° C. 60 s | ND-1 | NR-2 | 8.5 |
| Example-206 | Resist-6 | 100° C. 60 s | 100° C. 60 s | ND-1 | NR-2 | 8.5 |
| Example-207 | Resist-7 | 100° C. 60 s | 110° C. 60 s | ND-2 | NR-2 | 8.5 |
| Example-208 | Resist-8 | 100° C. 60 s | 100° C. 60 s | ND-2 | None | 8.5 |
| Example-209 | Resist-9 | 100° C. 60 s | 110° C. 60 s | ND-3 | None | 9 |
| Example-210 | Resist-10 | 100° C. 60 s | 110° C. 60 s | ND-3 | None | 9.5 |
| Example-211 | Resist-11 | 100° C. 60 s | 100° C. 60 s | ND-1 | None | 9.5 |
| Example-212 | Resist-12 | 90° C. 60 s | 95° C. 60 s | ND-1 | None | 8.5 |
| Comparative Example-201 | Resist-R01 | 100° C. 60 s | 100° C. 60 s | ND-1 | None | None (no residue) |

From Table 4, it was found that it was possible to stably form a pattern with high sensitivity by exposing the actinic ray-sensitive or radiation-sensitive resin composition of the present invention using ultraviolet rays and performing development using a developer which includes an organic solvent.

What is claimed is:
1. A pattern forming method comprising:
   (i) forming a film using an actinic ray-sensitive or radiation-sensitive resin composition which contains
   a resin (A) which has
   a repeating unit including a group capable of generating a polar group by being decomposed due to an action of an acid,
   a repeating unit including a carboxyl group,
   a non-acid-decomposable repeating unit which is represented by the following general formula (1), which is different from the repeating unit including a carboxyl group,
   a non-acid-decomposable repeating unit which is represented by the following general formula (1'), which is different from the repeating unit including a carboxyl group, and a repeating unit including a lactone structure, and the content of the repeating unit including the lactone structure is greater than 0 mol % and less than or equal to 10 mol % with respect to all the repeating units in the resin (A),
   a compound (B) which generates an acid according to irradiation with actinic rays or radiation, and
   a solvent (C);
   (ii) exposing the film using a KrF excimer laser, extreme ultraviolet rays, or an electron beam; and
   (iii) forming a negative tone pattern by developing the exposed film using a developer which includes an organic solvent;

in the general formula (1),
R represents a hydrogen atom, an alkyl group, a cycloalkyl group, a halogen atom, or an alkoxycarbonyl group,
L represents a single bond or an (n+1) valent linking group,
Y represents an aromatic group, and
n represents an integer of 1 or more,

in the general formula (1'),
R' represents a hydrogen atom, an alkyl group, a cycloalkyl group, a halogen atom, or an alkoxycarbonyl group, L' represents a single bond or an (n'+1) valent linking group, Y' represents an alicyclic group, and n' represents an integer of 1 or more.

2. The pattern forming method according to claim 1, wherein the exposing in (ii) is exposing using the KrF excimer laser.

3. The pattern forming method according to claim 1, wherein in the general formula (1), L represents a single bond, an alkylene group, an aromatic ring group, a cycloalkylene group, —COO-$L_1$'-, —O-$L_1$'-, —CONH—, or a group which is formed by combining two or more of these, $L_1$' represents an alkylene group, a cycloalkylene group, an aromatic ring group, or a group formed by combining an alkylene group and an aromatic ring group.

4. The pattern forming method according to claim 1, wherein the resin (A) comprises a repeating unit which is represented by the following general formula (AI) as the repeating unit including a group capable of generating a polar group by being decomposed due to an action of an acid:

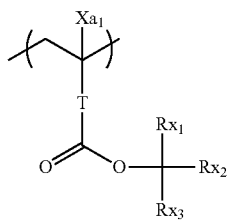
(AI)

in the general formula (AI), $Xa_1$ represents a hydrogen atom, an alkyl group, a cyano group, or a halogen atom, T represents a single bond or a divalent linking group, $Rx_1$ to $Rx_3$ each independently represents an alkyl group or a cycloalkyl group, and two among $Rx_1$ to $Rx_3$ may be bonded to form a ring structure.

5. The pattern forming method according to claim 4, wherein $R_{X1}$ to $R_{X3}$ in the general formula (AI) represent an alkyl group.

6. The pattern forming method according to claim 4, wherein $R_{X1}$ to $R_{X3}$ in the general formula (AI) represent a methyl group.

7. The pattern forming method according to claim 1, wherein the repeating unit which is represented by the general formula (1) is a repeating unit which is represented by the following general formula (1-1):

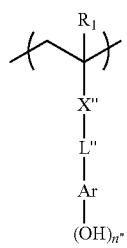
(1-1)

in the general formula (1-1), $R_1$ represents a hydrogen atom, an alkyl group, a halogen atom, or an alkoxycarbonyl group, X" represents a single bond, an alkylene group, —COO—, or —CONR$_{64}$—, $R_{64}$ represents a hydrogen atom or an alkyl group, L" represents a single bond, —COO—, or an alkylene group, Ar represents an (n"+1) valent aromatic ring group, and n" represents an integer of 1 to 4.

8. A method for manufacturing an electronic device which includes the pattern forming method according to claim 1.

9. The pattern forming method according to claim 1, wherein in the general formula (1'), L' represents a single bond, an alkylene group, an aromatic ring group, a cycloalkylene group, —COO-$L_1$'-, —O-$L_1$'-, —CONH—, or a group which is formed by combining two or more of these, $L_1$' represents an alkylene group, a cycloalkylene group, an aromatic ring group, or a group formed by combining an alkylene group and an aromatic ring group.

10. An actinic ray-sensitive or radiation-sensitive resin composition which is subjected to a pattern forming method comprising (i) forming a film using the actinic ray-sensitive or radiation-sensitive resin composition, (ii) exposing the film using a KrF excimer laser, extreme ultraviolet rays, or an electron beam, and (iii) forming a negative tone pattern by developing the exposed film using a developer which includes an organic solvent, the actinic ray-sensitive or radiation-sensitive resin composition comprising:

a resin (A) which has a repeating unit including a group capable of generating a polar group by being decomposed due to an action of an acid, a repeating unit including a carboxyl group, and a repeating unit including a lactone structure, and the content of the repeating unit including the lactone structure is greater than 0 mol % and less than or equal to 10 mol % with respect to all the repeating units in the resin (A);

a non-acid-decomposable repeating unit which is represented by the following general formula (1), which is different from the repeating unit including a carboxyl group, a non-acid-decomposable repeating unit which is represented by the following general formula (1'), which is different from the repeating unit including a carboxyl group;

a compound (B) which generates an acid according to irradiation with actinic rays or radiation; and a solvent (C),

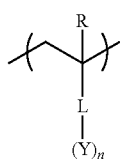
(1)

in the general formula (1),

R represents a hydrogen atom, an alkyl group, a cycloalkyl group, a halogen atom, or an alkoxycarbonyl group, L represents a single bond or an (n+1) valent linking group, Y represents an aromatic group, and n represents an integer of 1 or more,

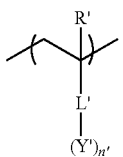
(1')

in the general formula (1'),

R' represents a hydrogen atom, an alkyl group, a cycloalkyl group, a halogen atom, or an alkoxycarbonyl group, L' represents a single bond or an (n'+1) valent linking group, Y' represents an alicyclic group, and n' represents an integer of 1 or more.

11. The actinic ray-sensitive or radiation-sensitive resin composition according to claim 10, wherein in the general formula (1), L represents a single bond, an alkylene group, an aromatic ring group, a cycloalkylene group, —COO-$L_1'$-, —O-$L_1'$-, —CONH—, or a group which is formed by combining two or more of these, $L_1'$ represents an alkylene group, a cycloalkylene group, an aromatic ring group, or a group formed by combining an alkylene group and an aromatic ring group.

12. The actinic ray-sensitive or radiation-sensitive resin composition according to claim 11, wherein in the general formula (1), L represents a single bond, an alkylene group, —COO-$L_1'$-, or a group which is formed by combining of these, and $L_1'$ represents an alkylene group, a cycloalkylene group, an aromatic ring group, or a group formed by combining an alkylene group and an aromatic ring group.

13. The actinic ray-sensitive or radiation-sensitive resin composition according to claim 10, wherein the repeating unit including a carboxyl group is a repeating unit represented by the following formula:

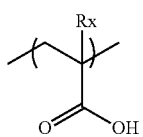

in the formula, Rx represents H, $CH_3$, $CH_2OH$ or $CF_3$.

14. The actinic ray-sensitive or radiation-sensitive resin composition according to claim 10, wherein the resin (A) comprises a repeating unit which is represented by the following general formula (AI) as the repeating unit including a group capable of generating a polar group by being decomposed due to an action of an acid:

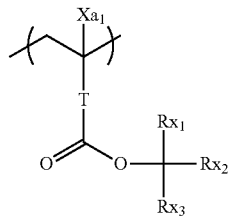
(AI)

in the general formula (AI), $Xa_1$ represents a hydrogen atom, an alkyl group, a cyano group, or a halogen atom, T represents a single bond or a divalent linking group, $Rx_1$ to $Rx_3$ each independently represents an alkyl group or a cycloalkyl group, and two among $Rx_1$ to $Rx_3$ may be bonded to form a ring structure.

15. The actinic ray-sensitive or radiation-sensitive resin composition according to claim 14, wherein T in the general formula (AI) represents a single bond.

16. The actinic ray-sensitive or radiation-sensitive resin composition according to claim 14, wherein $Rx_1$ to $Rx_3$ in the general formula (AI) each independently represents an alkyl group.

17. The actinic ray-sensitive or radiation-sensitive resin composition according to claim 14, wherein $Rx_1$ to $Rx_3$ in the general formula (AI) each independently represents a methyl group.

18. The actinic ray-sensitive or radiation-sensitive resin composition according to claim 10, wherein the repeating unit which is represented by the general formula (1) is a repeating unit which is represented by the following general formula (1-1):

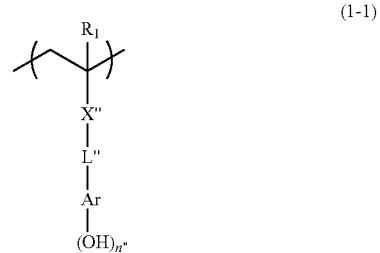
(1-1)

in the general formula (1-1), $R_1$ represents a hydrogen atom, an alkyl group, a halogen atom, or an alkoxycarbonyl group, X" represents a single bond, an alkylene group, —COO—, or —$CONR_{64}$—, $R_{64}$ represents a hydrogen atom or an alkyl group, L" represents a single bond, —COO—, or an alkylene group, Ar represents an (n"+1) valent aromatic ring group, and n" represents an integer of 1 to 4.

19. The actinic ray-sensitive or radiation-sensitive resin composition according to claim 10, further comprising a basic compound (D).

20. A resist film which is formed using the actinic ray-sensitive or radiation-sensitive resin composition according to claim 10.

21. The actinic ray-sensitive or radiation-sensitive resin composition according to claim 10, wherein in the general formula (1'), L' represents a single bond, an alkylene group, an aromatic ring group, a cycloalkylene group, —COO-$L_1'$-, —O-$L_1'$-, —CONH—, or a group which is formed by combining two or more of these, $L_1'$ represents an alkylene group, a cycloalkylene group, an aromatic ring group, or a group formed by combining an alkylene group and an aromatic ring group.

22. The actinic ray-sensitive or radiation-sensitive resin composition according to claim 21, wherein in the general formula (1'), L' represents a single bond, an alkylene group, —COO-$L_1'$-, or a group which is formed by combining of these, $L_1'$ represents an alkylene group, a cycloalkylene group, an aromatic ring group, or a group formed by combining an alkylene group and an aromatic ring group.

* * * * *